(12) United States Patent
Mok et al.

(10) Patent No.: US 6,917,525 B2
(45) Date of Patent: Jul. 12, 2005

(54) CONSTRUCTION STRUCTURES AND MANUFACTURING PROCESSES FOR PROBE CARD ASSEMBLIES AND PACKAGES HAVING WAFER LEVEL SPRINGS

(75) Inventors: Sammy Mok, Cupertino, CA (US); Fu Chiung Chong, Saratoga, CA (US); Frank John Swiatowiec, San Jose, CA (US); Syamal Kumar Lahiri, Milpitas, CA (US); Joseph Michael Haemer, San Jose, CA (US)

(73) Assignee: NanoNexus, Inc., Fremont, CA (US)

( * ) Notice: Subject to any disclaimer, the term of this patent is extended or adjusted under 35 U.S.C. 154(b) by 234 days.

(21) Appl. No.: 10/178,103

(22) Filed: Jun. 24, 2002

(65) Prior Publication Data
US 2003/0099097 A1 May 29, 2003

Related U.S. Application Data

(63) Continuation-in-part of application No. 09/980,040, filed on Nov. 27, 2001.

(51) Int. Cl.[7] .............................................. H05K 7/06
(52) U.S. Cl. .................... 361/767; 361/769; 361/787; 361/789; 439/54; 439/74; 439/876; 439/912
(58) Field of Search ................................ 361/767–771, 361/785, 787, 789, 790, 804, 803; 324/754, 755, 758, 765; 439/54, 69, 74, 169, 219, 591, 876, 912; 257/48; 438/15

(56) References Cited

U.S. PATENT DOCUMENTS

| | | | |
|---|---|---|---|
| 5,763,941 A | 6/1998 | Fjeldstad | 257/669 |
| 5,821,764 A * | 10/1998 | Slocum et al. | 324/758 |
| 5,832,601 A * | 11/1998 | Eldridge et al. | 29/843 |
| 5,917,707 A | 6/1999 | Khandros et al. | 361/776 |
| 5,974,662 A * | 11/1999 | Eldridge et al. | 29/842 |
| 6,060,891 A | 5/2000 | Hembree et al. | 324/754 |
| 6,147,876 A * | 11/2000 | Yamaguchi et al. | 361/766 |
| 6,215,320 B1 * | 4/2001 | Parrish | 324/754 |
| 6,351,133 B1 | 2/2002 | Jones et al. | 324/754 |
| 6,483,328 B1 * | 11/2002 | Eldridge et al. | 324/754 |
| 2002/0132501 A1 * | 9/2002 | Eldridge et al. | 439/66 |

* cited by examiner

Primary Examiner—John B. Vigushin
(74) Attorney, Agent, or Firm—Michael A. Glenn; Glenn Patent Group

(57) ABSTRACT

Several embodiments of enhanced integrated circuit probe card and package assemblies are disclosed, which extend the mechanical compliance of both MEMS and thin-film fabricated probes, such that these types of spring probe structures can be used to test one or more integrated circuits on a semiconductor wafer. Several embodiments of probe card assemblies, which provide tight signal pad pitch compliance and/or enable high levels of parallel testing in commercial wafer probing equipment, are disclosed. In some preferred embodiments, the probe card assembly structures include separable standard components, which reduce assembly manufacturing cost and manufacturing time. These structures and assemblies enable high speed testing in wafer form. The probes also have built in mechanical protection for both the integrated circuits and the MEMS or thin film fabricated spring tips and probe layout structures on substrates. Alternate card assembly structures comprise a compliant carrier structure, such as a decal or screen, which is adhesively attached to the probe chip substrate.

67 Claims, 60 Drawing Sheets

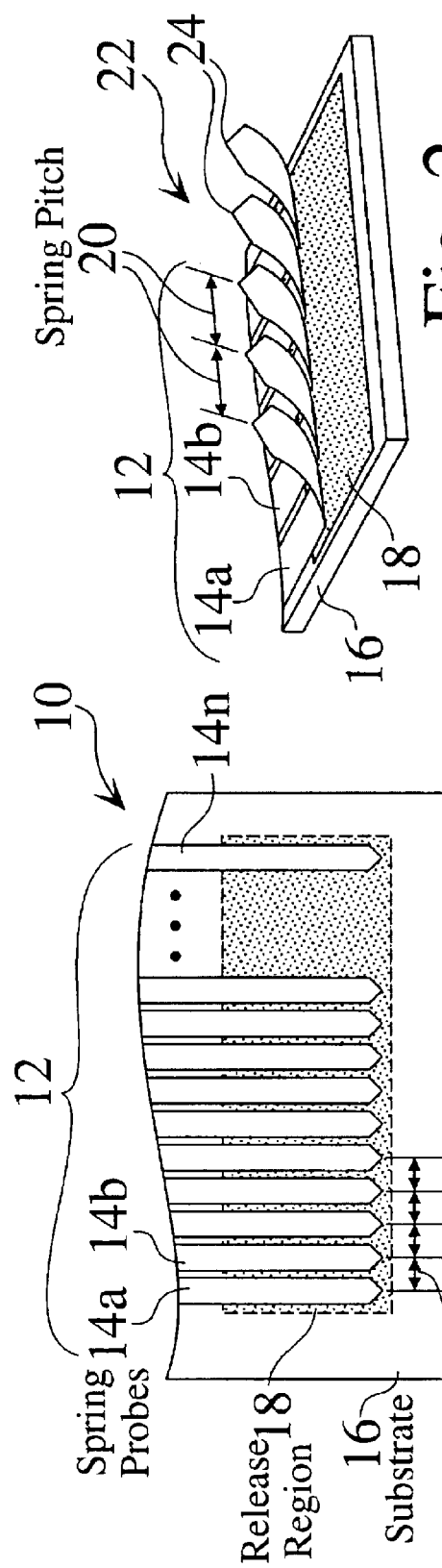
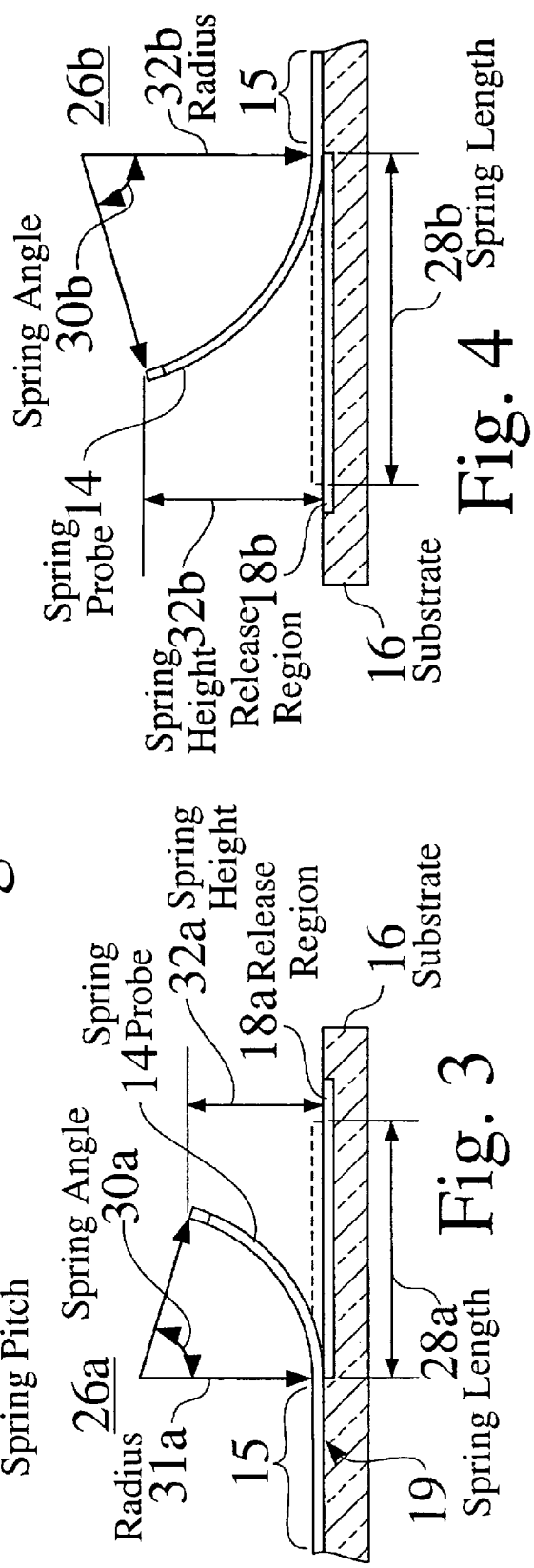

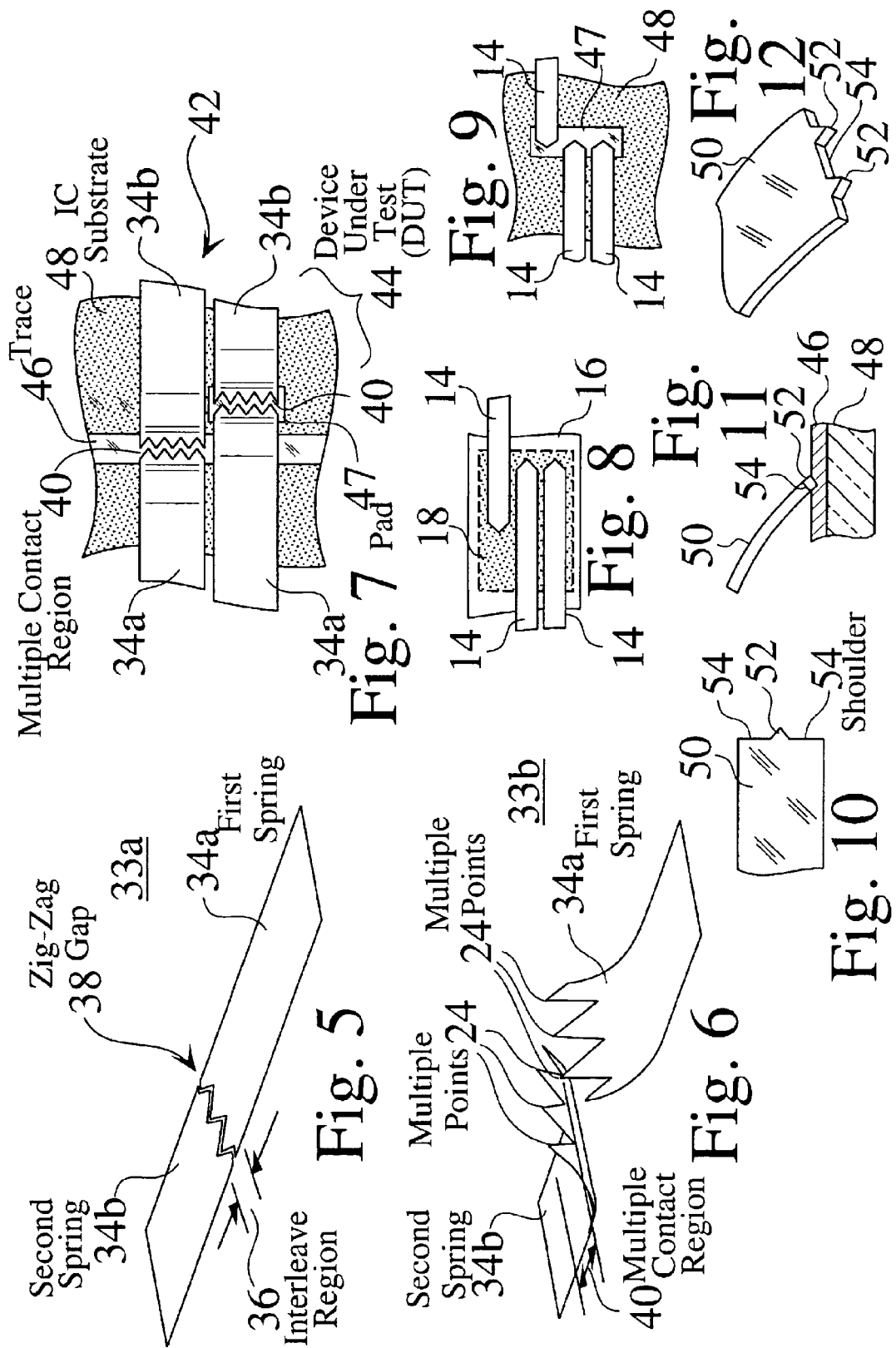

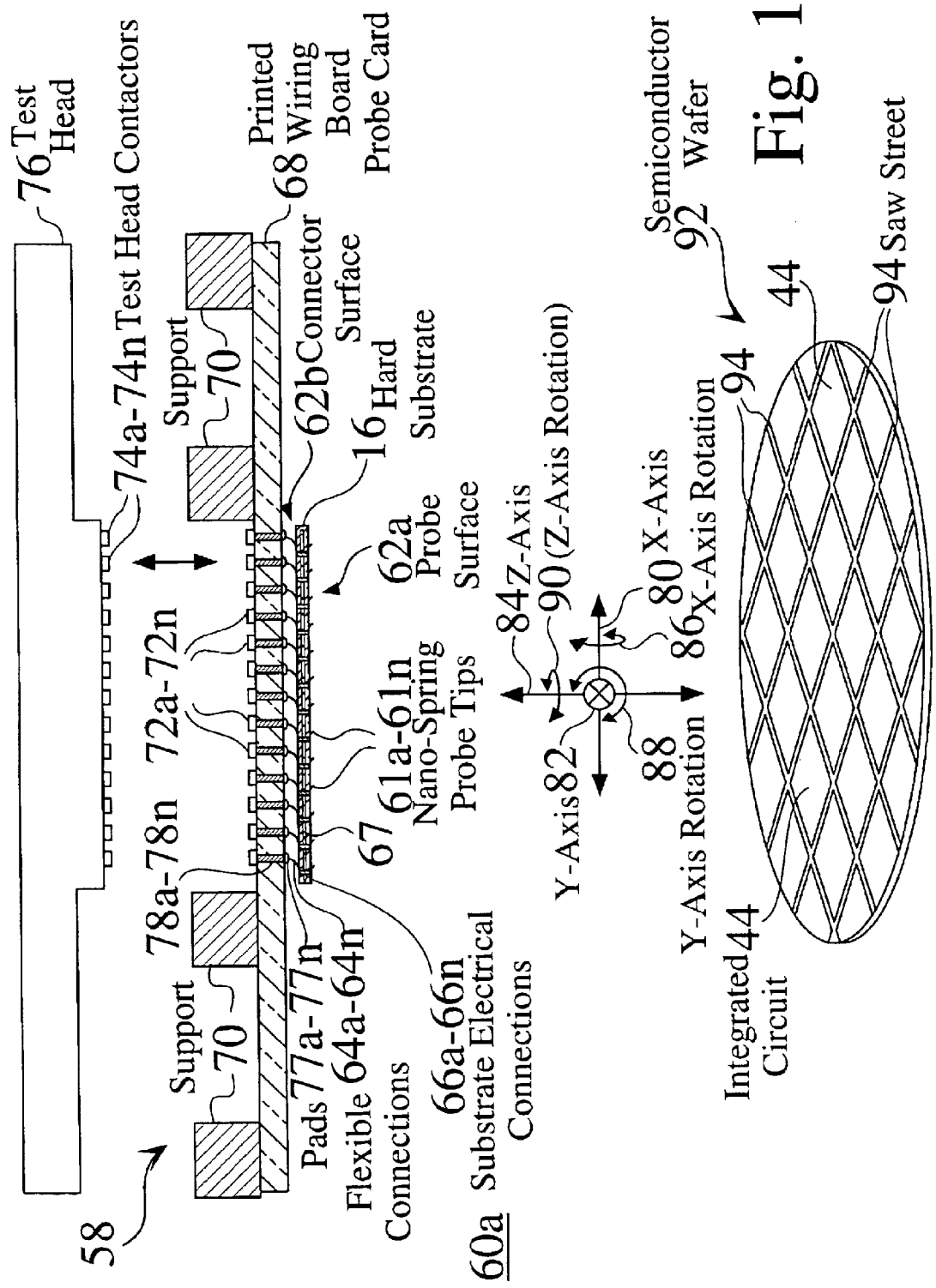

Apply Protective Coating

Prepare Photoresist

Dip into Photoresist

246 Remove
from Photoresist
and Bake

250
Remove
Unprotected Coating

252
Strip Photoresist

490  Fig. 51

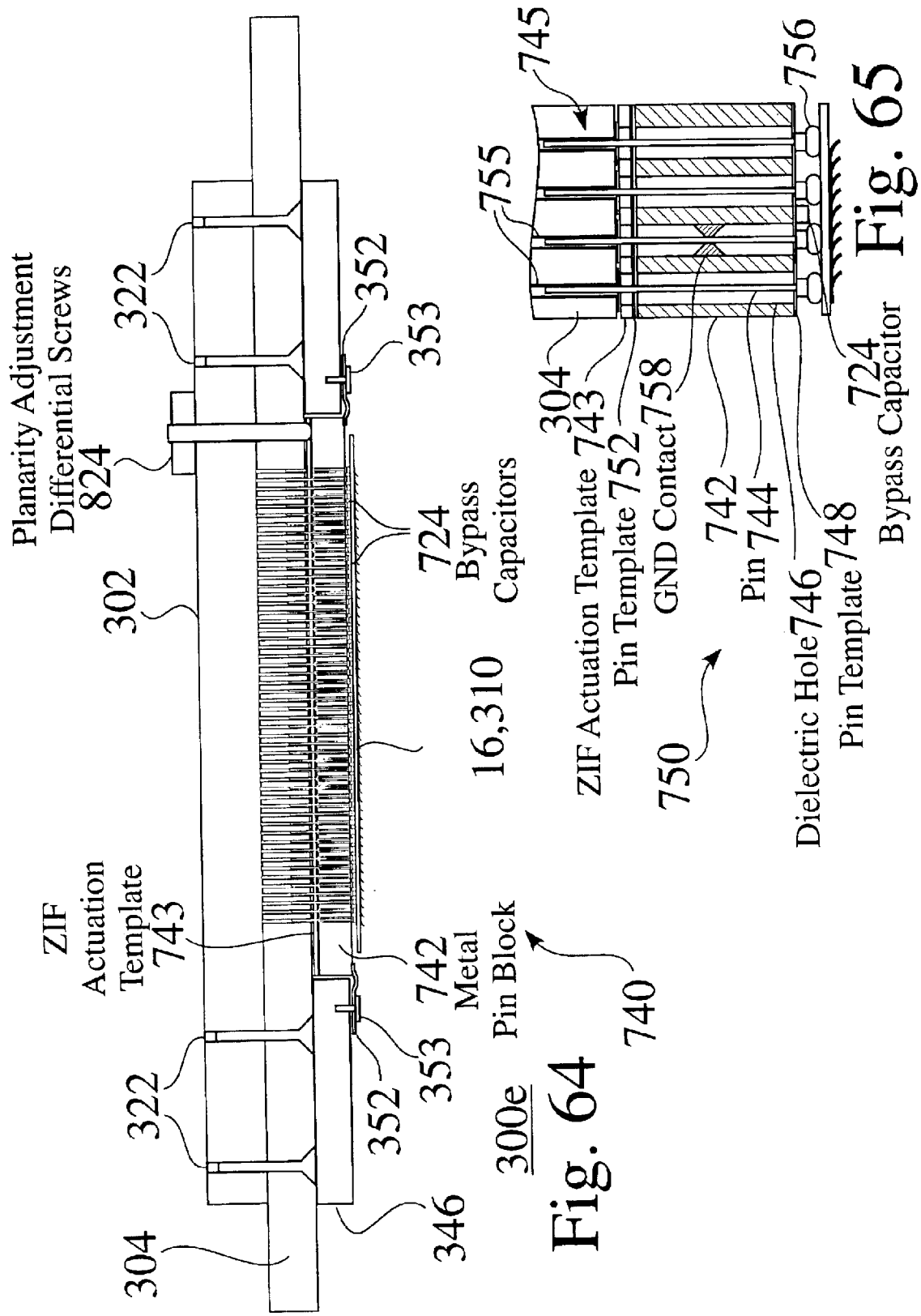

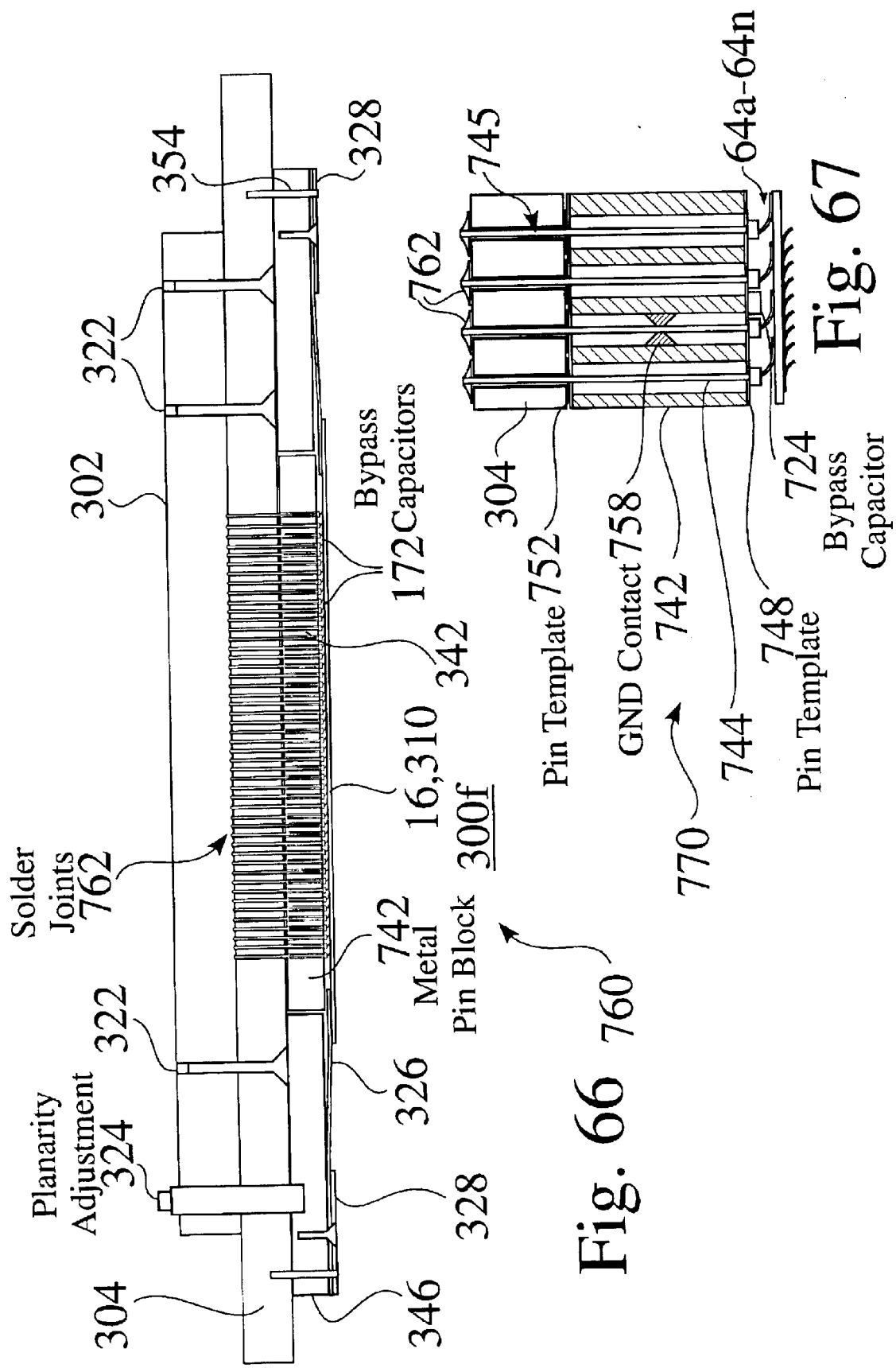

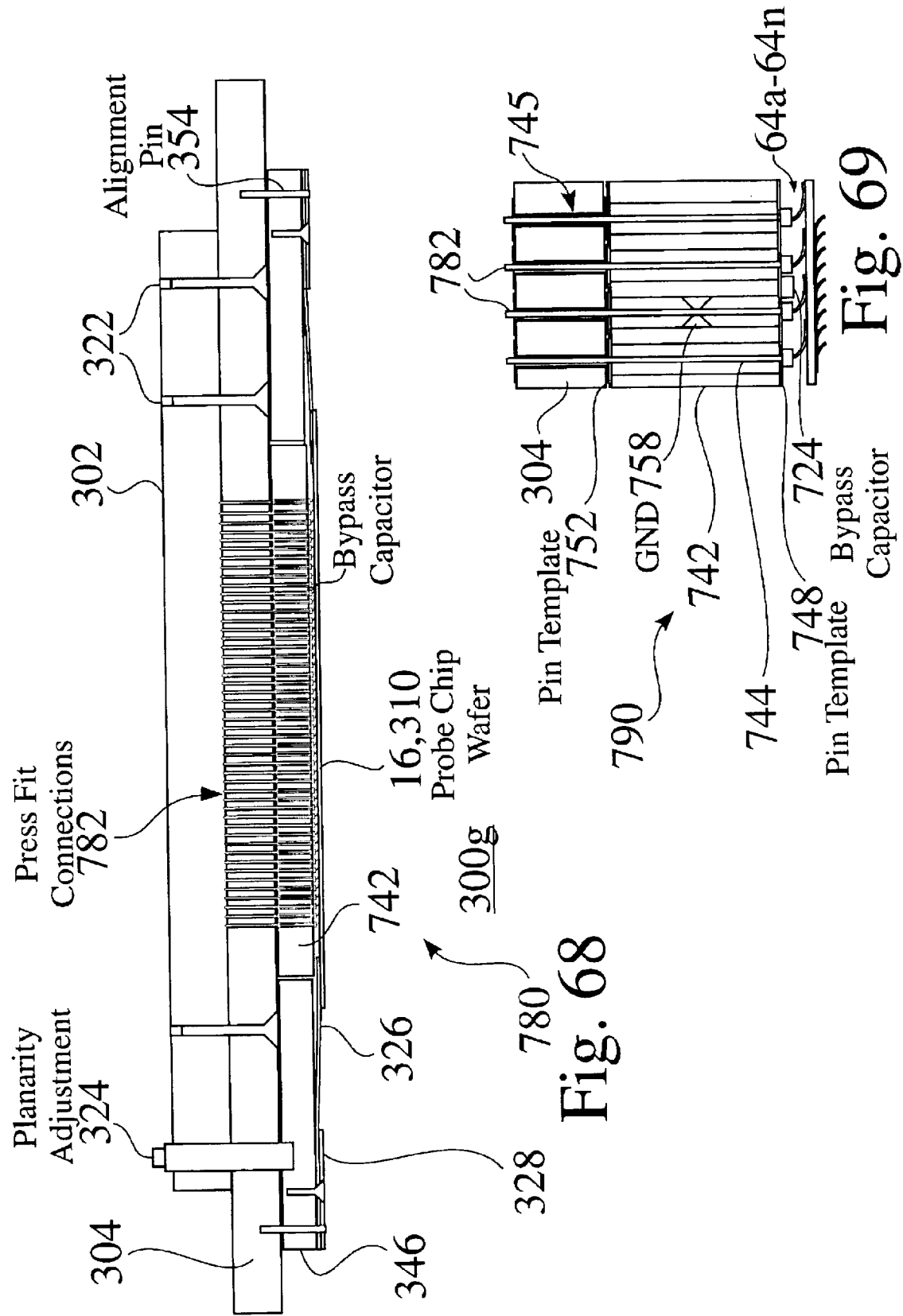

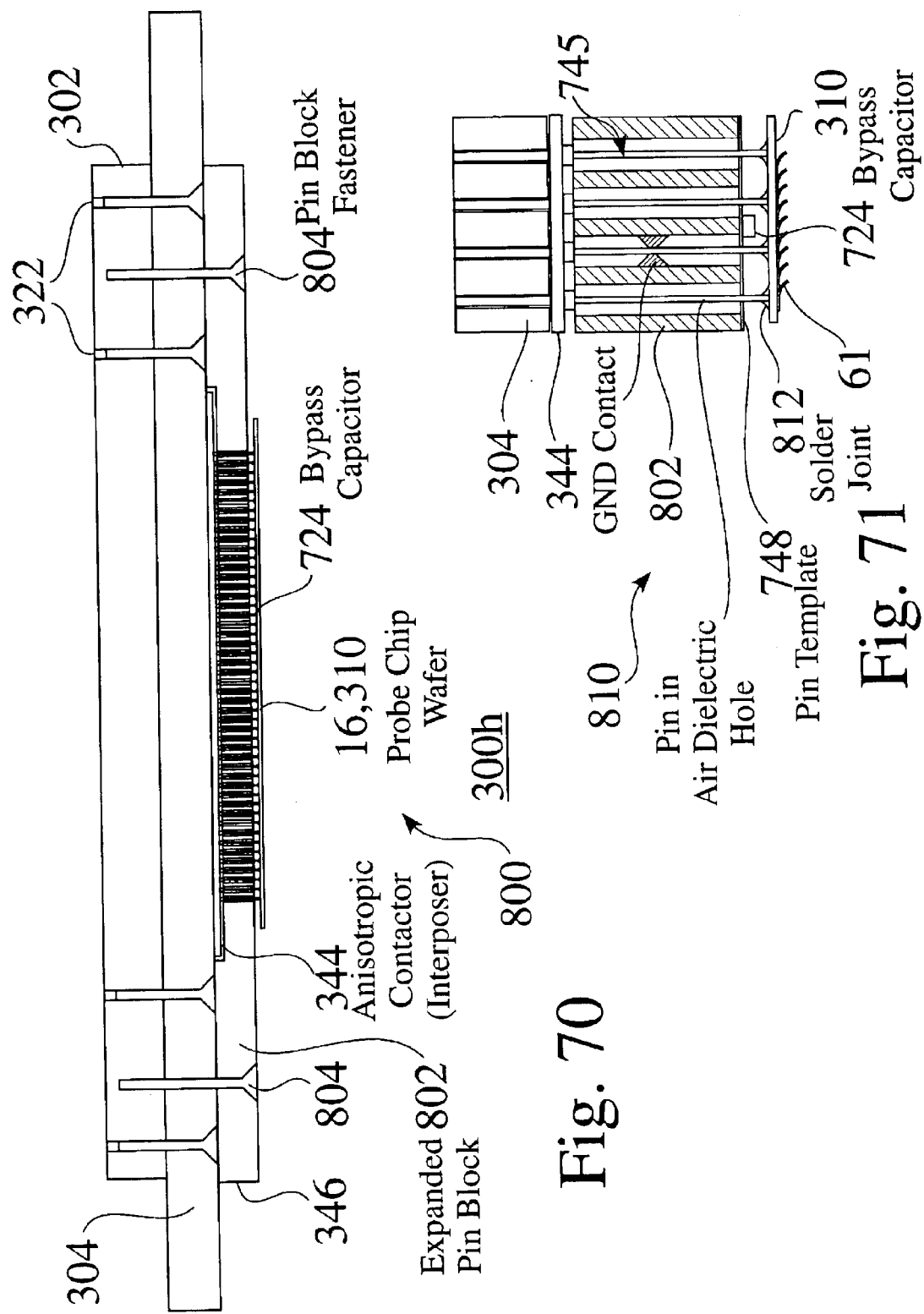

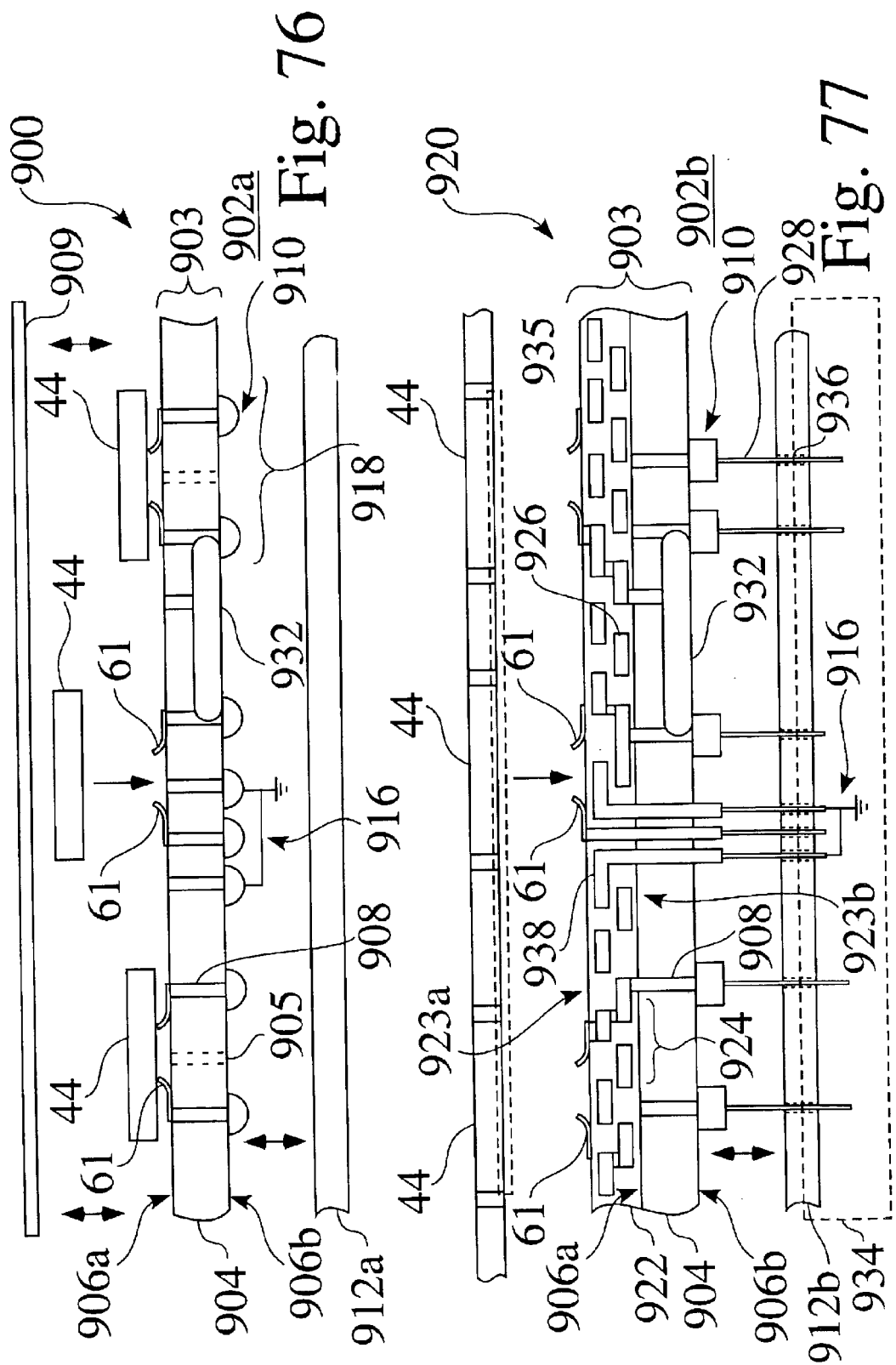

CONSTRUCTION STRUCTURES AND MANUFACTURING PROCESSES FOR PROBE CARD ASSEMBLIES AND PACKAGES HAVING WAFER LEVEL SPRINGS

CROSS REFERENCE TO RELATED APPLICATIONS

This Application is a Continuation In Part of U.S. patent application Ser. No. 09/980,040, entitled Construction Structures and Manufacturing Processes for Integrated Circuit Wafer Probe Card Assemblies, US Filing Date 27 Nov. 2001, which claims priority from PCT Patent Application Serial No. PCT/US00/14164, entitled Construction Structures and Manufacturing Processes for Integrated Circuit Wafer Probe Card Assemblies, US Filing Date 23 May 2000.

FIELD OF THE INVENTION

The invention relates to the field of probe card assembly systems. More particularly, the invention relates to improvements in photolithography-patterned spring contacts and enhanced probe card assemblies having photolithography patterned spring contacts for use in the testing or burn-in of integrated circuits.

BACKGROUND OF THE INVENTION

In conventional integrated circuit (IC) wafer probe cards, electrical contacts between the probe card and an integrated circuit wafer are typically provided by tungsten needle probes. However, advanced semiconductor technologies often require higher pin counts, smaller pad pitches, and higher clock frequencies, which are not possible with tungsten needle probes.

While emerging technologies have provided spring probes for different probing applications, most probes have inherent limitations, such as limited pitch, limited pin count, varying levels of flexibility, limited probe tip geometries, limitations of materials, and high costs of fabrication.

K. Banerji, A. Suppelsa, and W. Mullen III, Selectively Releasing Conductive Runner and Substrate Assembly Having Non-Planar Areas, U.S. Pat. No. 5,166,774 (24 Nov. 1992) disclose a runner and substrate assembly which comprises "a plurality of conductive runners adhered to a substrate, a portion of at least some of the conductive runners have non-planar areas with the substrate for selectively releasing the conductive runner from the substrate when subjected to a predetermined stress".

A. Suppelsa, W. Mullen III and G. Urbish, Selectively Releasing Conductive Runner and Substrate Assembly, U.S. Pat. No. 5,280,139 (18 Jan. 1994) disclose a runner and substrate assembly which comprises "a plurality of conductive runners adhered to a substrate, a portion of at least some of the conductive runners have a lower adhesion to the substrate for selectively releasing the conductive runner from the substrate when subjected to a predetermined stress".

D. Pedder, Bare Die Testing, U.S. Pat. No. 5,786,701 (28 Jul. 1998) disclose a testing apparatus for testing integrated circuits (ICs) at the bare die stage, which includes "a testing station at which microbumps of conductive material are located on interconnection trace terminations of a multilayer interconnection structure, these terminations being distributed in a pattern corresponding to the pattern of contact pads on the die to be tested. To facilitate testing of the die before separation from a wafer using the microbumps, the other connections provided to and from the interconnection structure have a low profile".

D. Grabbe, I. Korsunsky and R. Ringler, Surface Mount Electrical Connector, U.S. Pat. No. 5,152,695 (6 Oct. 1992) disclose a connector for electrically connecting a circuit between electronic devices, in which "the connector includes a platform with cantilevered spring arms extending obliquely outwardly therefrom. The spring arms include raised contact surfaces and in one embodiment, the geometry of the arms provide compound wipe during deflection".

H. Iwasaki, H. Matsunaga, and T. Ohkubo, Partly Replaceable Device for Testing a Multi-Contact Integrated Circuit Chip Package, U.S. Pat. No. 5,847,572 (8 Dec. 1998) disclose "a test device for testing an integrated circuit (IC) chip having side edge portions each provided with a set of lead pins. The test device comprises a socket base, contact units each including a contact support member and socket contact numbers, and anisotropic conductive sheet assemblies each including an elastic insulation sheet and conductive members. The anisotropic conductive sheet assemblies are arranged to hold each conductive member in contact with one of the socket contact members of the contact units. The test device further comprises a contact retainer detachably mounted on the socket base to bring the socket contact members into contact with the anisotropic sheet assemblies to establish electrical communication between the socket contact members and the conductive members of the anisotropic conductive sheet assemblies. Each of the contact units can be replaced by a new contact unit if the socket contact members partly become fatigued, thereby making it possible to facilitate the maintenance of the test device. Furthermore, the lead pins of the IC chip can be electrically connected to a test circuit board with the shortest paths formed by part of the socket contact members and the conductive members of the anisotropic conductive sheet assemblies".

W. Berg, Method of Mounting a Substrate Structure to a Circuit Board, U.S. Pat. No. 4,758,9278 (19 Jul. 1988) discloses "a substrate structure having contact pads is mounted to a circuit board which has pads of conductive material exposed at one main face of the board and has registration features which are in predetermined positions relative to the contact pads of the circuit board. The substrate structure is provided with leads which are electrically connected to the contact pads of the substrate structure and project from the substrate structure in cantilever fashion. A registration element has a plate portion and also has registration features which are distributed about the plate portion and are engageable with the registration features of the circuit board, and when so engaged, maintain the registration element against movement parallel to the general plane of the circuit board. The substrate structure is attached to the plate portion of the registration element so that the leads are in predetermined position relative to the registration features of the circuit board, and in this position of the registration element the leads of the substrate structure overlie the contact pads of the circuit board. A clamp member maintains the leads in electrically conductive pressure contact with the contact pads of the circuit board".

D. Sarma, P. Palanisamy, J. Hearn and D. Schwarz, Controlled Adhesion Conductor, U.S. Pat. No. 5,121,298 (9 Jun. 1992) disclose "Compositions useful for printing controllable adhesion conductive patterns on a printed circuit board include finely divided copper powder, a screening agent and a binder. The binder is designed to provide controllable adhesion of the copper layer formed after sintering to the substrate, so that the layer can lift off the substrate in response to thermal stress. Additionally, the binder serves to promote good cohesion between the copper particles to provide good mechanical strength to the copper layer so that it can tolerate lift off without fracture".

R. Mueller, Thin-Film Electrothermal Device, U.S. Pat. No. 4,423,401 (27 Dec. 1983) discloses "A thin film multilayer technology is used to build micro miniature electromechanical switches having low resistance metal-to-metal contacts and distinct on-off characteristics. The switches, which are electrothermally activated, are fabricated on conventional hybrid circuit substrates using processes compatible with those employed to produce thin-film circuits. In a preferred form, such a switch includes a cantilever actuator member comprising a resiliently bendable strip of a hard insulating material (e.g. silicon nitride) to which a metal (e.g. nickel) heating element is bonded. The free end of the cantilever member carries a metal contact, which is moved onto (or out of) engagement with an underlying fixed contact by controlled bending of the member via electrical current applied to the heating element".

S. Ibrahim and J. Elsner, Multi-Layer Ceramic Package, U.S. Pat. No. 4,320,438 (16 Mar. 1982) disclose "In a multi-layer package, a plurality of ceramic lamina each has a conductive pattern, and there is an internal cavity of the package within which is bonded a chip or a plurality of chips interconnected to form a chip array. The chip or chip array is connected through short wire bonds at varying lamina levels to metallized conductive patterns thereon, each lamina level having a particular conductive pattern. The conductive patterns on the respective lamina layers are interconnected either by tunneled through openings filled with metallized material, or by edge formed metallizations so that the conductive patterns ultimately connect to a number of pads at the undersurface of the ceramic package mounted onto a metalized board. There is achieved a high component density; but because connecting leads are "staggered" or connected at alternating points with wholly different package levels, it is possible to maintain a 10 mil spacing and 10 mil size of the wire bond lands. As a result, there is even greater component density but without interference of wire bonds one with the other, this factor of interference being the previous limiting factor in achieving high component density networks in a multi layer ceramic package".

F. McQuade, and J. Lander, Probe Assembly for Testing Integrated Circuits, U.S. Pat. No. 5,416,429 (16 May 1995) disclose a probe assembly for testing an integrated circuit, which "includes a probe card of insulating material with a central opening, a rectangular frame with a smaller opening attached to the probe card, four separate probe wings each comprising a flexible laminated member having a conductive ground plane sheet, an adhesive dielectric film adhered to the ground plane, and probe wing traces of spring alloy copper on the dielectric film. Each probe wing has a cantilevered leaf spring portion extending into the central opening and terminates in a group of aligned individual probe fingers provided by respective terminating ends of said probe wing traces. The probe fingers have tips disposed substantially along a straight line and are spaced to correspond to the spacing of respective contact pads along the edge of an IC being tested. Four spring clamps each have a cantilevered portion which contact the leaf spring portion of a respective probe wing, so as to provide an adjustable restraint for one of the leaf spring portions. There are four separate spring clamp adjusting means for separately adjusting the pressure restraints exercised by each of the spring clamps on its respective probe wing. The separate spring clamp adjusting means comprise spring biased platforms each attached to the frame member by three screws and spring washers so that the spring clamps may be moved and oriented in any desired direction to achieve alignment of the position of the probe finger tips on each probe wing".

D. Pedder, Structure for Testing Bare Integrated Circuit Devices, European Patent Application No. EP 0 731 369 A2 (Filed 14 Feb. 1996), U.S. Pat. No. 5,764,070 (9 Jun. 1998) discloses a test probe structure for making connections to a bare IC or a wafer to be tested, which comprises "a multilayer printed circuit probe arm which carries at its tip an MCM-D type substrate having a row of microbumps on its underside to make the required connections. The probe arm is supported at a shallow angle to the surface of the device or wafer, and the MCM-D type substrate is formed with the necessary passive components to interface with the device under test. Four such probe arms may be provided, one on each side of the device under test".

B. Eldridge, G. Grube, I. Khandros, and G. Mathieu, Method of Mounting Resilient Contact Structure to Semiconductor Devices, U.S. Pat. No. 5,829,128 (3 Nov. 1998), Method of Making Temporary Connections Between Electronic Components, U.S. Pat. No. 5,832,601 (10 Nov. 1998), Method of Making Contact Tip Structures, U.S. Pat. No. 5,864,946 (2 Feb. 1999), Mounting Spring Elements on Semiconductor Devices, U.S. Pat. No. 5,884,398 (23 Mar. 1999), Method of Burning-In Semiconductor Devices, U.S. Pat. No. 5,878,486 (9 Mar. 1999), and Method of Exercising Semiconductor Devices, U.S. Pat. No. 5,897,326 (27 Apr. 1999), disclose "Resilient contact structures are mounted directly to bond pads on semiconductor dies, prior to the dies being singulated (separated) from a semiconductor wafer. This enables the semiconductor dies to be exercised (e.g. tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such a wiring substrates, semiconductor packages, etc.). Using the all-metallic composite interconnection elements of the present invention as the resilient contact structures, burn-in can be performed at temperatures of at least 150° C., and can be completed in less than 60 minutes". While the contact tip structures disclosed by B. Eldridge et al. provide resilient contact structures, the structures are each individually mounted onto bond pads on semiconductor dies, requiring complex and costly fabrication. As well, the contact tip structures are fabricated from wire, which often limits the resulting geometry for the tips of the contacts. Furthermore, such contact tip structures have not been able to meet the needs of small pitch applications (e.g. typically on the order of 50 $\mu$m spacing for a peripheral probe card, or on the order of 75 $\mu$m spacing for an area array).

T. Dozier II, B. Eldridge, G. Grube, I. Khandros, and G. Mathieu, Sockets for Electronic Components and Methods of Connecting to Electronic Components, U.S. Pat. No. 5,772,451 (30 Jun. 1998) disclose "Surface-mount, solder-down sockets permit electronic components such as semiconductor packages to be releasably mounted to a circuit board. Resilient contact structures extend from a top surface of a support substrate, and solder-ball (or other suitable) contact structures are disposed on a bottom surface of the support substrate. Composite interconnection elements are used as the resilient contact structures disposed atop the support substrate. In any suitable manner, selected ones of the resilient contact structures atop the support substrate are connected, via the support substrate, to corresponding ones of the contact structures on the bottom surface of the support substrate. In an embodiment intended to receive an LGA-type semiconductor package, pressure contact is made between the resilient contact structures and external connection points of the semiconductor package with a contact force which is generally normal to the top surface of the support substrate. In an embodiment intended to receive a BGA-type semiconductor package, pressure contact is made between the resilient contact structures and external connection points of the semiconductor package with a contact force which is generally parallel to the top surface of the support substrate".

Other emerging technologies have disclosed probe tips on springs which are fabricated in batch mode processes, such as by thin-film or micro electronic mechanical system (MEMS) processes.

D. Smith and S. Alimonda, Photolithographically Patterned Spring Contact, U.S. Pat. No. 5,613,861 (25 Mar. 1997), U.S. Pat. No. 5,848,685 (15 Dec. 1998), and International Patent Application No. PCT/US 96/08018 (Filed 30 May 1996), disclose a photolithography patterned spring contact, which is "formed on a substrate and electrically connects contact pads on two devices. The spring contact also compensates for thermal and mechanical variations and other environmental factors. An inherent stress gradient in the spring contact causes a free portion of the spring to bend up and away from the substrate. An anchor portion remains fixed to the substrate and is electrically connected to a first contact pad on the substrate. The spring contact is made of an elastic material and the free portion compliantly contacts a second contact pad, thereby contacting the two contact pads". While the photolithography patterned springs, as disclosed by Smith et al., are capable of satisfying many IC probing needs, the springs are small, and provide little vertical compliance to handle the planarity compliance needed in the reliable operation of many current IC prober systems. Vertical compliance for many probing systems is typically on the order of 0.004"–0.010", which often requires the use of tungsten needle probes.

Furthermore, no one has taught a way to interconnect such a probe containing up to several thousand pins to a tester, while effectively dealing with planarity requirements. As advanced integrated circuit devices become more complex while decreasing in size, it would be advantageous to provide a probe card assembly which can be used to reliably interconnect to such devices.

To accommodate for planarity differences between an array of probe tips and the surface pads on a wafer under test, it may be advantageous to provide a probe substrate which can pivot freely by a small amount about its center. For such a system, however, an accurately controlled force must still be provided to engage the contacts, while holding the substrate positionally stable in the X, Y, and theta directions. Furthermore, for applications in which the substrate includes a large number (e.g. thousands) of wires or signals exiting its backside, wherein supports are located at the periphery of the substrate, these supports must not hinder the fan out exit pathways. As well, the signal wires must not hinder the pivoting of the substrate, nor should they hinder the controlled force provided to engage the springs against a device under test (DUT).

It would be advantageous to provide a method and apparatus for improved flexible probe springs, which are capable of high pin counts, small pitches, cost-effective fabrication, and customizable spring tips. It would also be advantageous to provide probe card assemblies using such flexible probe springs, which provide planarity compliance to semiconductor devices under testing and/or burn-in, while providing accurate axial and theta positioning.

Similarly, integrated circuit packages provide connections for power signals and transport signals, between an integrated circuit chip IC and a motherboard, so that the integrated circuit chip 44 can interface to the rest of a test system.

Microprocessor devices are some of the IC devices which are most severely limited by today's IC packages. Future microprocessors will need over 10,000 I/Os and will operate at over 20 Ghz.

In conventional IC packages, the signal, power and ground connections are typically achieved through either wire bonds or solder balls. Conventional packages using wire bonds or solder ball attachments have both signal and power parasitics, which impact performance. Current microprocessors have clock frequencies over 2 GHz but will be advancing to frequencies over 20 GHz in the near future. Current wire bond and solder ball technologies cannot maintain signals in the 20 GHz range.

Packages using wire bonds and solder balls attachments have signal, power and ground parasitics that impact performance. Therefore, new solutions are needed. Advanced packages, such as the Intel Bumpless Build-up Layer (BBUL) Packaging Technology (BBUL), build the package on top of the microprocessor, which can help to reduce such parasitics. BBUL packaging can also be used to tightly couple multiple chips in the same package which is referred to as a "chips-first" or Multi-Chip Module (MCM). Various details of BBUL structures are described in S. Towle, H. Braunisch, C. Hu, R. Emory, and G. Vandentop, Bumpless Build-Up Layer Packaging, Intel Corporation, Components Research, Presented at ASME International Mechanical Engineering Congress and Exposition (IMECE), New York, 12 Nov. 2001; and R. Emory, S. Towle, H. Braunsich, C. Hu, G. Raiser, and G. Vendentop, *Novel Microelectronic Packaging Method for reduced Thermomechanical Stresses on Low Dielectric Constant Materials*, Intel Corporation, presented at Advanced Metallization Conference, Montreal, Canada, 9 Oct. 2001.

The high-density build up layer on top of ICs has much better performance than traditional packaging approaches. The interconnections to the chip are shorter than solder bumps and much shorter than wire bonds, resulting in far lower inductance. Capacitors can be located closer to the IC, which enables better power delivery. The shorter signal distances should allow the IC to run at lower voltages, reducing electrical cross talk and also reducing power consumption. The high density interconnect (HDI) allows more interconnects from the silicon than solder bumps or wire bonds. In many cases, the delays and cross talk of the signals carried in the interconnect of the HDI is lower than delays of signals carried in the interconnect of the IC. Higher performance can be attained by having signals leave the IC interconnect and travel through the HDI interconnect since the propagation delays and cross talk are better in the HDI than on the IC. BBUL packages are thinner and capable of embedding multiple ICs in the same package.

This BBUL and MCM approaches tend to be very expensive due to fabrication complexity, and the need to guarantee that every chip in the module is good. Any bad chip or defect in manufacturing of the HDI between chips will cause all of the chips and the package to be rejected. A bad chip is any chip that does not meet performance requirements. Resultant BBUL/MCM packages are therefore typically significantly more expensive to manufacture than individually packaged ICs. In the past, the "chips-first" approach was only used to build MCMs used in satellites for space applications, where the smaller size and weight justified the higher cost.

It would be advantageous to provide a package which can be tested prior to attaching integrated circuits. Such a package would constitute a major technical advance. Furthermore, it would be advantageous to provide a package which provides through holes comprising multiple electrical routing layers, and provides advanced high density interface (HDI) functions, such as higher densities of I/O connections than attainable in flip-chip or wire bonded packages, high interconnect performance to an IC, within a thinner package. Such a package would constitute a further technical advance.

SUMMARY OF THE INVENTION

Several embodiments of enhanced integrated circuit probe card assemblies are disclosed, which extend the mechanical compliance of both MEMS and thin-film fabricated probes, such that these types of spring probe structures can be used to test one or more integrated circuits on a semiconductor wafer. Several embodiments of probe card assemblies, which provide tight signal pad pitch compliance and/or enable high levels of parallel testing in commercial wafer probing equipment, are disclosed. In some preferred embodiments, the probe card assembly structures include separable standard components, which reduce assembly manufacturing cost and manufacturing time. These structures and assemblies enable high speed testing in wafer form. The probes also have built in mechanical protection for both the integrated circuits and the MEMS or thin film fabricated spring tips and probe layout structures on substrates. Alternate card assembly structures comprise a compliant carrier structure, such as a decal or screen, which is adhesively attached to the probe chip substrate.

BRIEF DESCRIPTION OF THE DRAWINGS

FIG. 1 is a plan view of a linear array of photolithographically patterned springs, prior to release from a substrate;

FIG. 2 is a perspective view of a linear array of photolithographically patterned springs, after release from a substrate;

FIG. 3 is a side view of a first, short length photolithographically patterned spring, having a first effective radius and height after the short length spring is released from a substrate;

FIG. 4 is a side view of a second, long length photolithographically patterned spring, having a second large effective radius and height after the long length spring is released from a substrate;

FIG. 5 is a perspective view of opposing photolithographic springs, having an interleaved spring tip pattern, before the springs are released from a substrate;

FIG. 6 is a perspective view of opposing photolithographic springs, having an interleaved spring tip pattern, after the springs are released from a substrate;

FIG. 7 is a top view of opposing pairs of interleaved multiple-point photolithographic probe springs, in contact with a single trace on an integrated circuit device;

FIG. 8 is a plan view of opposing single-point photolithographic probe springs, before the springs are released from a substrate;

FIG. 9 is a top view of parallel and opposing single-point photolithographic probe springs, after the springs are released from a substrate, in contact with a single pad on an integrated circuit device;

FIG. 10 is a front view of a shoulder-point photolithographic probe spring;

FIG. 11 is a partial cross-sectional side view of a shoulder-point photolithographic spring in contact with a trace on an integrated circuit device;

FIG. 12 is a perspective view of a multiple shoulder-point photolithographic probe spring;

FIG. 13 is a cross-sectional view of a probe card assembly, wherein a plurality of photolithographic spring probes on a lower surface of a substrate are electrically connected to flexible connections on the upper surface of the substrate, and wherein the flexible connections are connected to a printed wiring board probe card;

FIG. 64 is a partial cross sectional view of a probe card assembly having a pin block with a solder ball array;

FIG. 65 is a detailed partial schematic view of a pin block having a solder ball array;

FIG. 66 is a partial cross sectional view of a probe card assembly having a pin block with backside springs;

FIG. 67 is a detailed partial schematic view of a pin block having backside springs;

FIG. 68 is a partial cross sectional view of a probe card assembly having a pin block with backside springs and press fit pins;

FIG. 69 is a detailed partial schematic view of a pin block having backside springs and press fit pins;

FIG. 70 is a partial cross sectional view of a probe card assembly having a pin block with SMT solder and top interposer;

FIG. 71 is a detailed partial schematic view of a pin block with SMT solder and top interposer;

FIG. 76 is a partial cross sectional view of a high performance spring package for integrated circuits;

FIG. 77 is a partial cross sectional view of an alternate high performance spring package for integrated circuits;

DETAILED DESCRIPTION OF PREFERRED EMBODIMENTS

Figure 14:
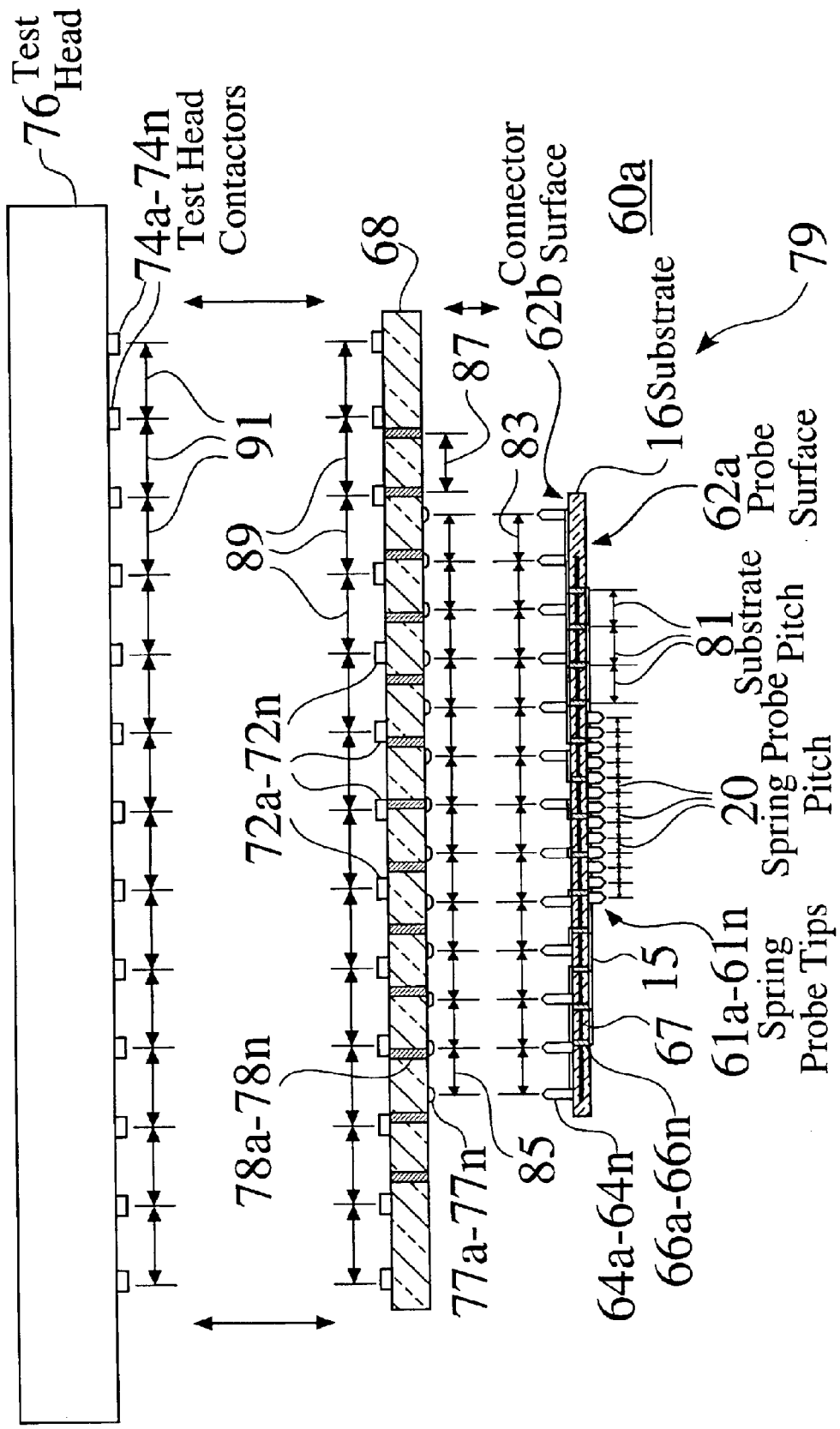
FIG. 14 is a partial expanded cross-sectional view of a probe card assembly, which shows staged pitch and fan-out across a substrate and a printed wiring board probe card.

FIG. 1 is a plan view 10 of a linear array 12 of photolithographically patterned springs 14a–14n, prior to release from a substrate 16. The conductive springs 14a 14n are typically formed on the substrate layer 16, by successive layers of deposited metal, such as through low and high energy plasma deposition processes, followed by photolithographic patterning, as is widely known in the semiconductor industry. The successive layers have different inherent levels of stress. The release regions 18 of the substrate 16 are then processed by undercut etching, whereby portions of the spring contacts 14a–14n located on a release layer 19 (FIG. 3) over the release region 18, are released from the substrate 16 and extend (i.e. bend) away from the substrate 16, as a result of the inherent stresses between the deposited metallic layers. Fixed regions 15 (FIG. 3, FIG. 4) of the deposited metal traces remain affixed to the substrate 16, and are typically used for routing (i.e. fanning-out) from the spring contacts 14a–14n. FIG. 2 is a perspective view 22 of a linear array 12 of photolithographically patterned springs 14a–14n, after release from a substrate 16. The spring contacts 14a–14n may be formed in high density arrays, with a fine pitch 20, currently on the order of 0.001 inch.

FIG. 3 is a side view 26a of a first photolithographically patterned spring 14 having a short length 28a, which is formed to define a first effective spring angle 30a, spring radius 31a, and spring height 32a, after the patterned spring 14 is released from the release region 18a of the substrate 16, away from the planar anchor region 15. FIG. 4 is a side view 26b of a second photolithographically patterned spring 14, having a long spring length 28b, which is formed to define a second large effective spring angle 30b, spring radius 31b and spring height 32b, after the patterned spring 14 is released from the release region 18b of the substrate 16. The effective geometry of the formed spring tips 14 is highly customizable, based upon the intended application. As well, the spring tips are typically flexible, which allows them to be used for many applications.

Patterned probe springs 14 are capable of very small spring to spring pitch 20, which allows multiple probe springs 14 to be used to contact power or ground pads on an integrated circuit device 44 (FIG. 13), thereby improving current carrying capability. As well, for a probe card assembly having an array 12 of probe springs 14, multiple probe springs 14 may be used to probe I/O pads on an integrated circuit device 44 under test (DUT), thus allowing every contact 14 to be verified for continuity after engagement of the spring contacts 14 to the wafer 92 under test, thereby ensuring complete electrical contact between a probe card assembly and a device 44, before testing procedures begin.

Improved Structures for Miniature Springs. FIG. 5 is a first perspective view of opposing photolithographic springs 34a, 34b, having an interleaved spring tip pattern, before spring to substrate detachment. FIG. 6 is a perspective view of opposing interleaved photolithographic springs 34a, 34b, after spring to substrate detachment.

The interleaved photolithographic springs 34a, 34b each have a plurality of spring contact points 24. When spring contacts are used for connection to power or ground traces 46 or pads 47 of an integrated circuit device 44, the greatest electrical resistance occurs at the point of contact. Therefore, an interleaved spring contact 34, having a plurality of contact points 24, inherently lowers the resistance between the spring contact 34 and a trace 46 or pad 47. As described above, multiple interleaved probe springs 34 may be used for many applications, such as for high quality electrical connections for an integrated circuit device 44, or for a probe card assembly 60 (FIG. 13), such as for probing an integrated circuit device 44 during testing.

FIG. 7 is a perspective view 42 of opposing interleaved photolithographic spring pairs 34a, 34b in contact with single traces 46 on an integrated circuit device under test (DUT) 44. The interleaved spring contact pair 34a and 34b allows both springs 34a and 34b, each having a plurality of contact points 24, to contact the same trace 46. As shown in FIG. 5, when a zig-zag gap 38 is formed between the two springs 34a, 34b on a substrate 16, multiple tips 24 are established on each spring 34a, 34b. Before the interleaved spring probes 34a, 34b are released from the substrate 16, the interleaved points 24 are located within an overlapping interleave region 36. When the interleaved spring probes 34a, 34b are detached from the substrate 16, the interleaved spring points 24 remain in close proximity to each other, within a contact region 40, which is defined between the springs 34a, 34b. The interleaved spring contact pair 34a and 34b may then be positioned, such that both interleaved spring probes 34a and 34b contact the same trace 46, such as for a device under test 44, providing increased reliability. As well, since each interleaved spring 34a, 34b includes multiple spring points 24, contact with a trace 46 is increased, while the potential for either overheating or current arcing across the multiple contact points 24 is minimized.

FIG. 8 is a top view of parallel and opposing single-point photolithographic springs 14, before the springs 14 are released from a substrate 16. As described above for interleaved springs 34a, 34b, parallel springs 14 may also be placed such that the spring tips 24 of multiple springs contact a single trace 46 on a device 44. As well, opposing spring probes 14 may overlap each other on a substrate 16, such that upon release from the substrate 16 across a release region 18, the spring tips 24 are located in close proximity to each other. FIG. 9 is a top view of parallel and opposing parallel single-point photolithographic springs 14, after the springs 14 are released from the substrate 16, wherein the parallel and opposing parallel single-point photolithographic springs 14 contact a single pad 47 on an integrated circuit device 44.

FIG. 10 is a front view of a shoulder-point photolithographic spring 50, having a point 52 extending from a shoulder 54. FIG. 11 is a partial cross-sectional side view of a shoulder-point photolithographic spring 50, in contact with a trace 46 on an integrated circuit device. FIG. 12 is a perspective view of a multiple shoulder-point photolithographic spring 50. Single point spring probes 14 typically provide good physical contact with conductive traces 46 on an integrated circuit device 22, often by penetrating existing oxide layers on traces 46 or pads 47 by a single, sharp probe tip 24. However, for semiconductor wafers 92 or integrated circuit devices having thin or relatively soft traces 46 or pads 47, a single long probe tip 24 may penetrate beyond the depth of the trace 46, such as into the IC substrate 48, or into other circuitry.

Shoulder-point photolithographic springs 50 therefore include one or more extending points 52, as well as a shoulder 54, wherein the points 52 provide desired penetration to provide good electrical contact to traces 46, while the shoulder 54 prevents the spring 50 from penetrating too deep into a device 44 or wafer 92. Since the geometry of the probe springs 50 are highly controllable by photolithographic screening and etching processes, the detailed geometry of the shoulder-point photolithographic spring 50 is readily achieved.

Improved Probe Card Assemblies. FIG. 13 is a cross-sectional view 58 of a probe card assembly 60a, wherein a plurality of electrically conductive probe tips 61a–61n are located on a lower probe surface 62a of a substrate 16. A plurality of flexible, electrically conductive connections 64a–64n are located on the upper connector surface 62b of the substrate 16, and are each connected to the plurality of electrically conductive springs probe tips 61a–61n, by corresponding electrical connections 66a–66n.

The substrate 16 is typically a solid plate, and is preferably a material having a low thermal coefficient of expansion (TCE), such as ceramic, ceramic glass, glass, or silicon. The electrically conductive spring probe tips 61a–61n establish electrical contact between the probe card assembly 60 and a semiconductor wafer 92, when the probe card assembly 60a and the semiconductor wafer 92 are positioned together.

The spring probe tips 61a–61n may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts.

The probe tips 61a–61n are electrically connected to flexible electric connections 64a–64n, preferably through metalized vias 66a–66n within the substrate 16. Each of the plurality of flexible electric connections 64a–64n are then electrically connected to a printed wiring board probe card 68, which is then typically held in place by a metal ring or frame support structure 70. The preferred metallized via electrical connections 66a–66n (e.g. such as produced by Micro Substrate Corporation, of Tempe, Ariz.), are typically formed by first creating holes in the substrate 16, using laser or other drilling methods. The holes are then filled or plated with conductive material, such as by plating or by extrusion. After the conductive vias 66a–66n are formed, they are typically polished back, to provide a flat and smooth surface.

FIG. 14 is a partial expanded cross-sectional view 79 of a probe card assembly 60a, which shows staged pitch and fan-out across a substrate 16 and a printed wiring board probe card 68. The probe tips 61a–61n are typically arranged on the probe surface 62a of the substrate, with a fine spring pitch 20. The fixed trace portions 15 are then preferably fanned out to the metalized vias 66a–66n, which are typically arranged with a substrate pitch 81. The electrically conductive connections 64a–64n, which are located on the upper connector surface 62b of the substrate 16 and are connected to the vias 66a–66n, are typically arranged with a connection pitch 83, which may be aligned with the substrate pitch 81, or may preferably be fanned out further on the upper connector surface 62b of the substrate 16.

The conductive pads 77a–77n on the underside of the printed wiring board probe card 68 are typically arranged with a pad pitch 85, such that the conductive pads 77a–77n are aligned with the electrically conductive connections 64a–64n located on the upper connector surface 62b of the substrate 16. The conductive pads 77a–77n are then preferably fanned out to conductive paths 78a–78n, which are typically arranged with a probe card pitch 87. The electrically conductive connections 72a 72n, which are located on the upper surface of the printed wiring board probe card 68 and are connected to the conductive paths 78a–78n, are typically arranged with a probe card connection pitch 89, which may be aligned with the probe card pitch 87, or may preferably be fanned out further on the upper surface of the printed wiring board probe card 68. The probe card connection pitch 89 is preferably chosen such that the electrically conductive connections 72a–72n are aligned with the test head connectors 74a–74n located on the test head 76, which are typically arranged with a test head pitch 91.

The flexible electric connections 64a–64n are typically fabricated using a longer spring length 28 than the probe tips 61a–61n, to provide a compliance of approximately 4–10 mils. In some embodiments, the flexible connections 64a–64n are typically built in compliance to photolithographic springs, such as described above, or as disclosed in either U.S. Pat. No. 5,848,685 or U.S. Pat. No. 5,613,861, which are incorporated herein by reference.

The flexible connections 64a–64n are connected to the printed wiring board (PWB) probe card 68, either permanently (e.g. such as by solder or conductive epoxy) or non-permanently (e.g. such as by corresponding metal pads which mate to the tips 24 of flexible connection springs 64a–64n). The printed wiring board probe card 68 then fans out the signals to pads 72a–72n, on a pad pitch 89 suitable for standard pogo pin contactors 74a–74n typically arranged with a test head pitch 91 on a test head 76.

The flexible connections 64a–64n are preferably arranged within an area array, having an array pitch 83 such as 1.00 mm or 1.27 mm, which provides a reasonable density (i.e. probe card pitch 87) for plated through-holes (PTH) 78 on the printed wiring board probe card 68, and allows signal fan-out on multiple layers within the printed wiring board probe card 68, without resorting to advanced printed wiring board probe cards 68 containing blind conductive vias 78a–78n.

The flexible conductive connections 64a–64n, which contact conductive pads 77a 77n on the underside of the printed wiring board probe card 68, maintain electrical connection between the printed wiring board probe card 68 and the substrate 16, while the substrate 16 is allowed to move up and down slightly along the Z-axis 84, as well as tilt about its center. The flexible connections 64a–64n also provide lateral compliance between a substrate 16 and a printed wiring board probe card 68 having different thermal coefficients of expansion (e.g. such as for a low TCE substrate 16 and a relatively high TCE printed wiring board probe card 68).

Alternately, the substrate 16 may be an assembly, such as a membrane probe card, which connects to the printed wiring board probe card 68 through membrane bump contacts 64a–64n. In alternate embodiments of the probe card assembly, connections 64a–64n are provided by a separable connector 132 (FIG. 18), or preferably by a MEG-Array™ connector 162 (FIG. 24), from FCI Electronics, of Etters, Pa., wherein ball grid solder arrays located on opposing halves of the connector 132, 162 are soldered to matching conductive pads on the substrate 16 and printed wiring board probe card 68, such as seen in FIG. 14, and wherein the conductive pads are each arranged within an area array pattern, such that the opposing halves of the connector 132, 162 provide a plurality of mating electrical connections between each of the plurality of spring probe tips 61a–61n and each of the plurality of conductive pads 77a–77n on the underside of the printed wiring board probe card 68.

As the size and design of integrated circuit devices 44 becomes increasingly small and complex, the fine pitch 20 (FIG. 2) provided by miniature spring probe tips 61a–61n becomes increasingly important. Furthermore, with the miniaturization of both integrated circuits 44 and the required probe card test assemblies, differences in planarity between an integrated circuit 44 and a substrate 16 containing a large number of spring probes 61a–61n becomes critical.

The probe card assembly 60a provides electrical interconnections to a substrate 16, which may contain thousands of spring probe tips 61a–61n, while providing adequate mechanical support for the probe card assembly 60a, to work effectively in a typical integrated circuit test probing environment. The probe card assembly 60a is readily used for applications requiring very high pin counts, for tight pitches, or for high frequencies. As well, the probe card assembly 60a is easily adapted to provide electrical contact for all traces 46 (FIG. 7) and input and output pads 47 (FIG. 7, FIG. 9) of an integrated circuit device, for test probe applications which require access to the central region of an integrated circuit die 44.

As shown in FIG. 13, the probe card assembly 60a is typically positioned in relation to an a semiconductor wafer 92, having one or more integrated circuits 44, which are typically separated by saw streets 94. An X-axis 80 and a Y-axis 82 typically defines the location of a probe card assembly 60 across a semiconductor wafer 92 or device 44, while a Z-axis defines the vertical distance between the surface of the wafer 92 and the probe card assembly 60. Position of the wafer 92 under test, in relation to the test head 76 and the probe card assembly 60a is required to be precisely located in relation to the X-axis 80, the Y-Axis 82, and the Z-axis 84, as well as rotational Z-axis (i.e. theta) location 90 about the Z-axis 84.

However, it is increasingly important to allow probe card assemblies to provide contact with a planar semiconductor wafer 92, wherein the semiconductor wafer 92 and the probe card assembly are slightly non-planar to each other, such as by a slight variation in X-axis rotation 86 and/or Y-axis rotation 88.

In the probe card assembly 60a shown in FIG. 13, the probe tips 61a–61n are flexible, which inherently provides planarity compliance between the substrate 16 and the semiconductor wafer 92. As well, the flexible connections 64a–64n, which are also preferably flexible conductive springs 14, 34, 50, provide further planarity compliance between the substrate 16 and the semiconductor wafer 92. The probe card assembly 60a therefore provides planarity compliance between a substrate 16 and an integrated circuit device 44 (i.e. such as by X-axis rotation 86 and/or Y-axis rotation 88). As well, the probe card assembly 60a also accommodates differences in thermal coefficients of expansion (TCE) between the substrate 16 (which is typically comprised of ceramic, ceramic glass, glass, or silicon) and the printed wiring board probe card 68 (which is typically comprised of glass epoxy material).

The signal traces from the probe tips 61a–61n, typically having a small pitch 20, are preferably fanned out to the flexible connections 64a–64n, typically having a larger pitch, using routing traces on one or both surfaces 62a, 62b of the substrate 16.

The flexible connections 64a–64n are preferably laid out on a standardized layout pattern, which can match standardized power and ground pad patterns (i.e. assignments) on the printed wiring board probe card 68, thus allowing the same printed wiring board probe card 68 to be used for substrates 16 laid out to mate to different integrated circuit devices 44. As a printed wiring board probe card 68 may be adapted to specialized substrates 16, for the testing of a variety of different devices 44, the operating cost for a printed wiring board probe card 68 is reduced.

To aid in high frequency power decoupling, capacitors 172 (FIG. 24), such as LICA™ series capacitors, from AVX Corporation, of Myrtle Beach S.C., are preferably mounted on the top surface 62b of the substrate 16. Alternately, a parallel plate capacitor may be formed within the substrate 16, between the reference plane and a plane formed on the unused areas of the routing trace layer. For embodiments in which the substrate 16 is composed of silicon, an integral capacitor 67 (e.g. such as an integral bypass capacitor) may preferably be formed within the silicon substrate 16. As in the integrated circuits, such capacitors include metal-dielectric-metal construction, metal-dielectric-heavily doped semiconductors, or p-n junctions. For non-semiconductor substrates, metal-dielectric-metal capacitors may be fabricated on or within the substrates, using integrated circuit fabrication techniques.

A look up and look down camera is typically used to align the wafer chuck to the substrate 16, whereby the probe tips 20 are aligned to the contact pads 47 or traces 46 on a device under test 44 located on a semiconductor wafer 92. Alignment is typically achieved, either by looking at spring tips 24, or at alignment marks 125 printed on the substrate 16.

For probe card assemblies without such a camera, the substrate 16 is preferably comprised of translucent or transparent material (e.g. such as glass ceramic or glass), thereby allowing view-through-the-top alignment methods to be performed by a test operator. A window 165 (FIG. 24) is preferably defined in the printed wiring board probe card 68, while alignment marks 125 (FIG. 17), 185 (FIG. 26) are preferably located on the substrate and/or the wafer 92 under test. A test operator may then use a camera or microscope to view the alignment marks 125 through the window, and align the substrate 16 and wafer 92.

For applications where access to the surface of the semiconductor wafer 92 is required while probe contact is maintained (e.g. such as for voltage contrast electron beam probing during development of the integrated circuit device 44), a window 123 (FIG. 17) in the substrate region 16 over the IC center is preferably defined, allowing access to observe signals in the die 92. Windows 123 work best for integrated circuit devices 44 having I/O pads located along the die edge, enabling direct probing of integrated circuit devices 44 located on a wafer 92. Currently, the semiconductor wafer dies 92 must be diced first, wherein separate integrated circuit devices 44 are wire bonded into a package, and are then tested.

Defined openings (i.e. windows 123) within the substrate 16 are also preferably used for in-situ e-beam repair of devices such as DRAMs, in which the probe card assembly 60 may remain in place. Testing, repair and retesting may thus be performed at the same station, without moving the wafer 92.

The structure of the probe card assembly 60a provides very short electrical distances between the probe tips 61a–61n and the controlled impedance environment in the printed wiring board probe card 68, which allows the probe card assembly 60a to be used for high frequency applications. For embodiments wherein the traces on one or both surfaces 62a, 62b of the substrate 16 are required to be impedance controlled, one or more conductive reference planes may be added within the substrate 16, either on top of the traces, below the traces, or both above and below the traces. For ultra high-frequency applications, the substrate 16 may contain alternating ground reference traces, which are connected between reference planes 262 (FIG. 37, FIG. 38) at regular intervals using vias 266 (FIG. 37, FIG. 38), to effectively provide a shielded coaxial transmission line environment 260. In some embodiments, ground plane traces are placed on one side of the signal line.

High Compliance Probe Assemblies. As described above, a probe card assembly structure 60 fixedly supports a substrate 16, relative to the printed wiring board probe card 68, in the lateral X and Y directions, as well as rotationally 90 in relation to the Z axis 84.

While the flexible spring probes 61a–61n, as well as flexible connections 64a–64n, provide some planarity compliance between a probe card assembly 60 and a semiconductor wafer 92 or device 44, other preferred embodiments of the probe card assembly 60 provide enhanced planarity compliance.

Since probe springs 61a–61n are often required to be very small, to provide high density connections and a fine pitch 20, in some probe card applications which require substantial planarity compliance, the compliance provided by the probe springs 61a–61n alone may not be sufficient. Therefore, in some preferred embodiments of the probe card assembly 60, the probe card assembly 60 allows the substrate 16 to pivot about its center (i.e. vary in X-axis rotation 86 and/or Y-axis rotation 88), to provide increased planarity compliance to a semiconductor wafer 92 under test. In such applications, the probe card assembly 60 must still exert a controlled downward force in the Z direction 84, for engaging the probe spring contacts 61a–61n located on the bottom surface 62a of the substrate 16 against a semiconductor wafer 92.

For many embodiments of the probe card assembly 60, the central region 119 (FIG. 17) of the substrate 16 is used for electrical connections 64a–64n between the substrate 16 and the printed wiring board probe card 68, thus requiring that the substrate 16 be supported along the periphery 127 (FIG. 17) of the substrate 16.

A ball joint fulcrum structure may be located within the central region of a probe card assembly on the back side of the substrate support structure, to allow the substrate 16 to pivot about the center, and to provide force to engage the probe tips 61a 61n. However, such a structure would typically impede wire leads or other electrical connections, which often need to exit over the central region of the probe card assembly. Moreover, such a movable joint does not typically restrict theta rotation 90 of the substrate 16 reliably.

Figure 15:
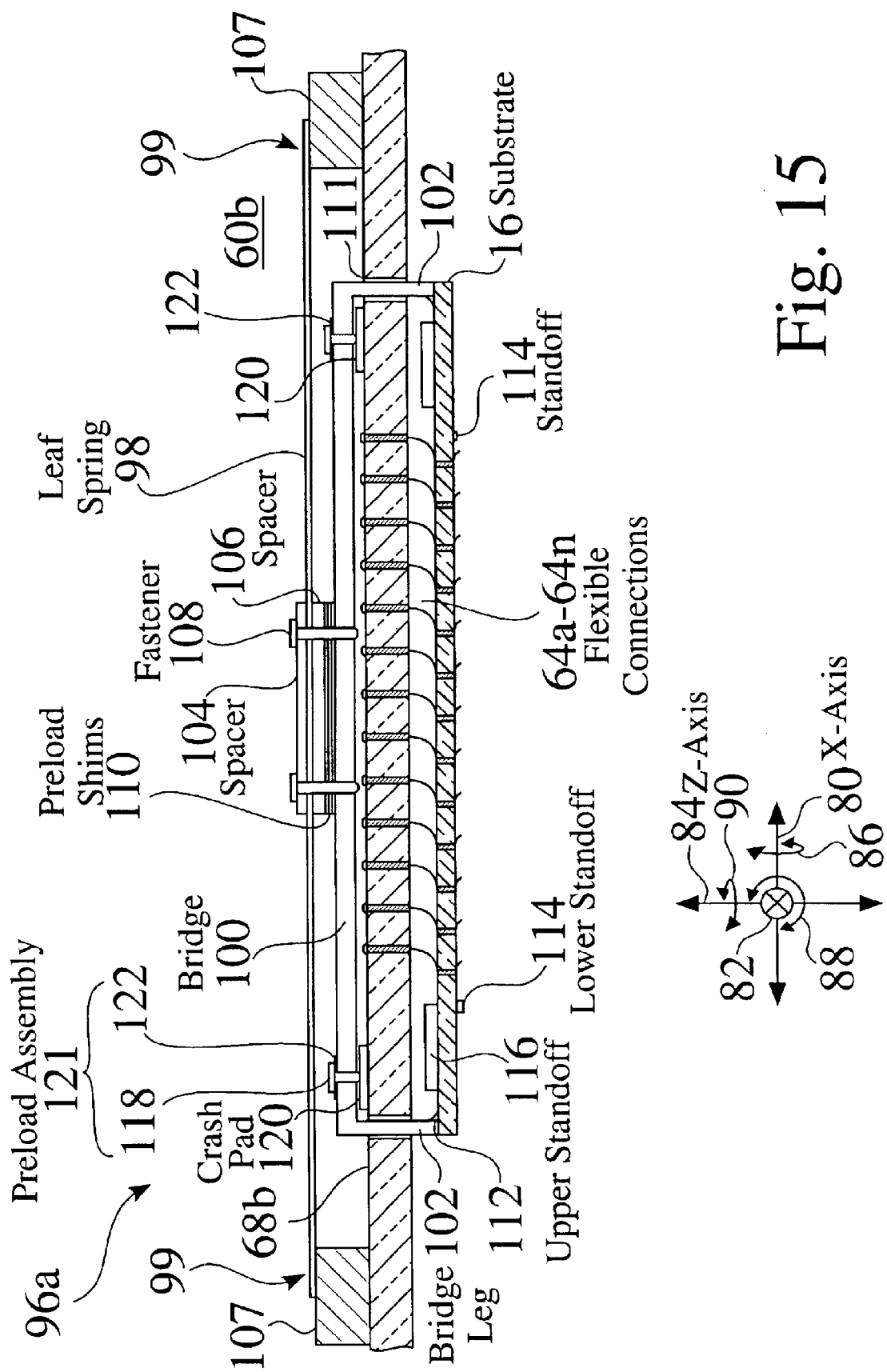
FIG. 15 is a first partial cross-sectional view of a bridge and leaf spring suspended probe card assembly.
Figure 16:
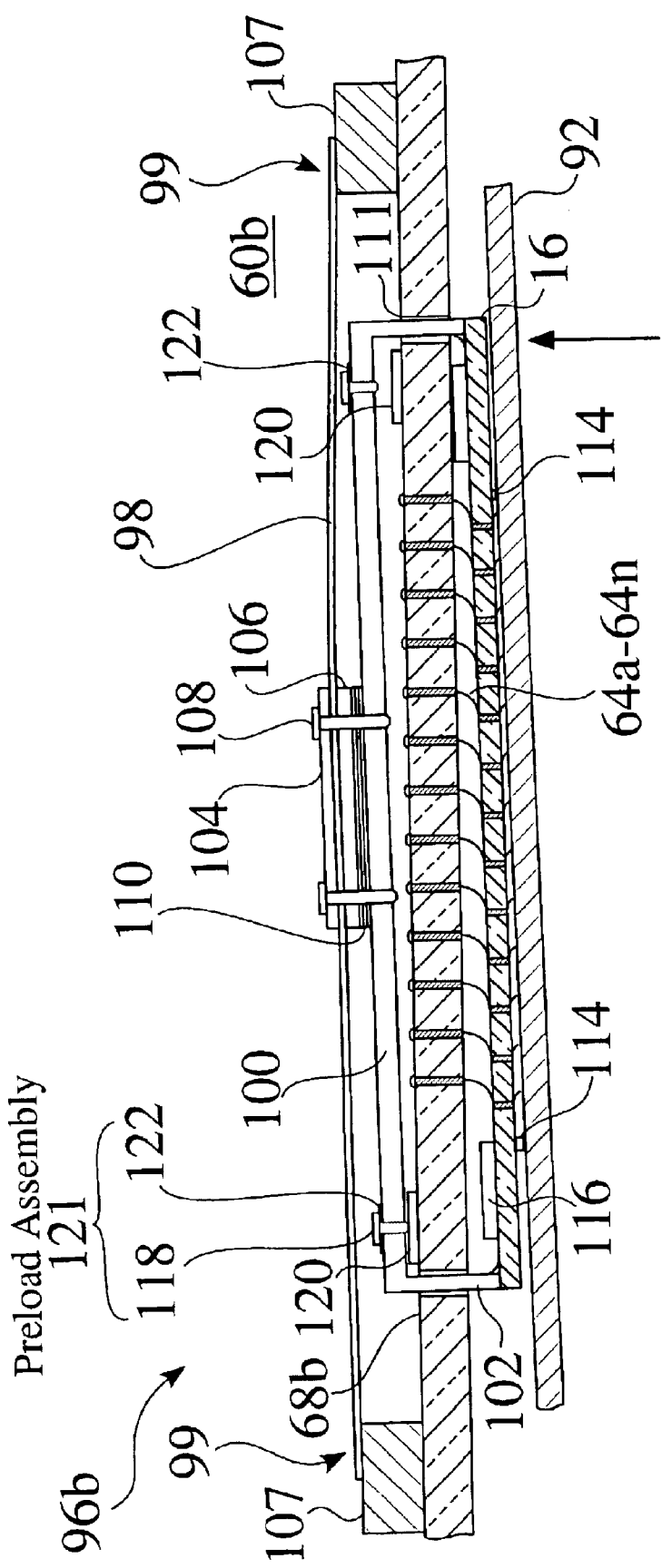
FIG. 16 is a second partial cross-sectional view of a bridge and leaf spring suspended probe card assembly in contact with a device under test (DUT)
Figure 17:
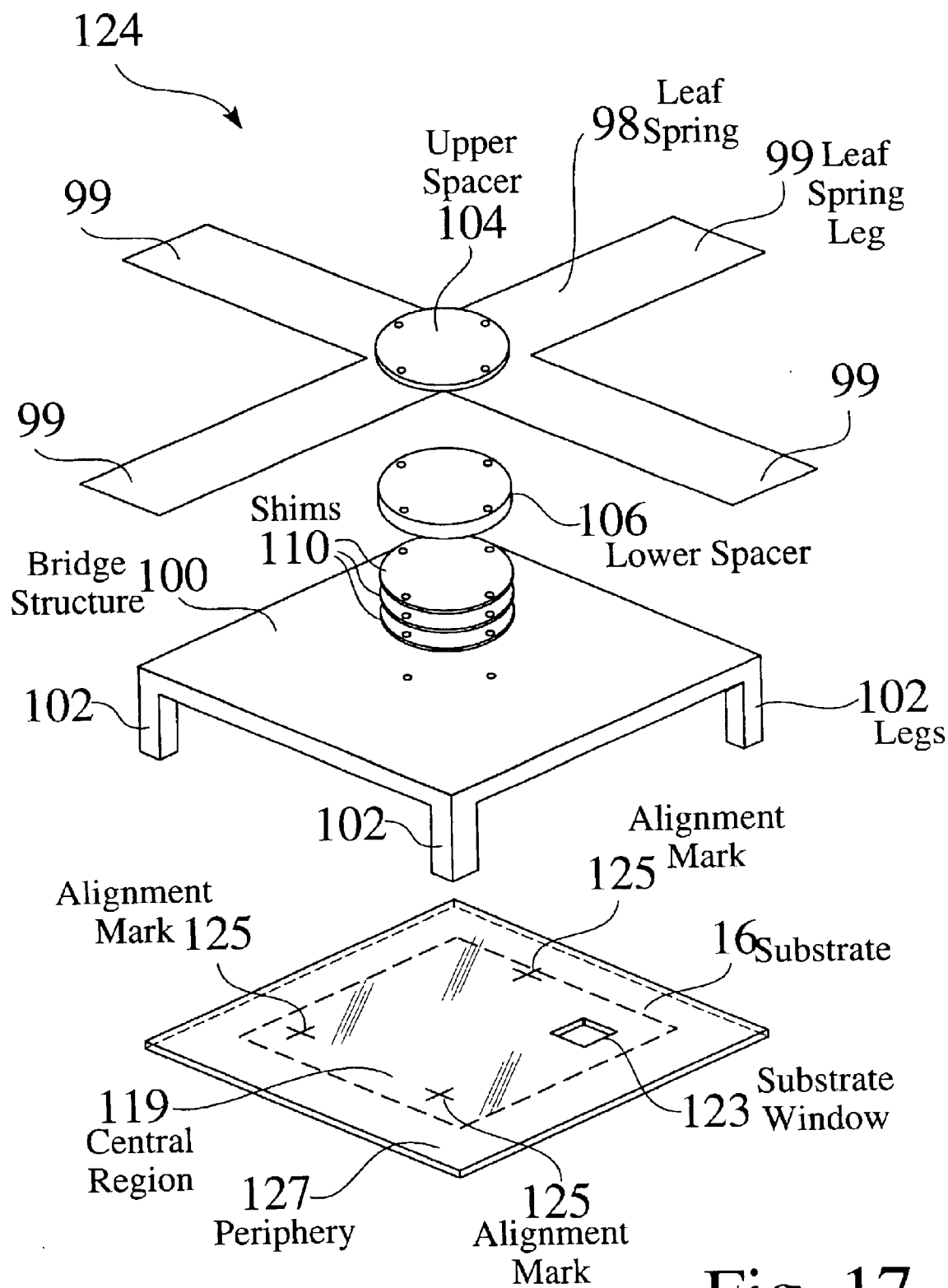
FIG. 17 is a partially expanded assembly view of a bridge and leaf spring suspended probe card assembly.

FIG. 15 is a first partial cross-sectional view 96a of a bridge and leaf spring suspended probe card assembly 60b. FIG. 16 is a second partial cross-sectional view 96b of the bridge and leaf spring suspended probe card assembly 60b shown in FIG. 15, which provides planarity compliance with one or more integrated circuit devices 44 on a semiconductor wafer 92, which may be non-coplanar with the probe card assembly 60b. FIG. 17 is a partial expanded assembly view 124 of major components for a bridge and spring probe card suspension assembly 60b.

A leaf spring 98 connects to the substrate 16 through a bridge structure 100. The leaf spring 98 and bridge structure 100 provide pivoting freedom for the substrate 16 (i.e. slight X-axis rotation 86 and Y-axis rotation 88), with controlled movement in the Z direction 84, X direction 80, Y direction 82 and Z-Axis rotation (theta) 90 directions. In preferred embodiments, a preload assembly 121 (FIG. 15) is used as a means for accurately setting the initial plane and Z position of the substrate 16 in relation to the printed wiring board probe card 68b, and to set the pre-load force of the leaf spring 98. For example, in the embodiment shown in FIG. 15 and FIG. 16, the preload assembly 121 comprises fasteners 118, which are used in conjunction with bridge shims 122. In alternate embodiments, the preload assembly 121 may comprise calibration screw assemblies 122, crash pads 120, and/or other standoffs 116.

As shown in FIG. 15 and FIG. 16, the outer edges of a leaf spring 99 are fixed to the printed wiring board probe card 68 along its outside edges by attachment frame 107. The center of the leaf spring 98 is connected to the bridge 100, by one or more fasteners 108, an upper bridge spacer 104, and a lower bridge spacer 106. Bridge preload shims 110 are preferably added, such as to vary the Z distance between the leaf spring 98 and the bridge 100, which varies the pre-load of the downward force exerted by the leaf spring 98 on the bridge 100. The bridge 100 translates the support from the center out to the corners, and connects to the substrate 16 by a plurality (typically three or more) bridge legs 102. The bridge legs 102 protrude through leg openings 111 defined in the printed wiring board probe card 68, and are fixedly attached to the substrate 16, such as by adhesive or mechanical connections 112.

The leaf spring 98 is typically fabricated from a sheet of stainless steel or spring steel, and is typically patterned using chemical etching methods. The downward force is a function of the stiffness of the spring, the diameter of the spring spacers 104 and 106, as well as the size of the leaf spring 98.

While the leaf spring 98 shown in FIG. 16 has the shape of a cross, other geometric shapes may be used to provide downward force, tilting freedom, and X,Y, and theta translation resistance. For example, a leaf spring 98 having a cross shape may include any number of wings 99. As well, the wings 99 may have asymmetrical shapes, which vary in width as they go from the outside edge towards the center. Also, the outside edge of the leaf spring 98 may be connected into a ring, to provide further stability of the leaf spring 98.

The bridge 100 and the spacers 104 and 106 are preferably comprised of light and strong metals, such as aluminum or titanium, to minimize the moveable mass of the bridge and leaf spring suspended probe card assembly 60b.

Figure 18:
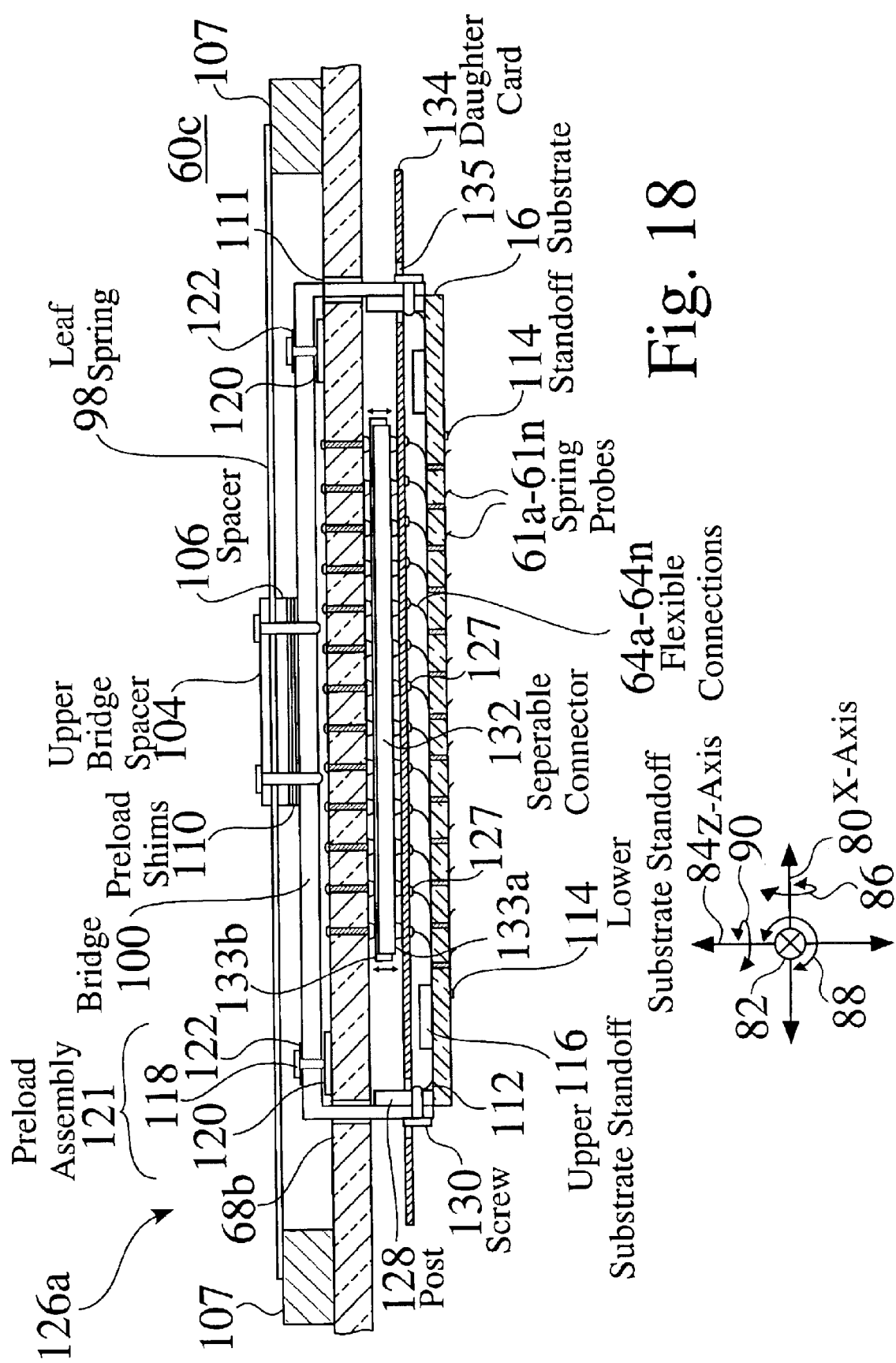
FIG. 18 is a first partial cross-sectional view of a bridge and leaf spring suspended probe card assembly, having an intermediate daughter card detachably connected to the probe card substrate, and wherein the probe spring substrate is detachably connected to the bridge structure.

The substrate 16 is typically attached to the legs 102 of the bridge 100, using an adhesive 112, such as an epoxy, or solder. Where substrate replaceability is needed, detachable connections 130, such as shown in FIG. 18, can be used.

On the bottom side 62a of the substrate 16, lower standoffs 114 are preferably used, which prevent the substrate 16 from touching a wafer under test 92. The lower standoffs 114 are preferably made of a relatively soft material, such as polyimide, to avoid damage to the semiconductor wafer under test 92. In addition, to further avoid damage to active circuits 44 in the semiconductor wafer 92, the standoffs 114 are preferably placed, such that when the probe card assembly 60 is aligned with a device 44 on a semiconductor wafer 92, the standoffs are aligned with the saw streets 94 (FIG. 13) on the semiconductor wafer 92, where there are no active devices 44 or test structures. Furthermore, the height of the lower standoffs 114 are preferably chosen to limit the maximum compression of the spring probes 61a–61n, thus preventing damage to the spring probes 61a–61n.

On the upper surface 62b of the substrate 16, upper standoffs 116 are also preferably used, to prevent damage to the topside flexible electrical connections 64a–64n. The upper standoffs 116 are preferably made of a moderately hard insulative material, such as LEXAN™, silicone, or plastic.

In the preferred embodiment shown in FIG. 15, FIG. 16 and FIG. 17, adjustable bridge screws 118 and bridge shims 122 are used to set the initial plane of the substrate 16, as well as to provide a downward stop to the substrate 16, so that the flexible connections 64a–64n are not damaged by over-extension.

Since printed wiring board probe cards 68b are typically made of relatively soft materials (e.g. such as glass epoxy), crash pads 120 are preferably placed on the probe card 68b, under the adjusting screws 118, to prevent the tip of the adjusting screws 118 from sinking into the printed wiring board probe card 68b over repeated contact cycles. Fastener shims 122 are also preferably used with the adjusting screws 118, such that the initial distance and planarity between the substrate 16 and the printed wiring board probe card 68b may be accurately set.

The preload shims 110 are preferably used to control the initial pre-load of the downward force exerted by the leaf spring 98 onto the bridge 100. The set preload prevents vibration of the substrate 16, and improves contact characteristics between the substrate 16 and to the semiconductor wafer under test 92.

Figure 19:
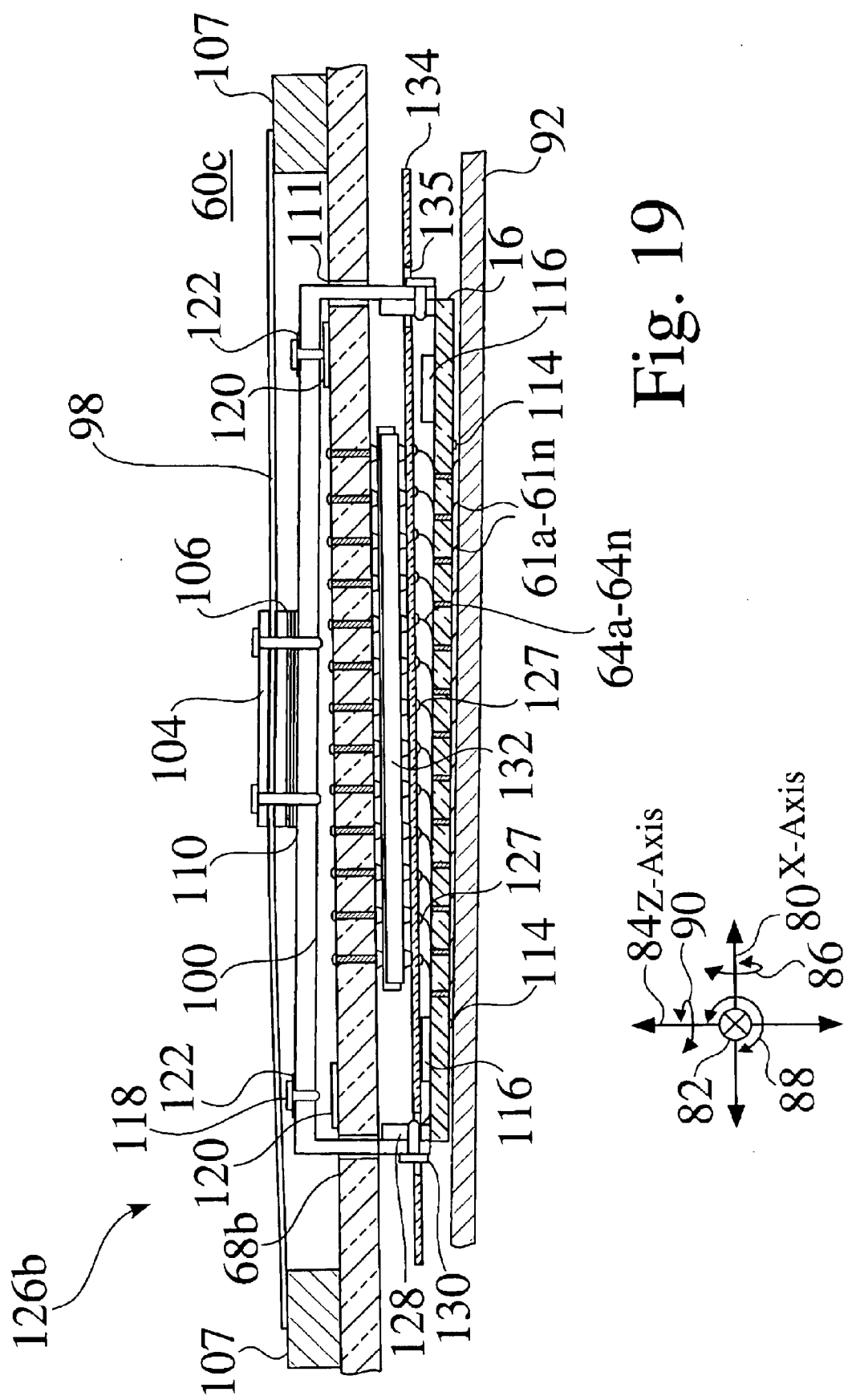
FIG. 19 is a second partial cross-sectional view of the bridge and leaf spring suspended probe card assembly shown in contact with a device under test (DUT)

FIG. 18 is a first partial cross-sectional view 126a of an alternate bridge and spring suspended probe card assembly 60c, having an intermediate daughter card 134 detachably connected to the printed wiring board probe card substrate 68b, and wherein the spring probe substrate 16 is detachably connected to the bridge structure 100. FIG. 19 is a second partial cross-sectional view 126b of the alternate bridge and spring suspended probe card assembly 60c shown in FIG. 18, which provides planarity compliance with one or more integrated circuit devices 44 on a semiconductor wafer 92, which is originally non-coplanar with the probe card assembly 60c.

In the alternate bridge and spring suspended probe card assembly 60c shown in FIG. 18, electrical connections are provided between the probe chip substrate 16 and the daughter card 134, such as between flexible connections 64a–64n which provide electrical connection to the daughter card 134.

As seen in FIG. 18, a separable connector 132, having detachable halves 133a, 133b, provides a detachable connection between the intermediate daughter card 134 and the printed wiring board probe card substrate 68b, which allows replacement of the substrate 16 and the daughter card 134. Substrate attachment fasteners 130, e.g. such as but not limited to screws, preferably extend through bridge legs 128, and allow the bridge 100 to be removeably connected to substrate posts 128, which are mounted on the upper surface 62b of the substrate 16.

In one embodiment of the probe card assembly 60, the preferred separable connector 132 is a MEG-Array™ connector, manufactured by FCI Electronics, of Etters, Pa. One side of the separable connector 132 is typically soldered to the printed wiring board probe card 68, while the mating side is typically soldered to the daughter card 134, whereby the daughter card 134 may be removeably connected from the printed wiring board probe card 68b, while providing a large number of reliable electrical connections. The daughter card 134 preferably provides further fanout of the electrical connections, from a typical pitch of about 1 mm for the flexible connections 64a–64n, to a common pitch of about 1.27 mm for a separable connector 132.

Figure 20:
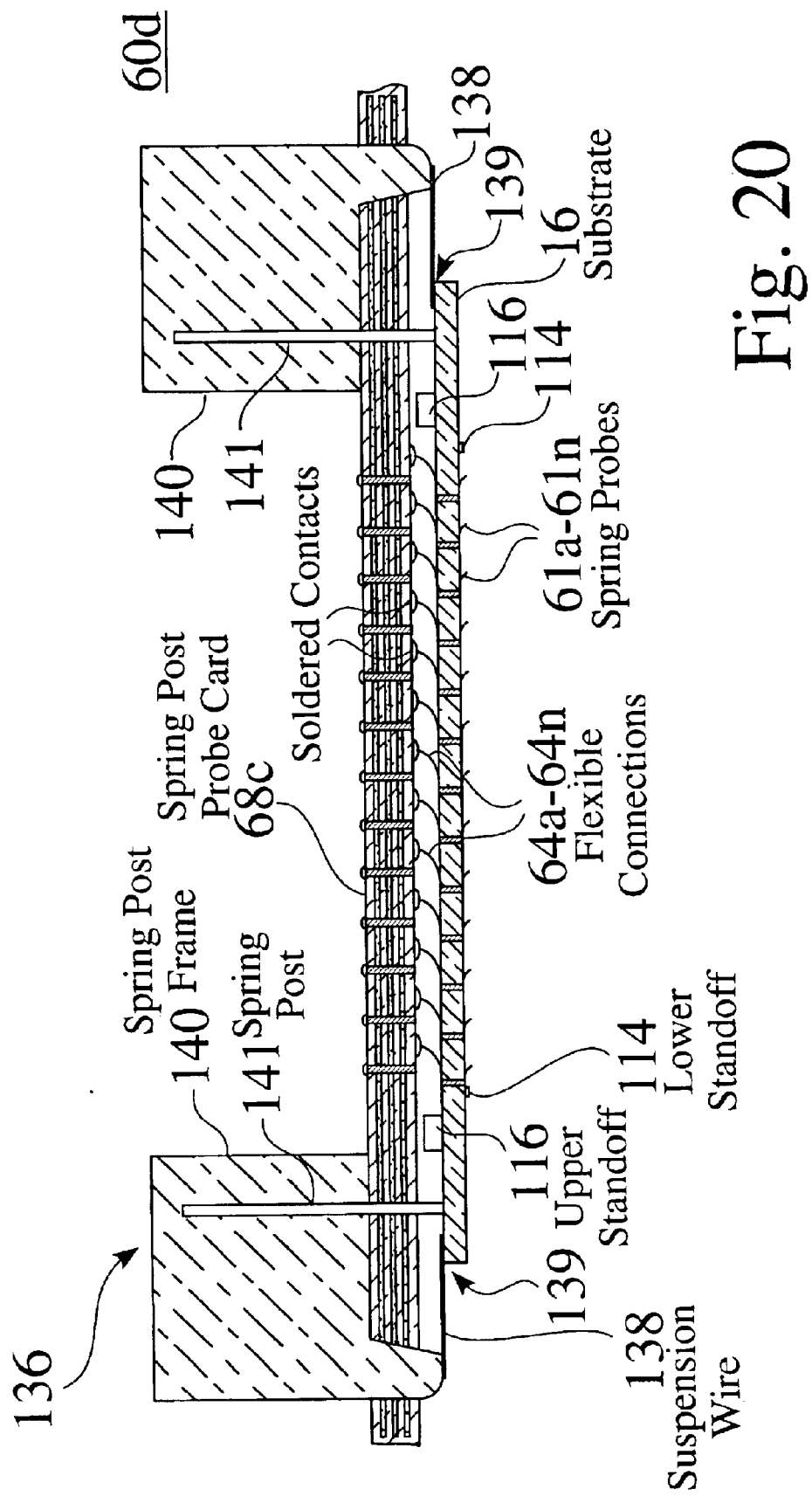
FIG. 20 is a cross-sectional view of a wire and spring post suspended probe card assembly.

FIG. 20 is a cross-sectional view 136 of a wire and spring post suspended probe card assembly 60d. A plurality of steel wires 138 (e.g. typically three or more) allow Z movement 84 of the substrate 16. The spring post frame 140, which is typically soldered or epoxied 139 to the printed wiring board probe card 68c, typically includes one or more spring posts 141, which are preferably used to provide downward Z force, as well as to limit travel.

Figure 21:
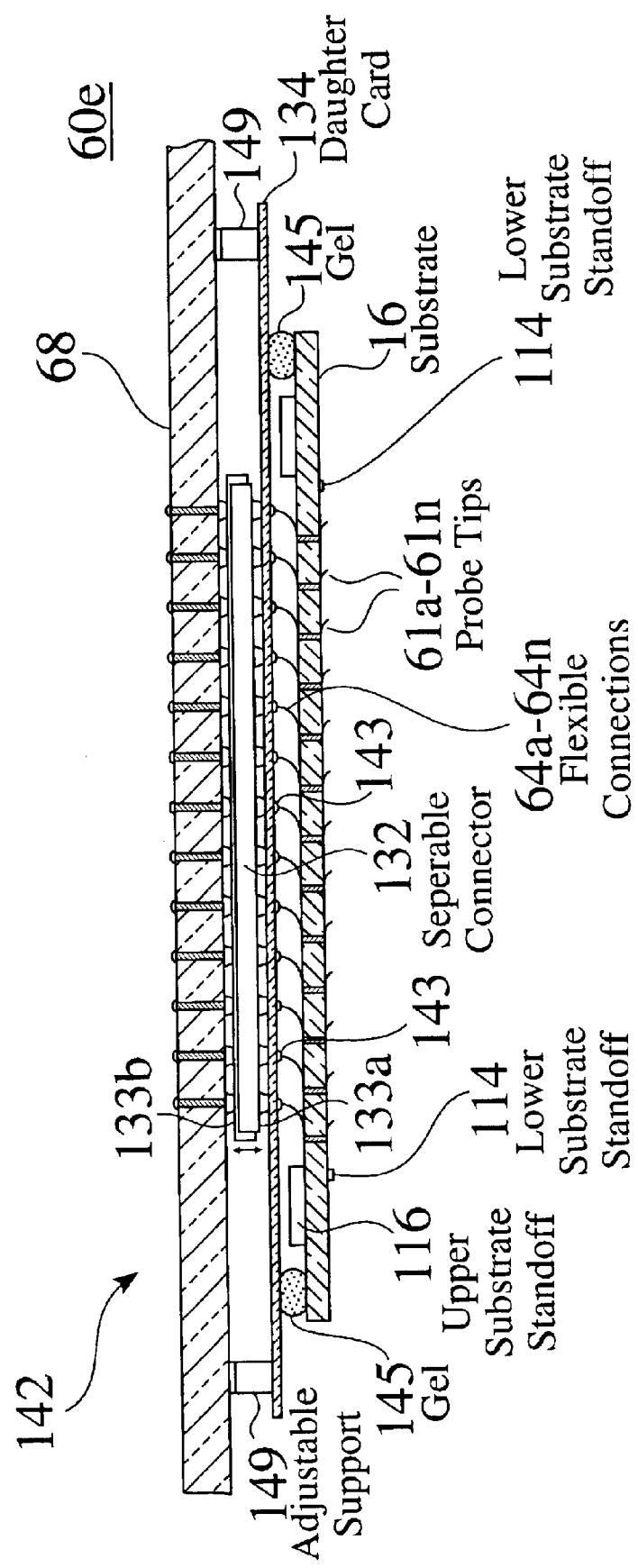
FIG. 21 is a cross-sectional view of a suspended probe card assembly having an intermediate daughter card detachably connected to the probe card substrate, and wherein the probe spring substrate is mechanically and electrically connected to the bridge structure by flexible interconnections.

FIG. 21 is a cross-sectional view 142 of a suspended probe card assembly 60e having an intermediate daughter card 134 detachably connected to the printed wiring board probe card 68 by a separable, i.e. demountable, connector 132, comprising separable connector halves 133a, 133b, and by supports 149. The flexible connections 64a 64n are preferably made with springs 14, 34, 50, and provide both electrical connections to the printed wiring board probe card 68, as well as a mechanical connection between the printed wiring board probe card 68 and the daughter card 134. In the probe card assembly 60e, the flexible connections 64a–64n are permanently connected to conductive pads 143a-143n on the daughter card 134, using either solder or conductive epoxy 127. The flexible connections 64a–64n are preferably designed to provide a total force larger than that required to compress all the bottom side probe springs 61a–61n fully, such as when compressed in a range of 2 to 10 mils. As well, the flexible connections 64a–64n are preferably arranged, such that the substrate 16 does not translate in the X direction 80, Y direction 82, or Z-Axis rotation (theta) 90 directions (FIG. 13) as the flexible connections 64a–64n are compressed.

Upper substrate standoffs 116 are preferably used, to limit the maximum Z travel of the substrate 16, relative to the daughter card 134, thereby providing protection for the flexible connections 64a–64n. The upper standoffs 116 are also preferably adjustable, such that there is a slight pre-load on the flexible connections 64a–64n, forcing the substrate 16 away from the daughter card 134, thereby reducing vibrations and chatter of the substrate 16 during operation. A damping material 145 (e.g. such as a gel) may also preferably be placed at one or more locations between the substrate 16 and the daughter card 134, to prevent vibration, oscillation or chatter of the substrate 16.

The separable connector 132 (e.g. such as an FCI connector 132) preferably has forgiving mating coplanarity requirements, thereby providing fine planarity compliance between the daughter card 134 and the printed wiring board probe card 68. Supports 149, e.g. such as but not limited to fasteners 166, spacers 164, nuts 168, shims 170 (FIG. 24), and/or an all glued connection, are also typically used between the daughter card 134 and the printed wiring board probe card 68. In some embodiments of the suspended probe card assembly 60e, the supports 149 are adjustable. This also facilitates planarity adjustment of probe chips.

Figure 22:
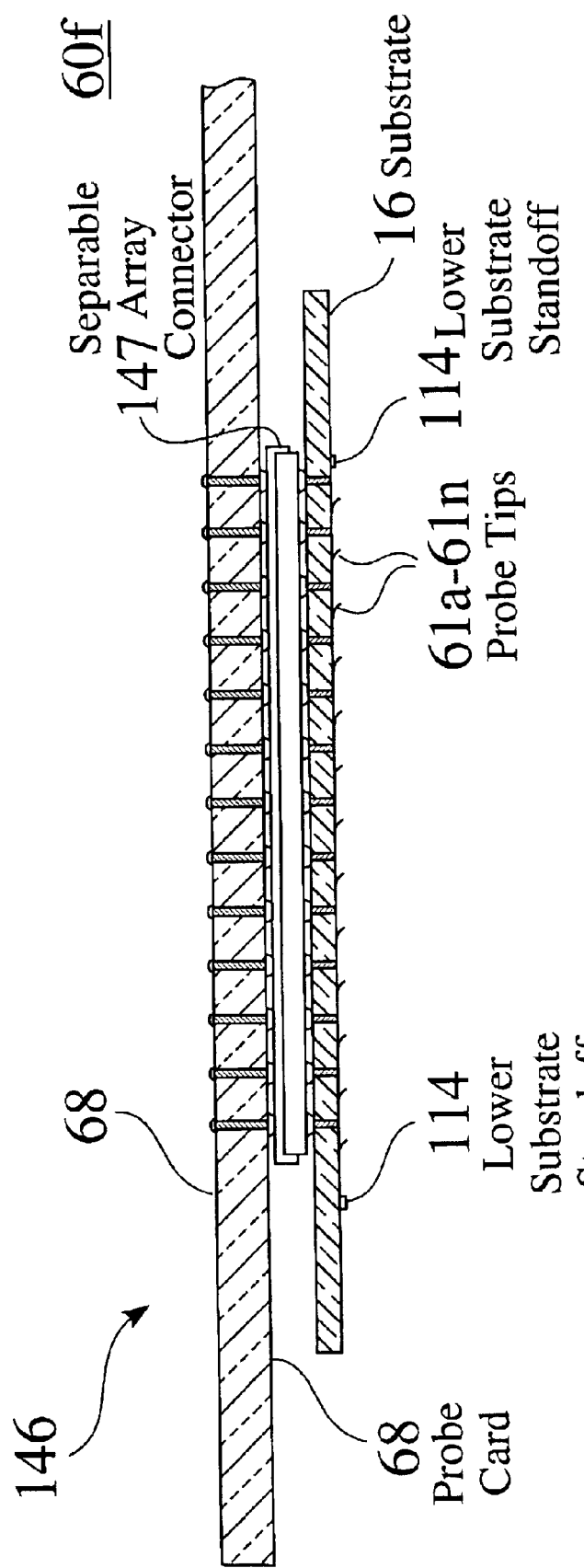
FIG. 22 is a cross-sectional view of a probe card assembly, wherein a nano-spring substrate is directly connected to a probe card substrate by an array connector.

FIG. 22 is a cross-sectional view 146 of a probe card assembly 60f, in which the probe spring substrate 16 is attached to a printed wiring board probe card 68 through a separable array connector 147. The probe card assembly 60f is suitable for small substrates 16, wherein a small non-planarity between the substrate 16 and a semiconductor wafer under test 92 can be absorbed by the spring probes 61a 61n alone.

Figure 23:
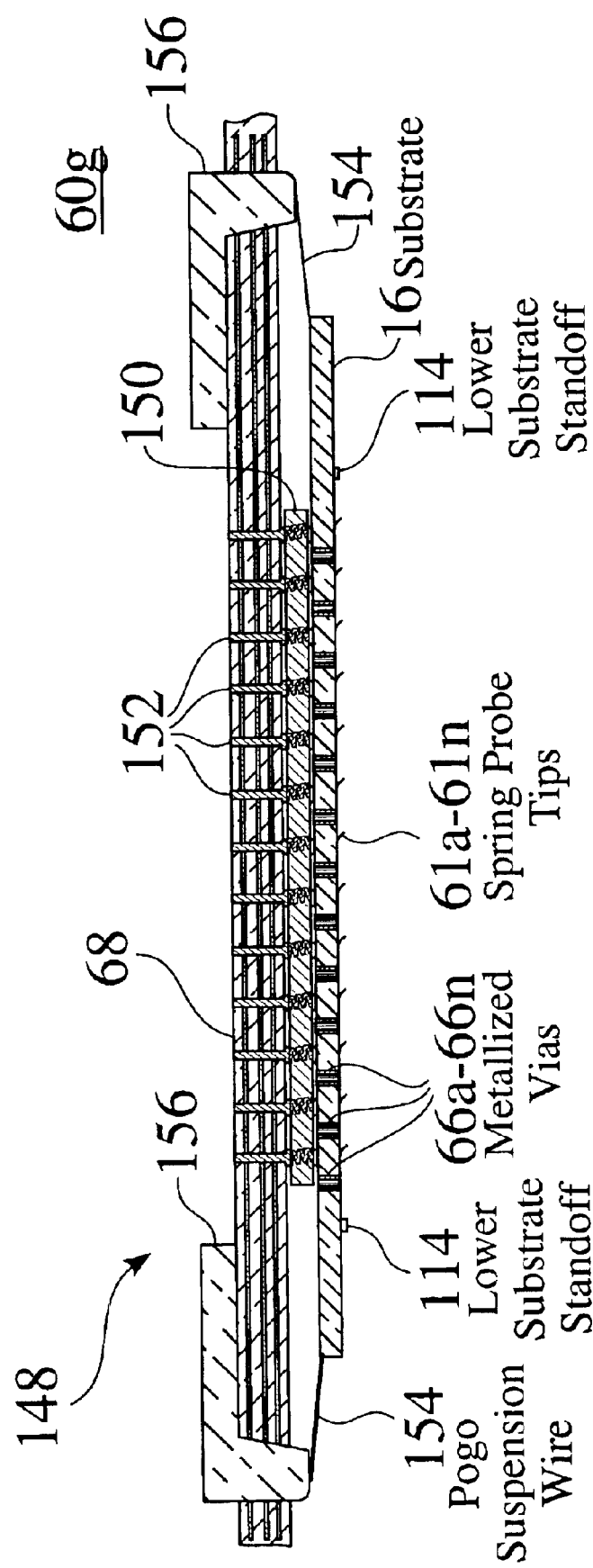
FIG. 23 is a cross-sectional view of a wire suspended probe card assembly, wherein a nano-spring substrate is connected to a probe card substrate by an LGA interposer connector.

FIG. 23 is a cross-sectional view 148 of a pogo wire suspended probe card assembly 60g, wherein a nano-spring substrate 16 is connected to a printed wiring board probe card substrate 68 by a large grid array (LGA) interposer connector 150, which is retainably fixed between the substrate 16 and the printed wiring board substrate 68. In one embodiment, the LGA interposer connector 150 is an AMPI-FLEX™ connector, manufactured by AMP, Inc., of Harrisburg Pa. In another embodiment, the interposer connector 150 is a GOREMATE™ connector, manufactured by W. L. Gore and Associates, Inc., of Eau Clare, Wis. In another alternate embodiment, a pogo pin interposer 150 is used to connect overlying pogo pins 152 on the printed wiring board probe card 68 to electrical connections 66a–66n on the substrate 16. The substrate 16 is held by a plurality of steel pogo suspension wires 154, which are preferably biased to provide a slight upward force, thereby retaining the interposer connector 150, while preventing vibration and chatter of the assembly 60g.

Figure 24:
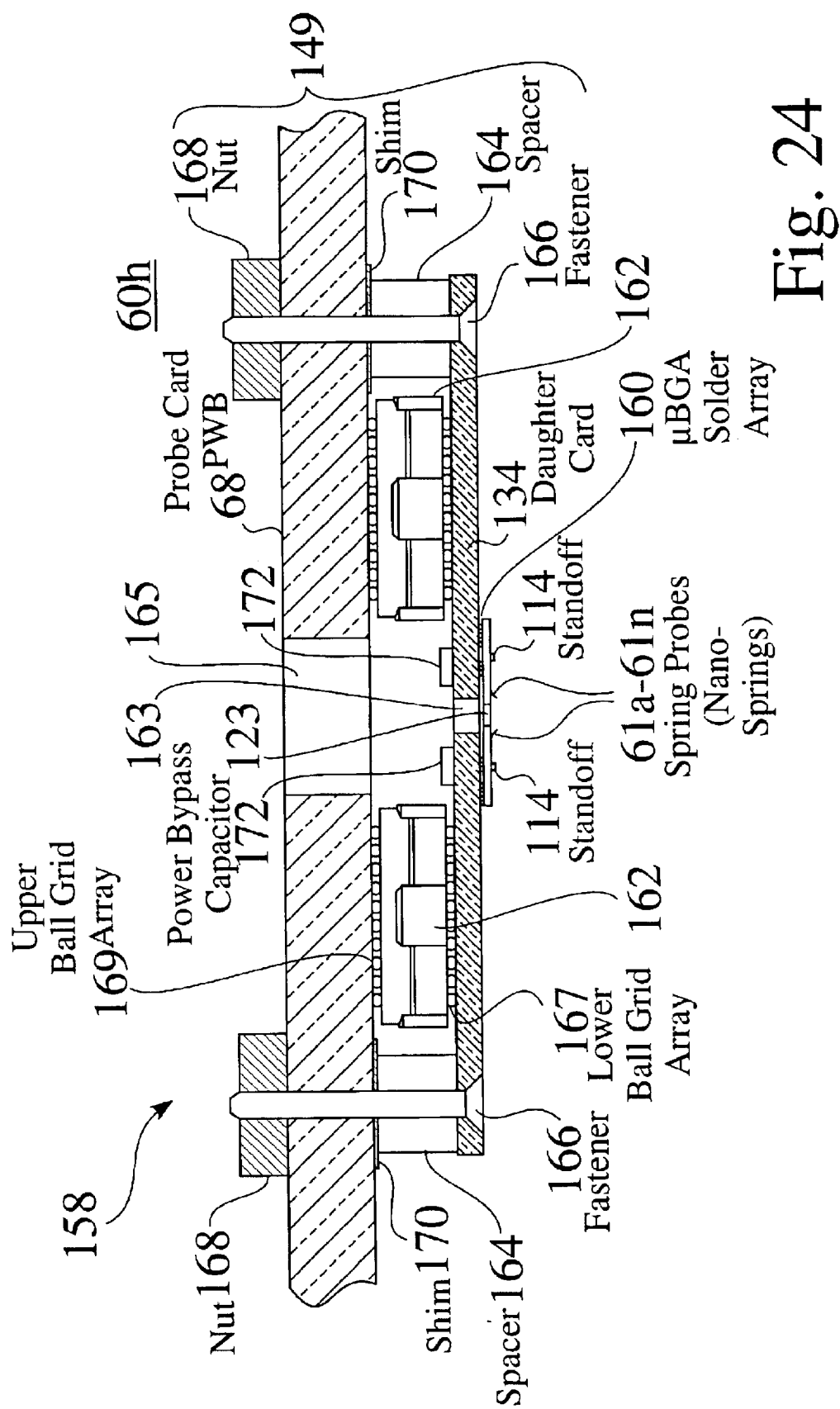
FIG. 24 is a cross-sectional view of a small test area probe card assembly, having one or more connectors between a probe card and a daughter card, in which the daughter card is attached to a small area probe spring substrate by a micro ball grid solder array.

Small Test Area Probe Assemblies. FIG. 24 is a cross-sectional view of a small test area probe card assembly 60h, having one or more area array connectors 162 located between the main printed wiring board probe card 68 and a daughter card 134, which is attached to a small area spring probe substrate 16.

While many of the probe card assemblies 60 described above provide large planarity compliance for a probe spring substrate 16, some probe card assemblies are used for applications in which the device under test comprises a relatively small surface area. For example, for wafers 92 which include a small number of integrated circuits 44 (e.g. such as two ICs), the size of a mating substrate 16 can also be relatively small (e.g. such as less than 2 cm square).

In such embodiments, therefore, the planarity of the substrate 16 to the wafer under test 92 may become less critical than for large surface areas, and the compliance provided by the probe springs 61a–61n alone is often sufficient to compensate for the testing environment. While the compliance provided by the probe springs 61a 61n may be relatively small, as compared to conventional needle springs, such applications are well suited for a probe card assembly 60 having photolithographically formed or MEMS formed spring probes 61a–61n.

The probe card assembly 60h is therefore inherently less complex, and typically more affordable, than multi-layer probe card assembly designs. The small size of the substrate 16 reduces the cost of the probe card assembly 60h, since the cost of a substrate 16 is strongly related to the surface area of the substrate 16.

The probe springs 61a–61n are fabricated on the lower surface 62a of a hard substrate 16, using either thin-film or MEMS processing methods, as described above. Signals from the probe springs 61a–61n are fanned out to an array of metal pads 182, 184, 186 (FIG. 26), located on the upper surface 62b of the substrate 16, using metal traces on one or both surfaces 62a, 62b, and conductive vias 66a–66n through the substrate 16. The top side pads are connected to a daughter card 134, using common micro-ball grid solder array pads, typically at an array pitch such as 0.5 mm. The daughter card 134 further expands the pitch of the array, to pads having an approximate pitch of 0.050 inch on the opposing surface of the daughter card 134. An area array connector 162, such as a MEG-Array™ connector, from FCI Electronics Inc. of Etters Pa., is used to connect the 0.050 inch pitch pad array to the printed wiring board probe card 68. Power bypass capacitors 172, such as LICA™ capacitors from AVX Corporation of Myrtle Beach S.C., are preferably added to the daughter card 134, close to the substrate micro-BGA pads 182, 184, 186, to provide low impedance power filtering.

The small test area probe card assembly 60h preferably includes a means for providing a mechanical connection between the printed wiring board probe card substrate 68 and the daughter card 134. In the probe card assembly 60h embodiment shown in FIG. 24, one or more spacers 164 and spacing shims 170 provide a controlled separation distance and alignment between the daughter card 134 and the printed wiring board probe card substrate 68, while one or more fasteners 166 and nuts provide a means for mechanical attachment. While a combination of spacers 164, shims 170, fasteners 166, and nuts 168 are shown in FIG. 24, alternate embodiments of the small test area probe card assembly 60h may use any combination of means for attachment between the daughter card 134 and the printed wiring board probe card substrate 68, such as but not limited to spring loaded fasteners, adhesive standoffs, or other combinations of attachment hardware.

Lower substrate standoffs 114, which are typically taller than other features on the substrate 16 (except for the spring tips 61a–61n), are preferably placed on the lower surface 62a of the substrate 16, preferably to coincide with the saw streets 94 on a semiconductor wafer 92 under test, thereby preventing the wafer under test 92 from crashing into the substrate 16, and preventing damage to active regions on the semiconductor wafer 92.

As shown in FIG. 24, the substrate 16 preferably includes an access window 123 (FIG. 17), while the daughter card 134 also preferably includes a daughter card access hole 163, and the printed wiring board probe card 68 preferably includes and a probe card access hole 165, such that access to a semiconductor wafer 92 is provided while the probe card assembly 60h is positioned over the wafer 92 (e.g. such as for visual alignment or for electron beam probing). Access holes 123, 163, 165 may preferably be used in any of the probe card assemblies 60.

Figure 25:
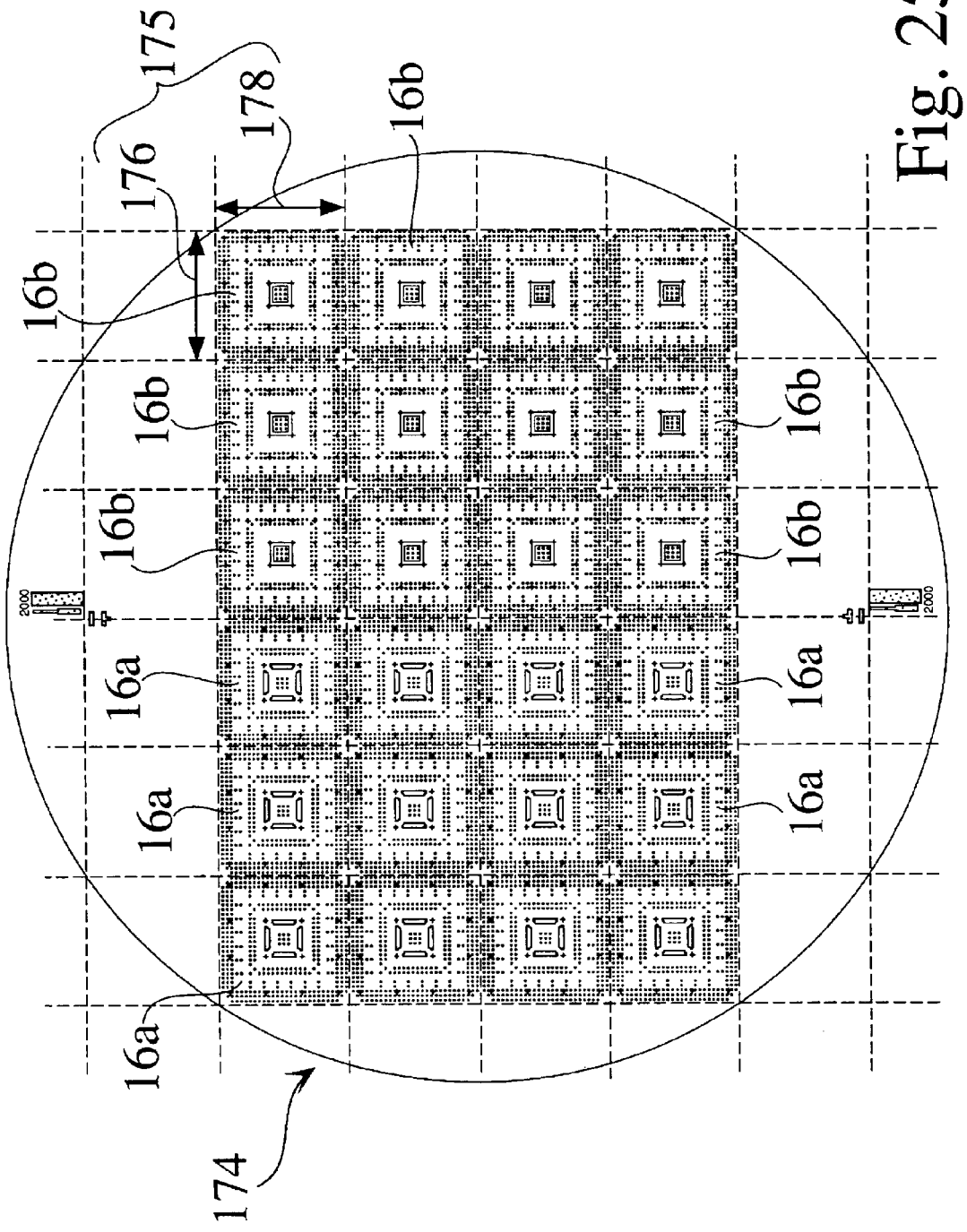
FIG. 25 is a top view of a substrate wafer, upon which a plurality of micro ball grid array probe spring contactor chip substrates are laid out.

FIG. 25 is a top view of a substrate wafer 174, upon which a plurality of micro ball grid array spring probe contactor chip substrates 16 are laid out. For spring probe substrates 16 having a small surface area 175, several spring probe contactor chip substrates 16 may typically be fabricated from a single wafer 174. For example, as shown in FIG. 25, as many as twenty four sites having a width 176 and a length 178 (e.g. 14 mm square), may be established on a standard four inch round starting wafer 174. As well, different substrates (e.g. 16a, 16b) may be fabricated across a starting wafer 174, whereby the cost of production (which may be significant) for different spring probe substrates 16 may be shared, such as for masking costs and processing costs. Therefore, the cost of development for different substrates 16a, 16b may be lowered significantly (e.g. such as by a factor of up to 10 or more).

Figure 26:
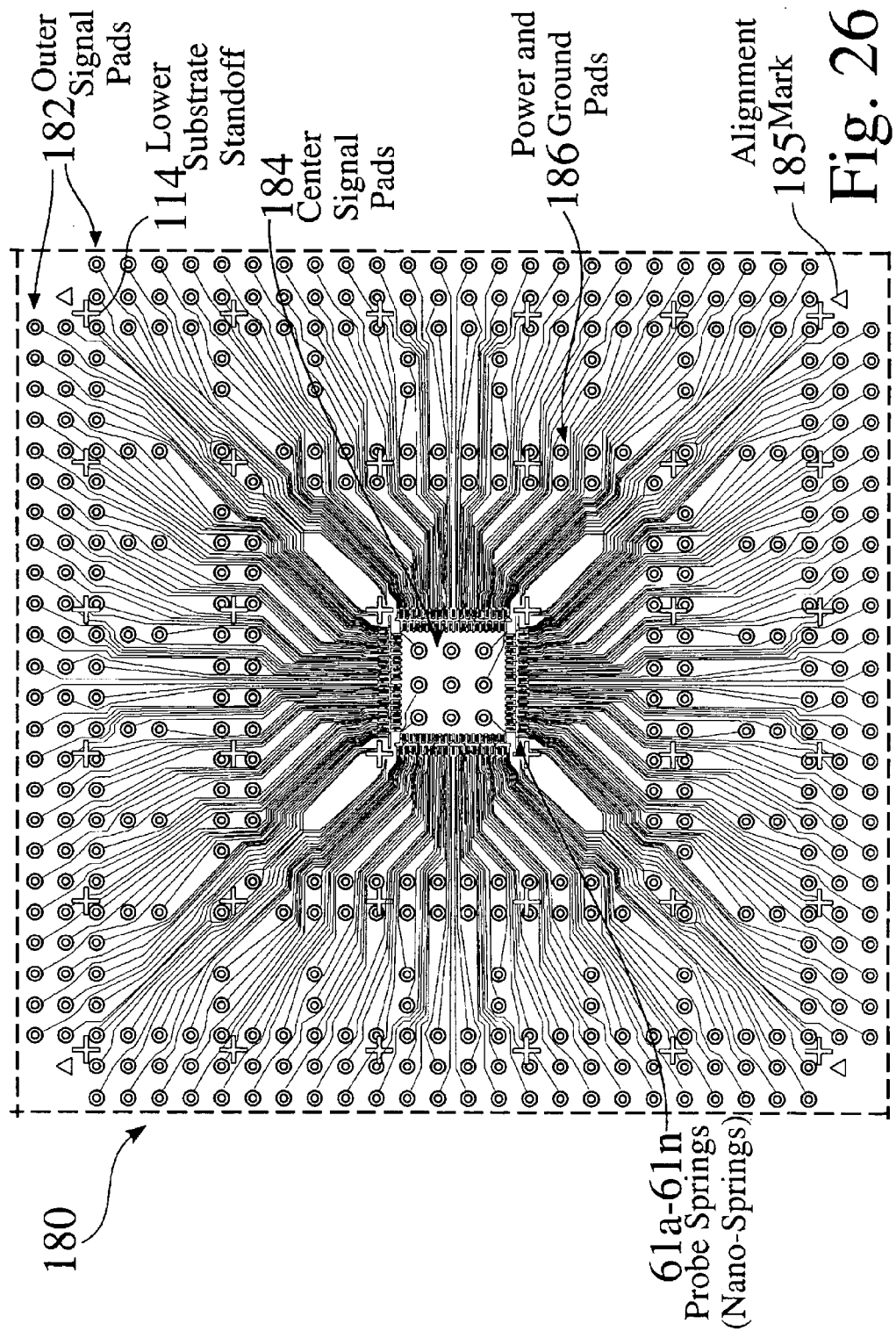
FIG. 26 is a top view of a single pitch micro ball grid array nano-spring contactor chip.

FIG. 26 is a top view of a single 0.5 millimeter pitch micro ball grid array 180 for a 14 mm square spring probe contactor chip (NSCC) 16b. The micro BGA pads 182, 184, 186 are preferably on a standard pitch (e.g. 0.5 mm). The outer five rows of pads 182 and the center pads 184 provide 341 signal connections, and the inside two rows 186 provide ninety six dedicated power and ground connections. By customizing the routing traces to the spring probes 61a–61n, specific power/ground spring positions to match the integrated circuit 44 under test can be accommodated with a single layer of routing.

Standoffs 114, are preferably placed in locations matching inactive regions on the wafer 92, such as on the scribe lane 94, to prevent damage to active devices 44 on the device under test 44. One or more alignment marks 185 are also preferably located on the substrate wafer 174. The production cost and turnaround time for a probe card assembly 60 can be significantly improved, by standardizing the footprints of the micro BGA pad array 180, the daughter card 134, and the printed wiring board probe card 68. Standardization of the micro-BGA pad array 180, as well power/ground pad assignments for the pads located on the substrates 16, 134, 68, allows a standardized pattern of vias 66a–66n in the base substrate 174.

Standardization of other componentry for probe card assemblies 60 often allows printed wiring board probe cards 68 (and in some embodiments daughter cards 134), to be used for different substrates 16 and integrated circuit devices 44, wherein only the routing of the substrate 16 is customized.

The use of a starting substrate 174 (FIG. 25) having a standardized pattern of vias 66a–66n also allows starting substrates 174 to be ordered, stored and used in quantity, thus reducing the cost of starting substrates 174, and often reducing the lead-time to obtain the starting substrates 174.

Alternate Applications for Probe Springs. Photolithographic or MEMS spring probes 61, 14, 34, 50 may alternately be used for bare die burn-in sockets, such as for DieMate™ burn-in sockets, manufactured by Texas Instruments Inc., of Mansfield Mass., or for Die™Pak burn-in sockets, available through Aehr Test, Inc. of Fremont Calif. For bare die burn-in sockets which contact the substrate 16 around the edges, the probe springs 61 springs and fanout metalization are needed only on one surface (e.g. probe surface 62a) of the substrate 16. The required fanout is used to determine the size of the substrate 16, based on the number of the I/O signals needed to be routed to pads on the edge of the substrate 16. Alternately, vias 66 in the substrate 16, as described above, can be used to route the I/O signals to an array of pads on the opposite surface 62b of the substrate 16, allowing the substrate to be smaller, and thereby reducing the cost of fabrication.

Figure 27:
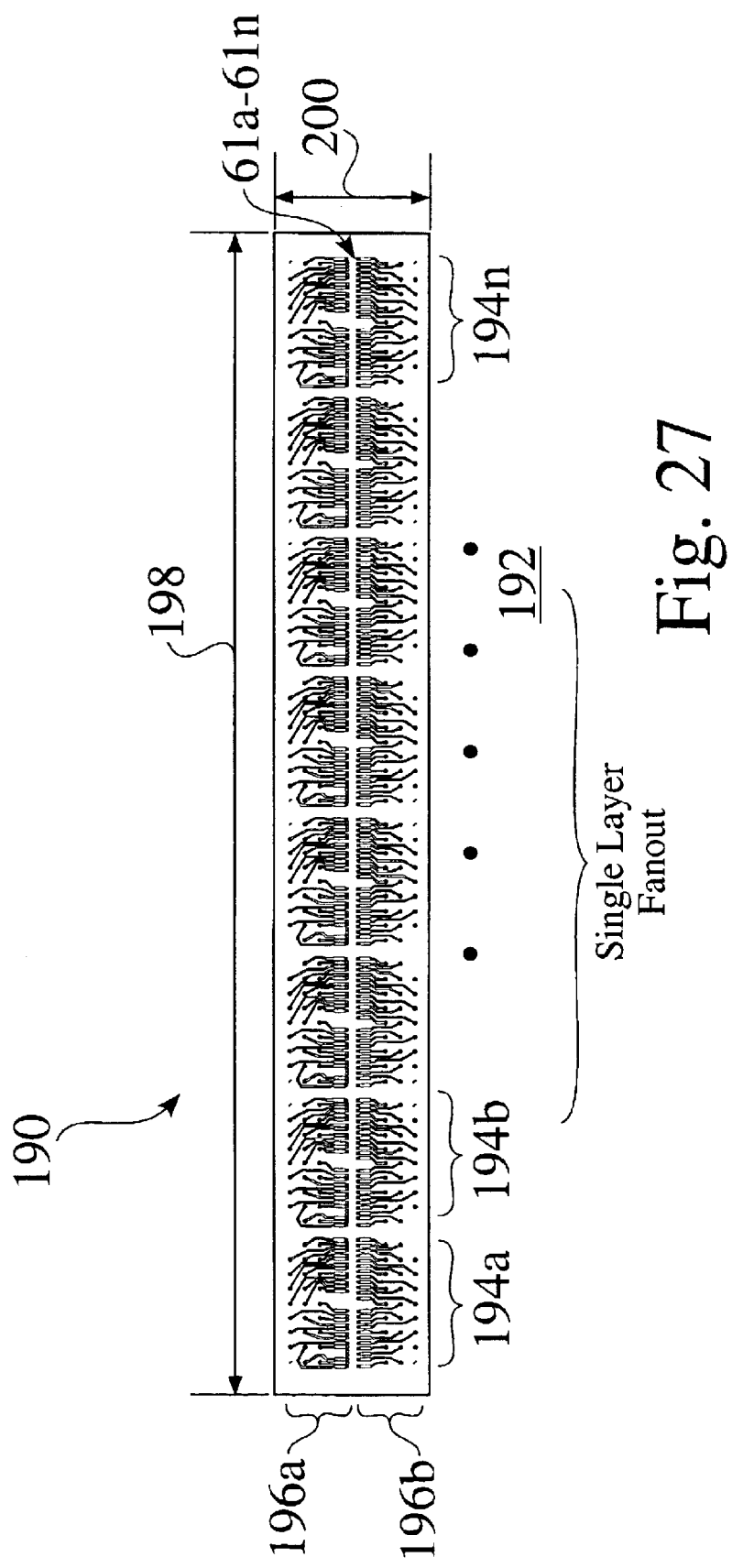
FIG. 27 is a plan view of a tiled probe strip having a plurality of probe strip contact areas.

Tiled Probe Assemblies. FIG. 27 is a plan view 190 of a typical tiling probe strip 192, having a probe strip length 198 and a probe strip width 200. The tiling probe strip 192 has a plurality of probe strip contact areas 194a–194n, each having a plurality of spring probes 61a–61n. As well, in the embodiment shown, the spring probes 61a–61n are laid out in longitudinally aligned probe regions 196a, 196b. Use of one or more tiling probe strips 192 in a probe card assembly allows simultaneous electrical contact with a plurality of integrated circuit devices 44, such as for testing adjoining integrated circuit device sites 44 on a semiconductor wafer 92. The plurality of probe strip contact areas 194a–194n are preferably located symmetrically along the length of the tiling probe strip 192, such that they align with a symmetrical plurality of integrated circuit devices 44 on a wafer 92. It is to be appreciated that use of tiling probe strips, comprising the photolithographically batch fabricated stress metal spring probes on the tiling probe strip substrates, are applicable for the testing of various IC-s, such as memory, logic, and microprocessors.

As well, the tiling probe strips 192, having spring probes 61a–61n, typically include electrical vias 66a–66n and an array of electrical connections 64a–64n, such as seen in the probe chip substrate 16 of FIG. 13, FIG. 14, and/or FIG. 21. While the spring probes 61a–61n may typically be laid out to match specific devices 44 under test, the tiling probe strips 192 include standard electrical vias 66a–66n and/or arrays of electrical connections 64a–64n. For example, in the probe card assembly 202 shown in FIG. 28 and FIG. 29, each of the tiling probe strips 192 includes a standard ball grid array 160 of solder connections. Therefore, while preferred embodiments of tiling probe strips 192 may include spring probes 61a–61n which are laid out to match specific devices 44 under test, the tiling probe strips 192 may be attached to standardized daughter cards 204 and/or standardized intermediate connectors (e.g. such as a separable connector 132), thus minimizing engineering development costs to produce a tiled probe assembly 202.

Figure 28:
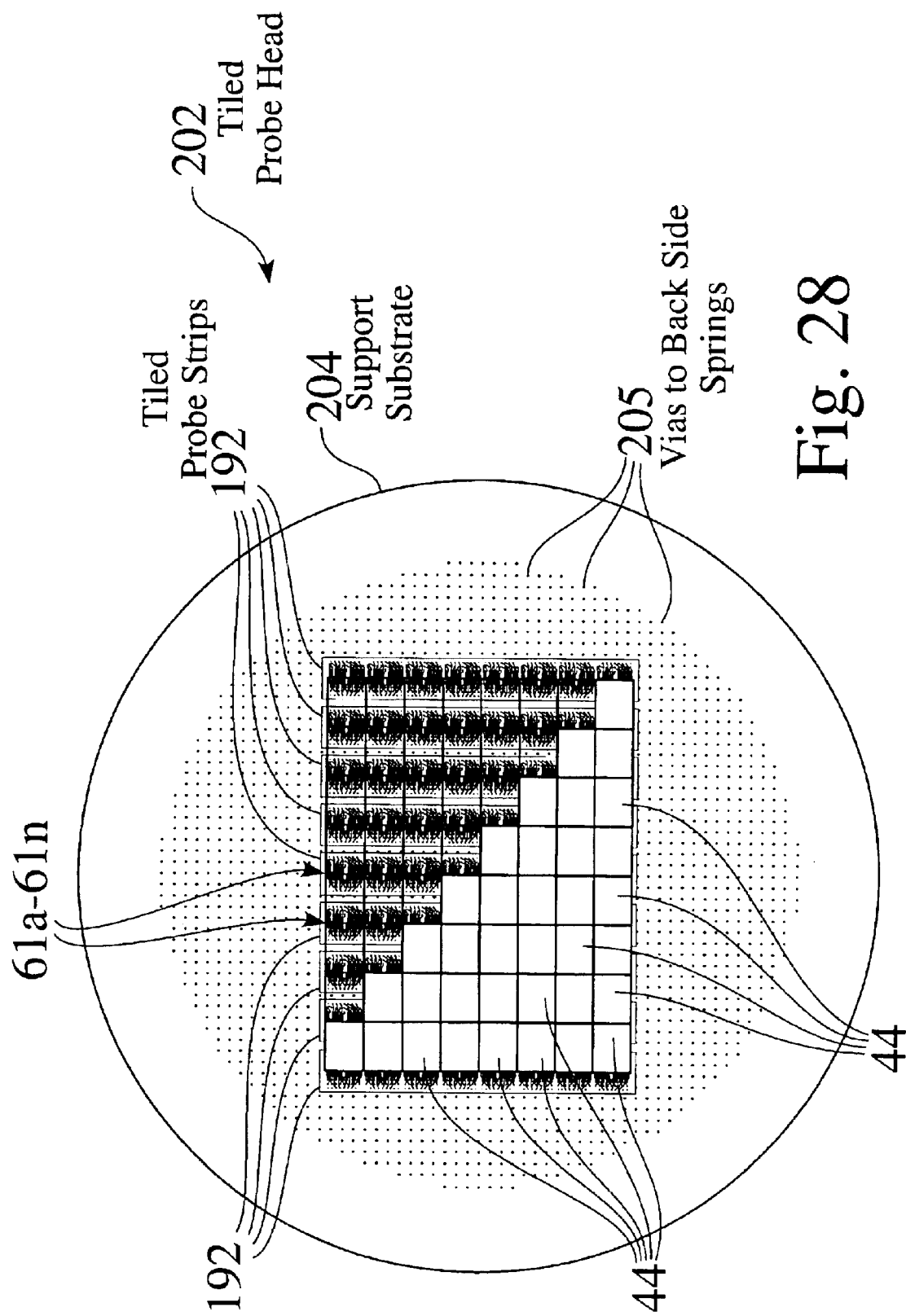
FIG. 28 is a bottom view of a plurality of tiled probe strips attached to a probe card support substrate.
Figure 29:
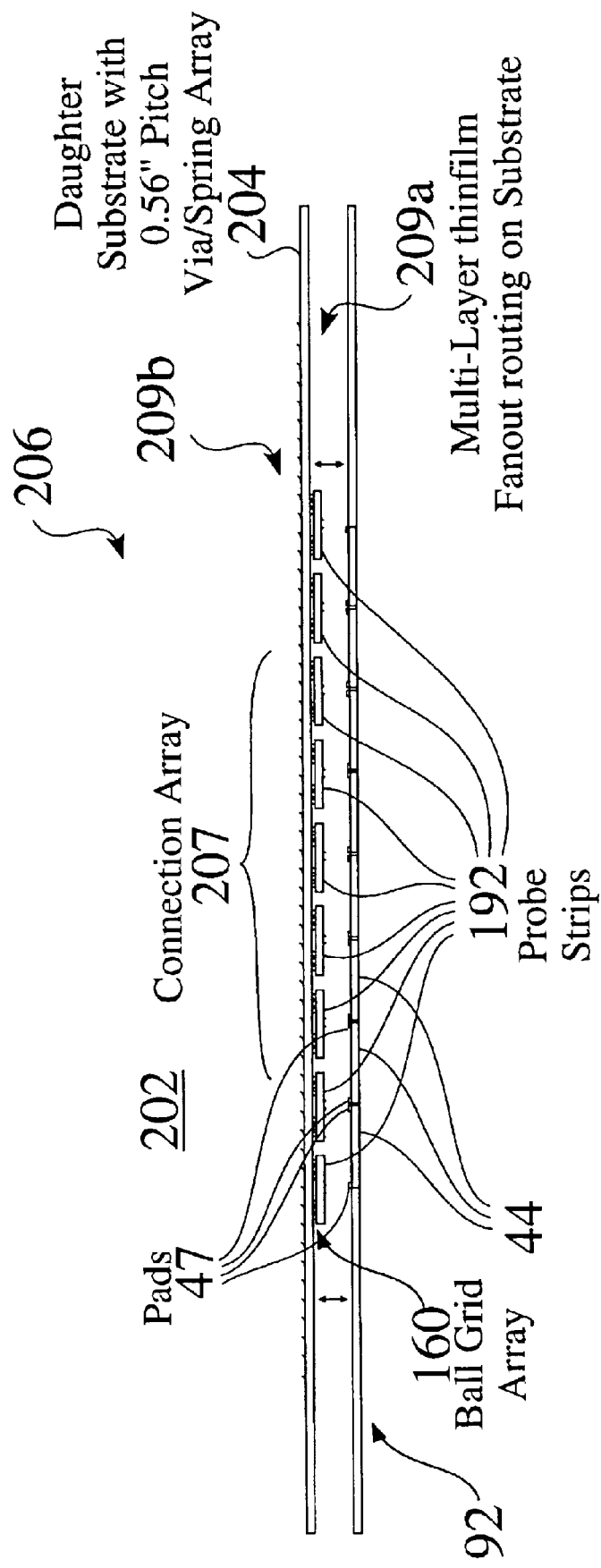
FIG. 29 is a side view of a plurality of tiled probe strips attached to a probe card support substrate.

FIG. 28 is a partial bottom view of tiled probe head 202 comprising a plurality of tiling probe strips 192 attached to a support substrate 204, which includes an array 207 (FIG. 29) of electrically conductive vias 205. FIG. 29 is a side view of a plurality of tiling probe strips 192 attached to a probe card 16 or daughter card 204, which are used to contact a plurality of integrated circuit devices 44 located on a semiconductor wafer 92. The tiled probe head 202 is typically used to contact a plurality of integrated circuit devices 44 located on a semiconductor wafer 92. The tiling probe strips 192 are preferably located symmetrically across the substrate 204, such that they align with a symmetrical plurality of integrated circuit devices 44 on a wafer 92.

The support substrate 204 preferably has a low thermal coefficient of expansion (TCE), and is preferably matched to silicon. As well, the substrate 204 typically fans out a large number of signal traces 46 (FIG. 7), to connectors on the opposite surface 209b of the substrate 204. In one embodiment, the substrate 204 is a silicon wafer, which includes vias 205, e.g. such as arranged on a 0.056 inch pitch, and thin film routing 46 on one or both substrate surfaces 209a, 209b.

In the tiled probe head 202 shown in FIG. 28 and FIG. 29, the tiling probe strips 192 include groups of probe springs 61 which are used to contact rows of pads 47 (FIG. 7) on integrated circuit devices 44 having pads 47 located on opposing sides of a device under test 44 (e.g. such as on the right and left sides of an integrated circuit device site 44). In the tiled probe head 202 shown, the tiling probe strips 192 are arranged such that one of the tiling probe strips 192 typically contacts the right side of one circuit device site 44 (e.g. such as using probe contact region 196a in FIG. 27), in addition to contacting the left side of a neighboring circuit device site 44 (e.g. such as using probe contact region 196b in FIG. 27). The embodiment shown in FIG. 28 therefore provides simultaneous contact between the plurality of tiling probe strips 192 and a plurality of integrated circuit devices 44, while allowing adequate tolerances between adjoining tiling probe strips 192, wherein the side edges of the tiling probe strips 192 may preferably be placed over the saw streets of the integrated circuit device sites 44. For example, saw streets 94 (FIG. 13) between adjoining devices 44 on a wafer 92 may commonly be on the order of 4 to 8 mils wide, thereby providing a similar gap between tiled probe strips 192 in the tiled probe card assembly 202.

In alternate embodiments of the tiled probe head assembly 202, all pads 47 (FIG. 9) for an integrated circuit device site 44 may be contacted by probes from a single probe strip 192.

Figure 30:
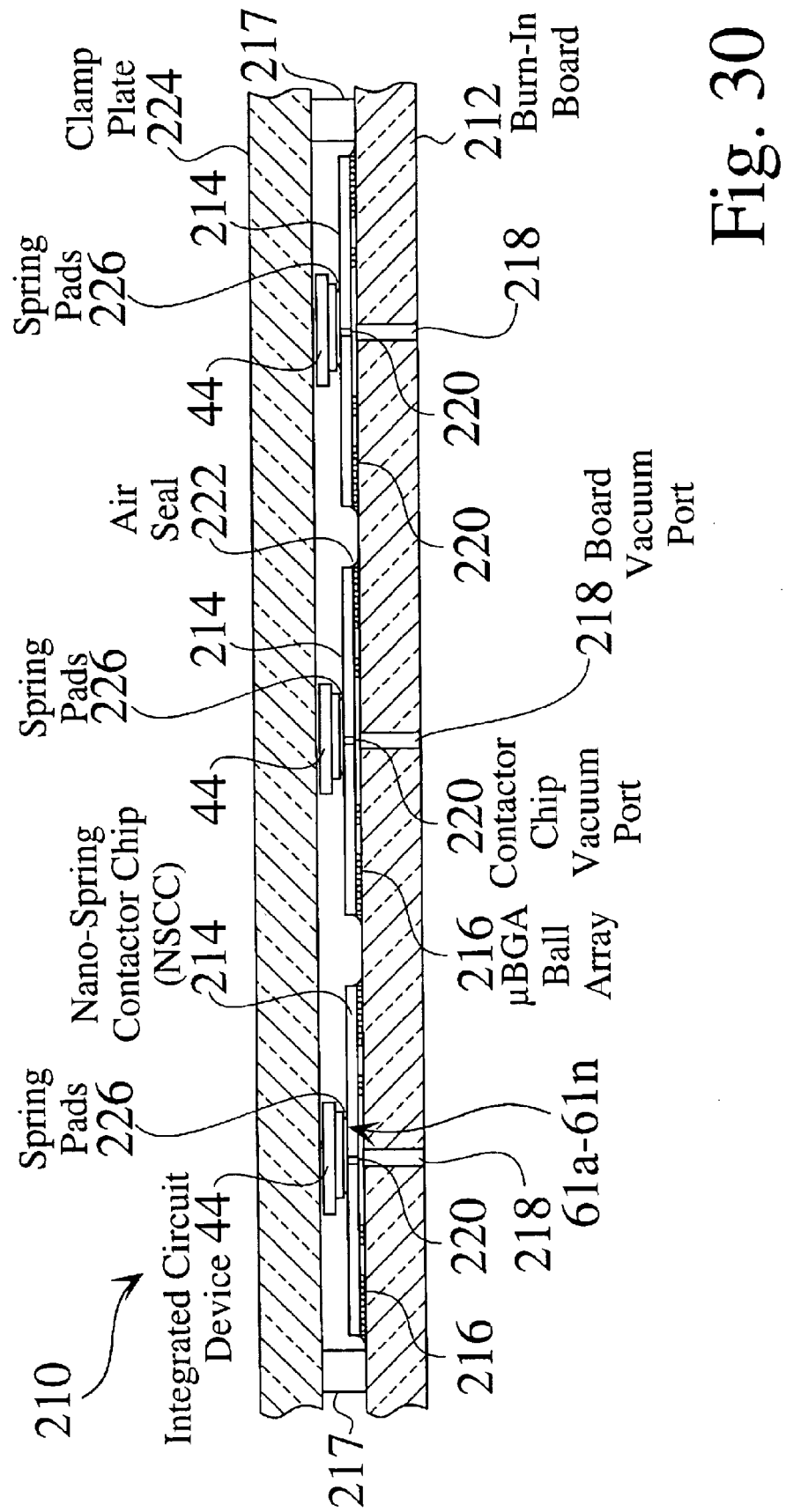
FIG. 30 is a cross-sectional view of a structure which allows a plurality of integrated circuits to be temporarily connected to a burn-in board, through a plurality of probe spring contacts.

Burn-In Structures. FIG. 30 is a partial cross-sectional view of a burn-in structure 210 which allows a plurality of integrated circuit devices 44 to be temporarily connected to a burn-in board 212. An array of probe spring (i.e. nano-spring) contactor chips (NSCC) 214 are mounted onto a burn-in board 212, such as by micro ball grid arrays 216, which provide electrical connections between the plurality of integrated circuit devices 44 and external burn-in circuitry (not shown). Board vacuum ports 218 are preferably defined in the burn-in board 212, while contactor chip vacuum ports 220 are preferably defined in the NSCC substrate 214, wherein the board vacuum ports 218 are generally aligned to the contactor chip vacuum ports 220 (e.g. such that an applied vacuum through the board vacuum ports 218 is also applied to the generally aligned contactor chip vacuum ports 220). An air seal 222 (e.g. such as an epoxy), is preferably dispensed around the periphery of each nano-spring contactor chip 214, to prevent the loss of applied vacuum through the micro BGA ball array 216.

As integrated circuit devices 44 are initially placed on nano-spring contactor chips 214 (e.g. such as by a "pick and place" machine), an applied vacuum to the board vacuum ports 218 on the burn-in board 212 and generally aligned contactor chip vacuum ports 220 on the nano-spring contactor chips 214 prevents the placed integrated circuit devices 44 from shifting from their placed positions.

When all of the integrated circuit devices 44 are placed onto the corresponding contactor chips 214, a clamp plate 224 is preferably placed in contact with the integrated circuit devices 44, to retain the integrated circuit devices 44 in place during burn-in operation, and to allow the probe springs 61a–61n to provide electrical connections to the integrated circuit devices 44. Individual spring pads 226 may also be used, to push on the integrated circuit devices 44 under test, to allow for planarity tolerances of the clamp plate 224 and the burn-in board 212. The burn-in structure 210 preferably includes means 217 for retaining the clamp plate 224, such that once the clamp plate 224 is placed in contact with the integrated circuit devices 44, the clamp plate 224 is attached to the burn-in board 212, and the applied vacuum may be switched off.

Protective Coating Processes for Improved Spring Probes. As described above, since spring probes 61 provide advantages of high pitch, high pin count, and flexibility, they may be used for a wide variety of applications. However, when these typically small spring probes 61 are used to contact traces 46 on integrated circuit devices 44, such as on semiconductive wafers 92, wherein the traces 46 often contain an oxide layer, the spring probes 61 are often required to break through oxide layers and establish adequate electrical contact with metal traces or conductive pads. As the spring probes 61 are often used many times, the small, unprotected spring probe tips 24 may become worn. Therefore, it would be advantageous to provide an electrically conductive wear coating on the contact tips 24 of the probe springs 61. However, such a protective coating is required to cover both the entire surface of the spring tip 24.

As described above, the probe springs 61 may be formed by a plasma chemical vapor deposition and photolithographic processes, such as disclosed in U.S. Pat. Nos. 5,848,685 and 5,613,861, wherein successive layers of conductive material are applied to a substrate, and wherein non-planar springs are subsequently formed. In such processes, however, a protective coating applied during the deposition process would not inherently provide a continuous coating on all surfaces of the formed non-planar probe springs. In alternate embodiments, the probe springs 61 may be formed by plating processes.

Figure 31:
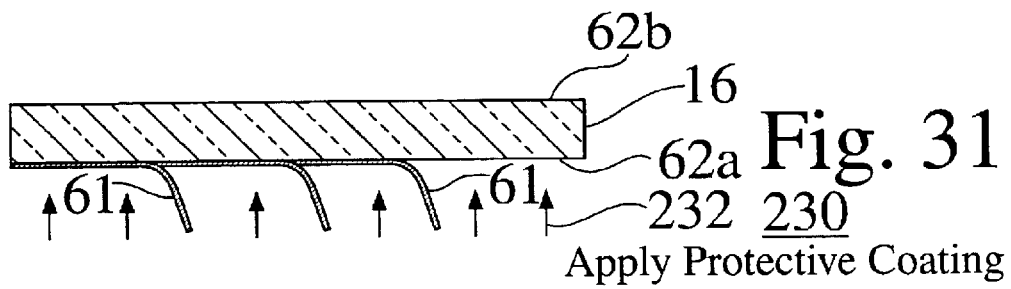
FIG. 31 is a view of a first step of a spring probe assembly coating process, in which a protective coating is applied to a probe surface of a spring probe assembly.

The probe springs 61, after their release, are not planar to the substrate surface. Therefore, a protective coating may be applied after the springs 61 have been released from the release layer 18. FIG. 31 is a view of a first step 230 of a spring probe assembly coating process, in which a protective coating 232 is applied to a probe surface of a spring probe assembly substrate 16, having one or more non planar probe springs 61. The spring probe assembly coating process forms a protective layer on the non-planar probe springs 61. While the coating process may be used for a wide variety of non-planar structures, it is specifically useful for the processing of thin film and MEMS probe spring contacts 61. In FIG. 31, the applied electrically conductive protective coating is preferably a hard electrically conductive material, such as titanium nitride, rhodium, tungsten, or nickel. The applied electrically conductive protective coating is also preferably an inert material, thereby providing lubricative characteristics (i.e. a low coefficient of friction) for the probe tips 24 on the spring probes 61, thus minimizing wear to both devices under test and to the spring probes 61.

When the protective coating 233 is applied 232 to the substrate 16 and probes 61, the protective coating 233 covers both the planar and non-planar regions on the exposed surface 62 of the substrate 16. While the spring probes 16 are covered with the protective coating 233 during the coating step 230, all the traces on the substrate structure are electrically shorted together, from the applied conductive coating 233. The conductive coating 233 is therefore required to be patterned, or partially removed, to restore electrical isolation between different probe springs 61 and their respective traces. While conventional photo-masking processes are typically used in the majority of integrated circuit processing, to selectively etch away conductive coatings, such as titanium nitride coatings, such photo-masking processes are used for planar structures.

Figure 32:
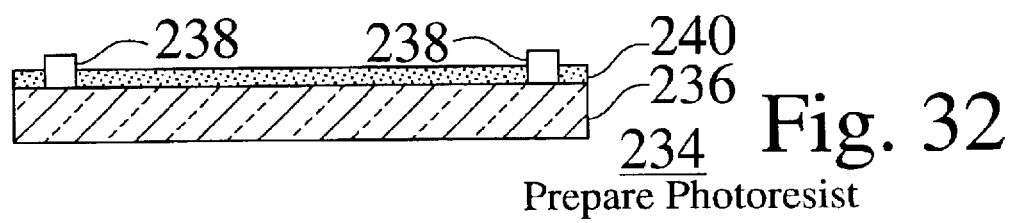
FIG. 32 is a view of a second step of a spring probe assembly coating process, in which a layer of photoresistive material is applied to a second substrate.
Figure 33:
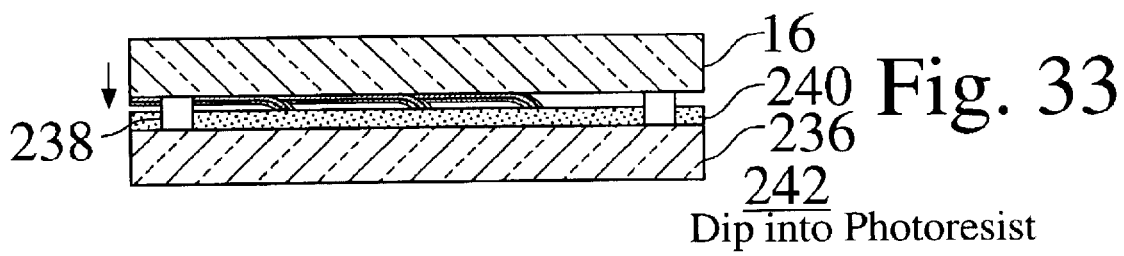
FIG. 33 is a view of a third step of a spring probe assembly coating process, in which a coated spring probe assembly is partially dipped into photoresistive material on a second substrate.

FIG. 32 is a view of a second step 234 of a spring probe assembly coating process, in which a layer of photoresistive material 240 (e.g. approximately 10 microns deep) is applied to a second substrate 236, which preferably has dipping standoffs 238 (e.g. approximately 30 microns high). The photoresistive material 240 is used to protect the applied protective layer 233 on non-planar portions of the probe springs. FIG. 33 is a view of a third step of a spring probe assembly coating process, in which a coated spring probe assembly is partially and controllably dipped 242 into photoresistive material 240 on the second substrate 236. The depth of applied photoresistive material 240 eventually controls the remaining protective coating 233. The substrate 16 is lowered to a desired depth in the photoresistive material 240, which is typically controlled the applied depth of the photoresistive material 240 on the second substrate 236, and the height of the dipping standoffs 20. The applied depth may alternately controlled by an operator, such as by controlled axial movement of a processing apparatus, to control the movement of the substrate 16 into the photoresistive material 240.

Figure 34:
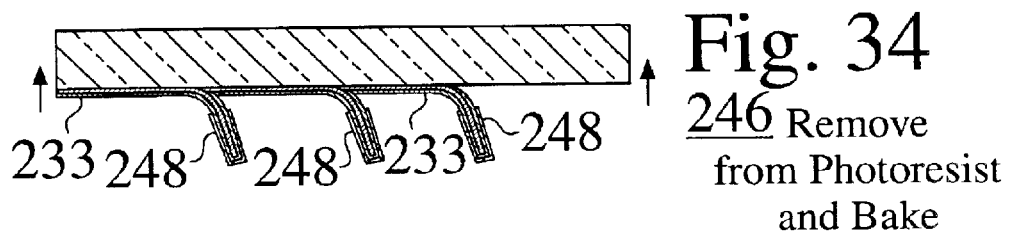
FIG. 34 is a view of a fourth step of a spring probe assembly coating process, in which a coated and partially dipped spring probe assembly is removed from the second substrate.
Figure 35:
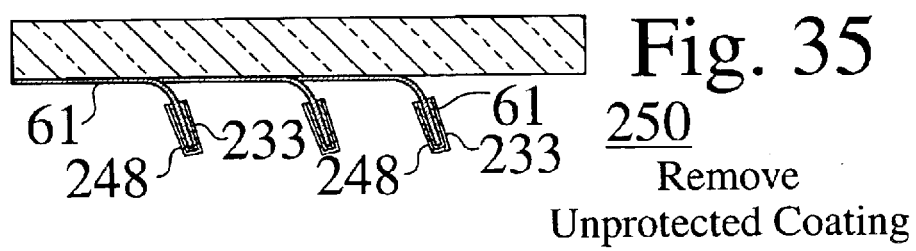
FIG. 35 is a view of a fifth step of a spring probe assembly coating process, in which the coated and dipped spring probe assembly is etched, thereby removing the protective coating from portions of the substrate not dipped in the photo-resist.
Figure 36:
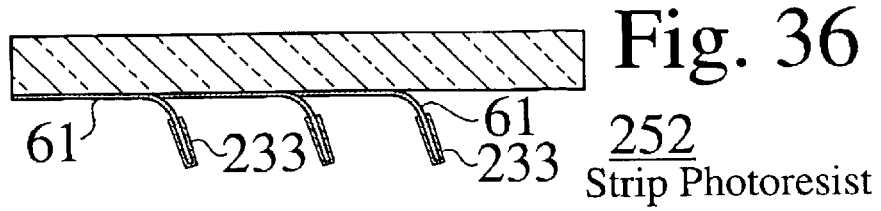
FIG. 36 is a view of a sixth step of a spring probe assembly coating process, in which photo-resist is stripped from the spring tips on the spring probe assembly, exposing the protective coating.

FIG. 34 is a view of a fourth step of a spring probe assembly coating process, in which a coated and partially dipped spring probe assembly is removed 246 from the photoresistive material 240 on second substrate 16 and soft baked, leaving a portion of the protectively 233 coated probe springs 61 covered in a baked photo resist layer 248. FIG. 35 is a view of a fifth step of a spring probe assembly coating process, in which the coated and dipped spring probe assembly 16, 61 is etched 250, thereby removing the protective coating 233 from portions of the substrate 16 (i.e. the field area of the substrate 16) and probe springs 61 not dipped covered in a baked photo-resist layer 248. FIG. 36 is a view of a sixth step of a spring probe assembly coating process, in which photo-resist layers 248 are stripped from the portions of the probe springs 61 which were covered in a photo-resist layer 248, thereby exposing the protective coating 233.

The non-planar probe spring coating process therefore provides a protective coating to the tips 24 of the probe springs, while etching the unwanted protective coating in the substrate surface 16 and portions of the spring probes 61 which are not coated with photo-resist layers 248.

Spring Probe Substrates for Ultra High Frequency Applications. As described above, the structure of the probe card assemblies 60 provides very short electrical distances between the probe tips 61a–61n and the controlled impedance environment in the printed wiring board probe card 68, which allows the probe card assemblies 60 to be used for high frequency applications. As well, the spring probe substrate 16 may preferably be modified for ultra high frequency applications.

FIG. 37A shows a partial cross-sectional view 260a of an ultra high frequency spring probe substrate 16a, having a probe spring 61 comprising a plurality of layers 17a–17n having different inherent levels of stress. The spring 61 is typically formed over a release layer 19, wherein selective removal of the release layer 19, such as within a release region 18 (FIG. 3, FIG. 4), allows a free, nonplanar portion 61 to extend from the surface of the substrate 16a. For embodiments wherein the traces on one or both surfaces 62a, 62b of the substrate 16 are required to be impedance controlled, one or more conductive reference planes 262a, 262b may be added within or on the substrate 16, either on top of the traces 270, below the traces 270, or both above and below the traces 270. The substrate 16 may also contain alternating ground reference traces 266a, 266b, which are connected to the one or two reference planes 262a, 262b, to effectively provide a shielded coaxial transmission line environment 268. While the spring probe substrate 16 is typically a ceramic material, the layer 264 between reference planes is typically a dielectric material, such as an organic dielectric material.

FIG. 37B shows a partial cross-sectional view 260b of an alternate ultra high frequency spring probe substrate 16, further comprising a ground reference trace 266d extending from ground reference trace 266b, which is connected to the one or two reference planes 262a, 262b. The ground reference trace 266d surrounds the central conductive via region 78, and is separated by a dielectric region 259. The surrounding ground reference trace 266d effectively extends a shielded coaxial transmission line environment 268 through the substrate 16, from the connector surface 62b to the probe surface 62a. The conducting layer 266d and dielectric film 259 are sequentially deposited preferably by chemical vapor deposition (CVD) techniques, including atomic layer chemical vapor deposition technique. The electrically conducting layer in the central region of the via is then deposited by CVD or physical vapour deposition or electro-deposition (either electroplating or electro-less) method or combination thereof. In embodiments where electroplating is used for depositing the electrically conducting layer, a seed layer may be deposited on the surface of the dielectric film 259 by any of the conventional film deposition techniques, such as CVD.

Figure 37:
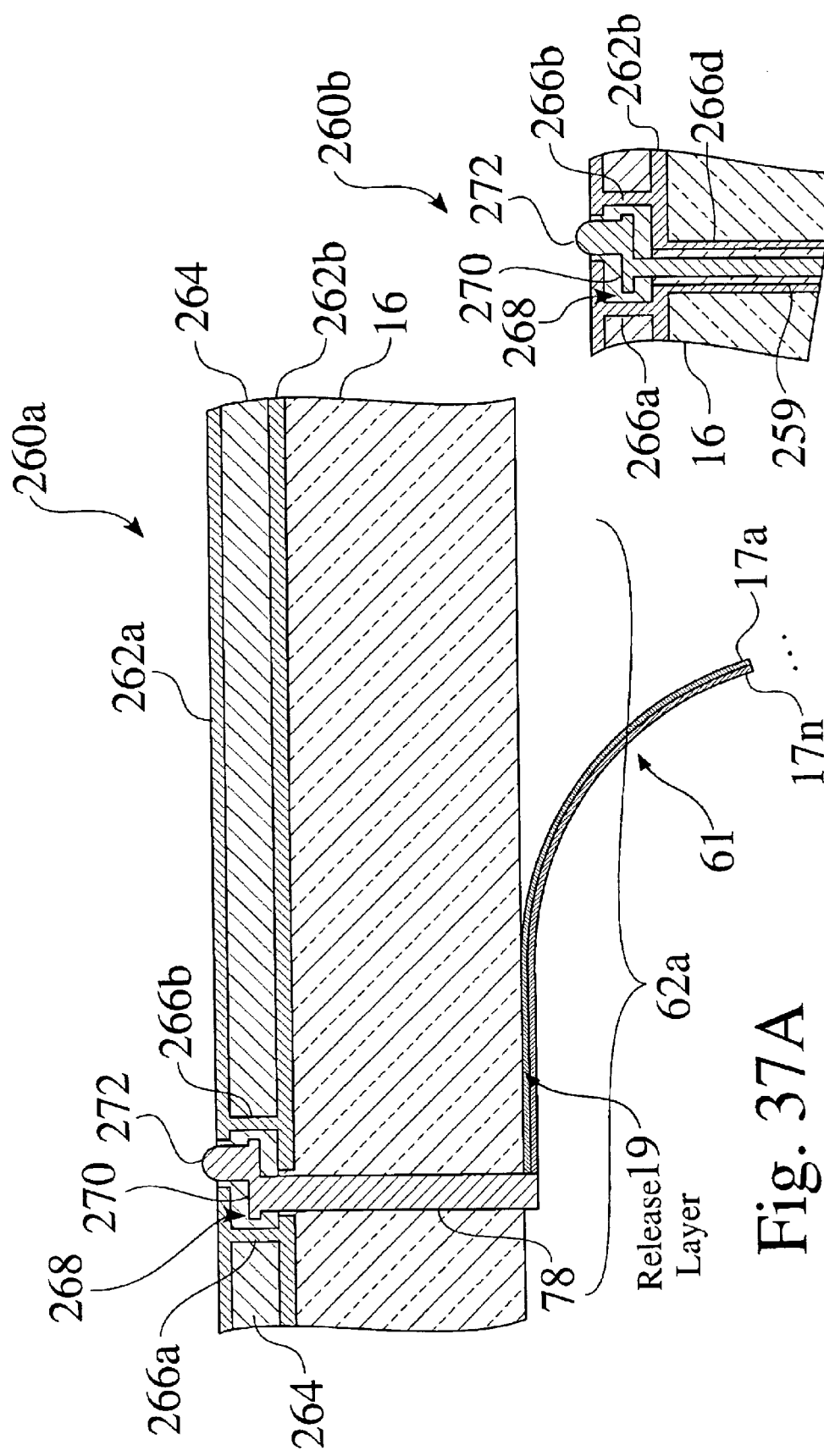
FIG. 37A is a partial cross-sectional view of a reference plane layered spring probe substrate.
FIG. 37B is a partial cross-sectional view of an alternate ultra high frequency spring probe substrate comprising a shielded coaxial transmission line environment which extends through the substrate.
Figure 38:
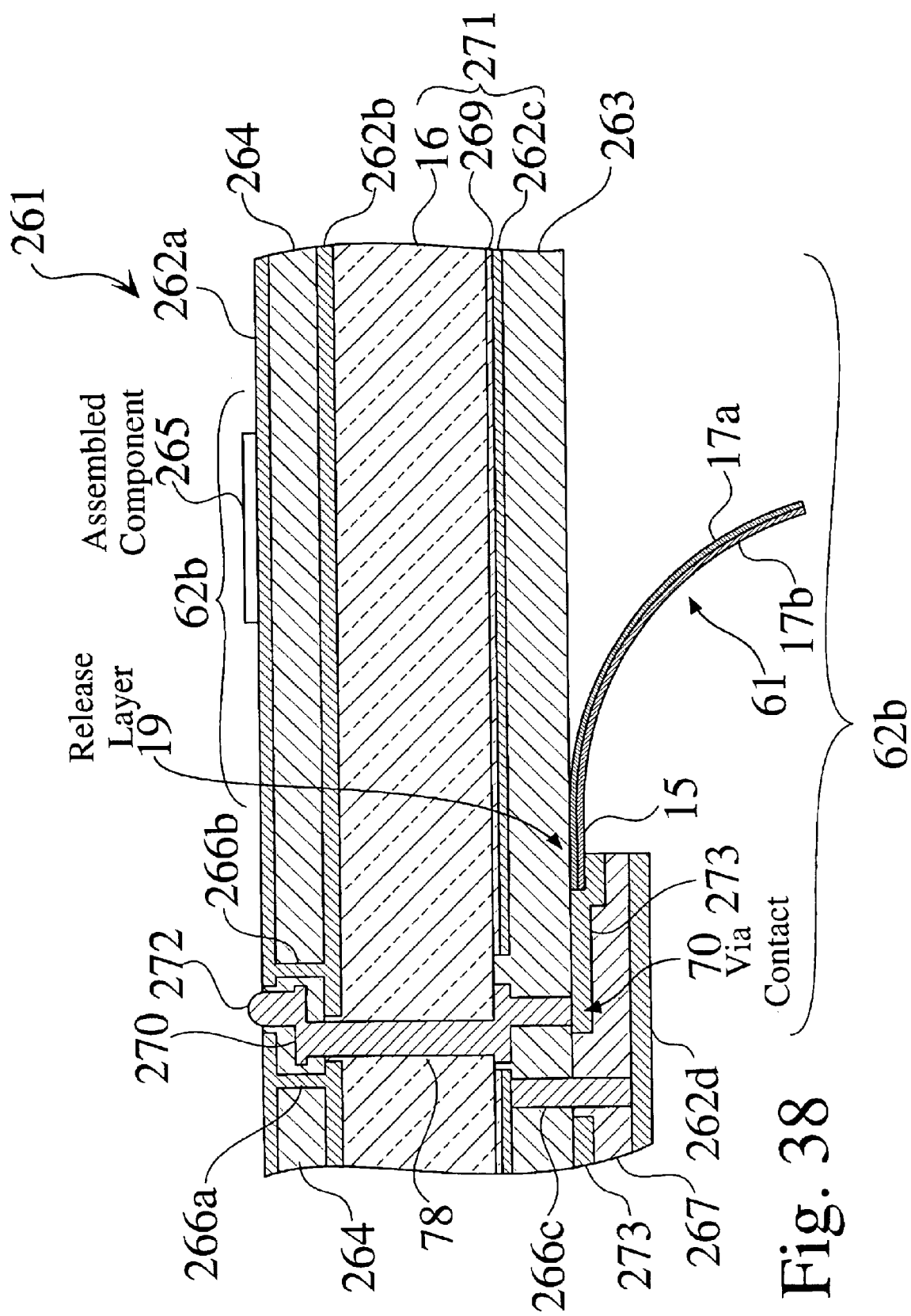
FIG. 38 is a partial cross-sectional view of an alternate reference plane layered spring probe substrate.

FIG. 38 shows a partial cross-sectional view 261 of an alternate ultra high frequency spring probe substrate 16. For embodiments wherein a spring probe 61 and related electrical conductors 273[320], 78, 322 on and through the substrate 16 are required to have controlled impedance (matched impedance), e.g. for high frequency applications, one or more conductive reference surfaces 262a, 262b, 262c, 262d and vias 266a, 266b, 266c may preferably be added, either within or on the substrate 16. As well, the impedance control surfaces 262a, 262b, 262c, 262d are not limited to the planar surfaces shown in FIG. 38. In some embodiments, where electrical conduction through the via 78 requires impedance matching for enhanced performance, the via is constructed as in FIG. 37B, the details of which has been explained above.

A conductive layer 262d may be deposited on top of the insulating layer 267, to provide a coaxial, controlled impedance connection. Alternate layers of conductive materials 262 and dielectric materials 263 can preferably be integrated with the substrate 16, such as for embodiments which require decoupling capacitors in close proximity to a probe spring 61. For a substrate 16 which is a conductive or semiconductive material, such as silicon, an oxide or dielectric layer 269 may preferably be deposited or formed between the substrate 16 and a conductive reference plane 262c, thereby forming a capacitance structure 271, which may be used as a decoupling capacitor. Similarly, in some embodiments, the capacitor structure can also be formed on the opposite surface, or both surfaces of the substrate 16. In this case, a dielectric layer, e.g. oxide, may be deposited or formed on the surface prior to the deposition of the ground plane 262b. Electrical connection to the conducting substrate 16 is provided through regions (not shown) on the surface of the substrate 16 which are not covered by the dielectric 269 or ground plane films. Photolithographic techniques can be used to open up such regions for establishing contacts to the conducting substrate. In such cases where the substrate 16 is a conducting material, electrically insulative films, e.g. oxide, may be deposited or formed on the walls of the vias or holes to prevent electrical shorting. As well, one or more assembled components 265, such as passive components 265 (e.g. typically capacitors, resistors, and/or inductors), or active component devices 265, may be incorporated on either surface 62a, 62b of the substrate 16.

The fixed portions 15 of the spring probes 61 typically extend a relatively short distance across the substrate 16. Traces 60 located on the surface of the substrate 16 are electrically connected to the fixed portions 15 of the spring probes 61, and electrically connect the probe springs 61 to the vias 78. The traces may be comprised of a different material than the spring probes 61, and are preferably comprised of metals having high electrical conductivity (e.g. such as copper or gold).

Figure 39:
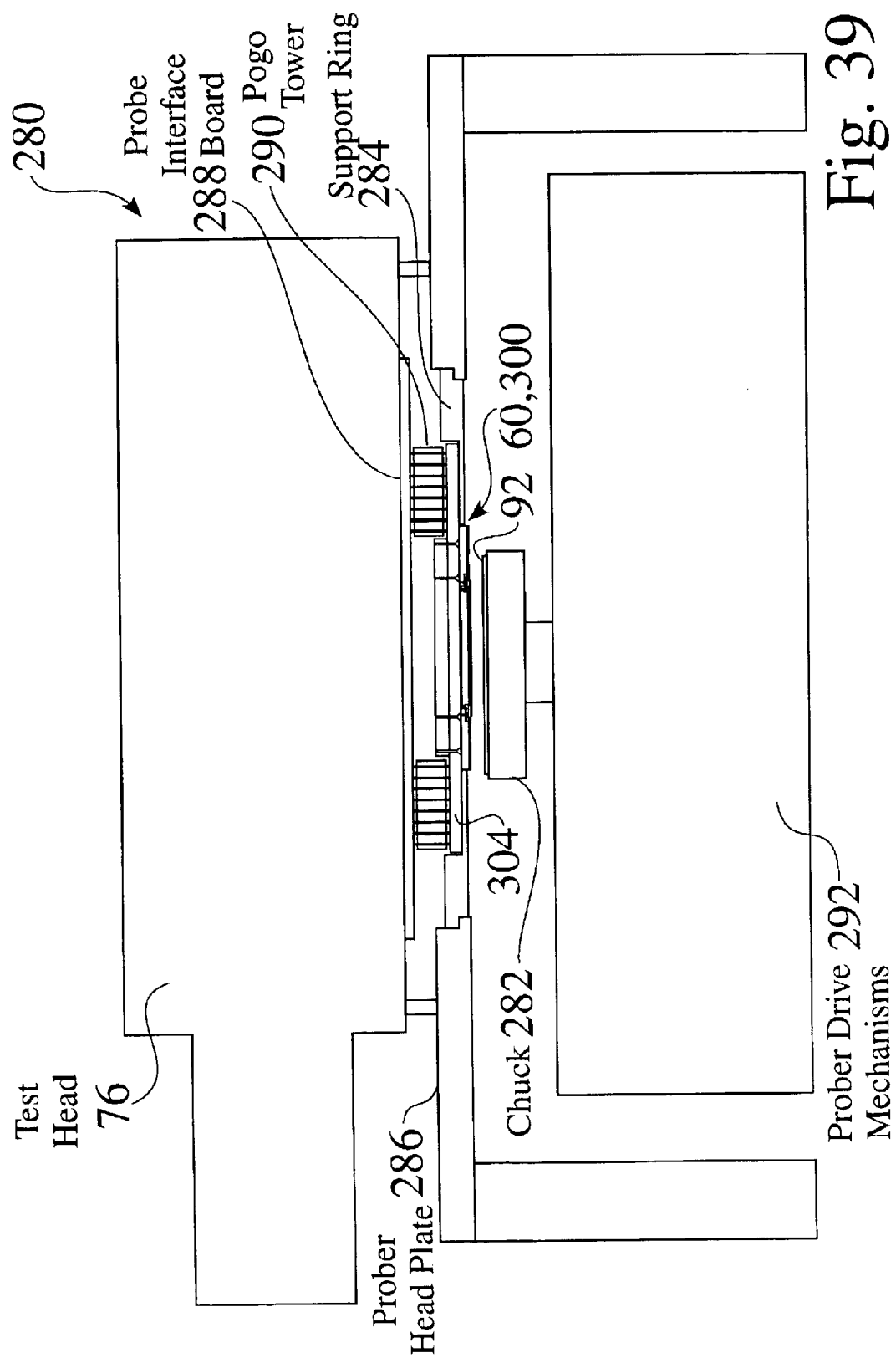
FIG. 39 is a partial schematic view of a typical wafer test system.

Advanced Multi-Die Probe Card System Architectures. FIG. 39 is a schematic view of a wafer test system 280, in which a probe card assembly 60, e.g. 60a (FIG. 14), or an advanced probe card assembly 300 (FIG. 40), provides an interface between a test head 76 and a multi-die wafer 92 located on a chuck 282. The probe card assembly 60, 300 shown in FIG. 39 is attached to the wafer test system 280, through a support ring 284, to a prober head plate 286. The probe card assembly 60, 300 interfaces with the test head 76 through a probe interface board 288. The wafer test system 280 also comprises a prober drive mechanism 292, by which the chuck 282 and the test head 76 are moveable in relation to each other.

Figure 40:
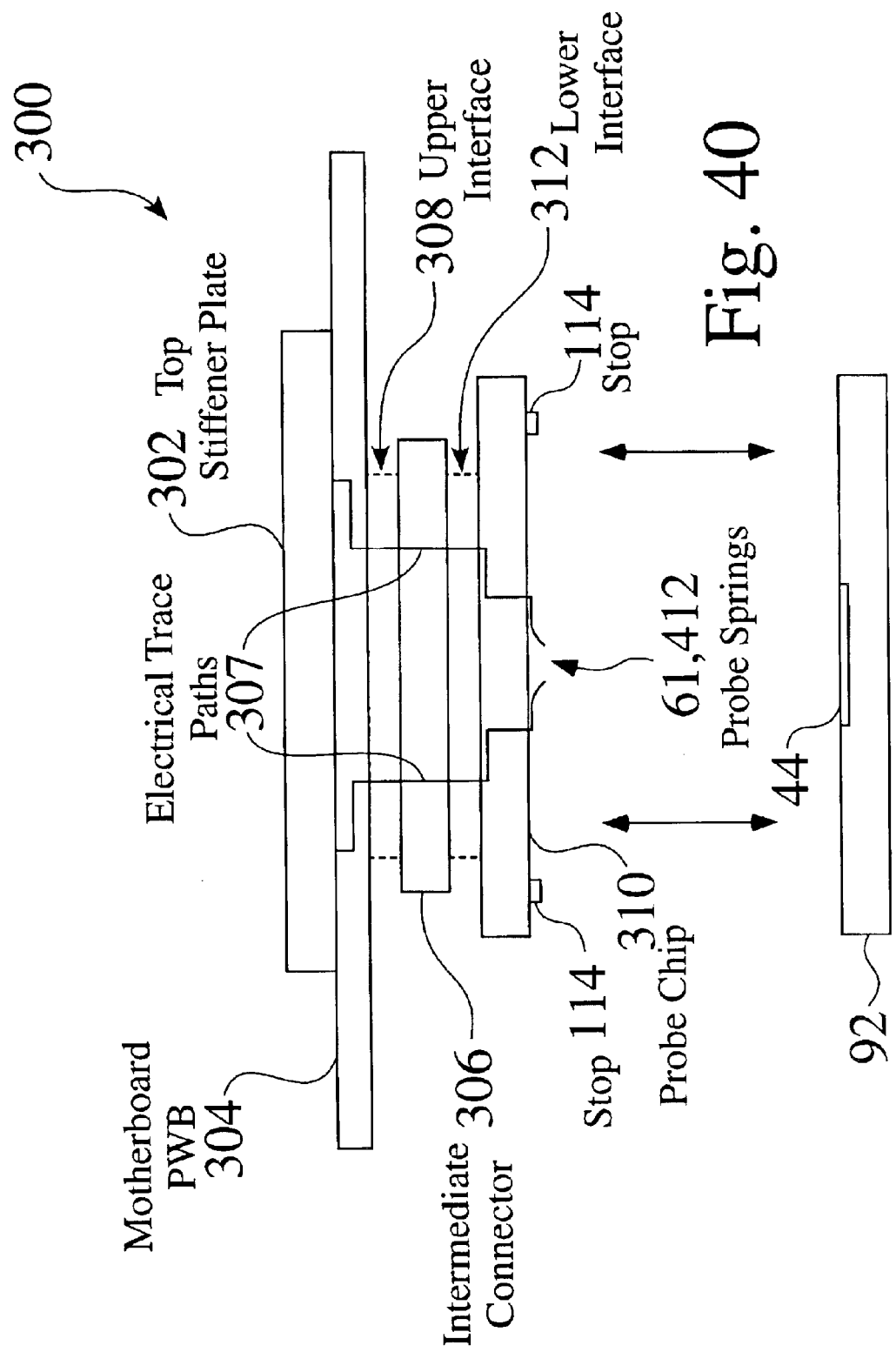
FIG. 40 is a schematic diagram of an enhanced probe interface assembly.

Multi-Die probing requires a high number of parallel contacts, e.g. such as electrical contacts, between the test head 76 (FIG. 39) and each of the die 44 (FIGS. 13, 40). The high number of parallel contacts 307, such as seen in FIG. 40, typically require uniformity and planarity of the contact tips 61, 412 (FIG. 45) to a reference surface, e.g. such as to an IC 44. Furthermore, signal traces 307 are required to fan-out, for signal integrity and for at-speed testing. The high number of parallel contacts 307 also require a total probe force to effectively contact each of the dies 44. In addition, it is preferable that the length of the traces 307 be matched from site 44 to site 44, such as to provide an equal delay for all test channels during dynamic testing.

Probe card assemblies 60, 300 such as a probe card assembly 60a (FIG. 14), or a decal interposer assembly 300a (FIG. 41), which contact multiple die 44 preferably match the thermal coefficient of expansion (TCE) of the probe carrier 16 to the wafer 92, e.g. silicon, while maintaining dependable connections and electrical integrity to the motherboard PWB 304.

Probe card assemblies 60, 300 which contact multiple die 44 preferably comprise independent power supplies for each die 44, and preferably provide a plurality of power rails, e.g. 2–3 or more, for connection to each die 44. As well, the probe card assemblies 60 preferably include multiple bypass capacitors 172, as close as possible to each device under test DUT 44.

The probe card assembly 60 provides transfer of signal and power connections from the devices under test 44 and the test head 76, along the Z-axis 84, while preferably providing controlled impedance. The probe card assembly also transfers signal and power connections in the X-Y directions 80, 82 (FIG. 13), which fans out the signal traces 307 from the pitch 20 of the integrated circuits 44 to the pitch 91 (FIG. 14) of the test head 76. The total probe offset from the mother board 304 to the probe tip 61, 412 of the probe assembly 60 is typically defined by the thickness of the support ring 284 (FIG. 39).

As described above, some embodiments of the probe card assemblies 60, such as the bridge and leaf spring suspended probe card assembly 60b (FIG. 15), the wire and spring post suspended probe card assembly 60d (FIG. 20), and the pogo wire suspended probe card assembly 60g (FIG. 23), provide means for tilting the probe chip substrate 16 to provide compliance and planarity to a wafer 92.

Figure 42:
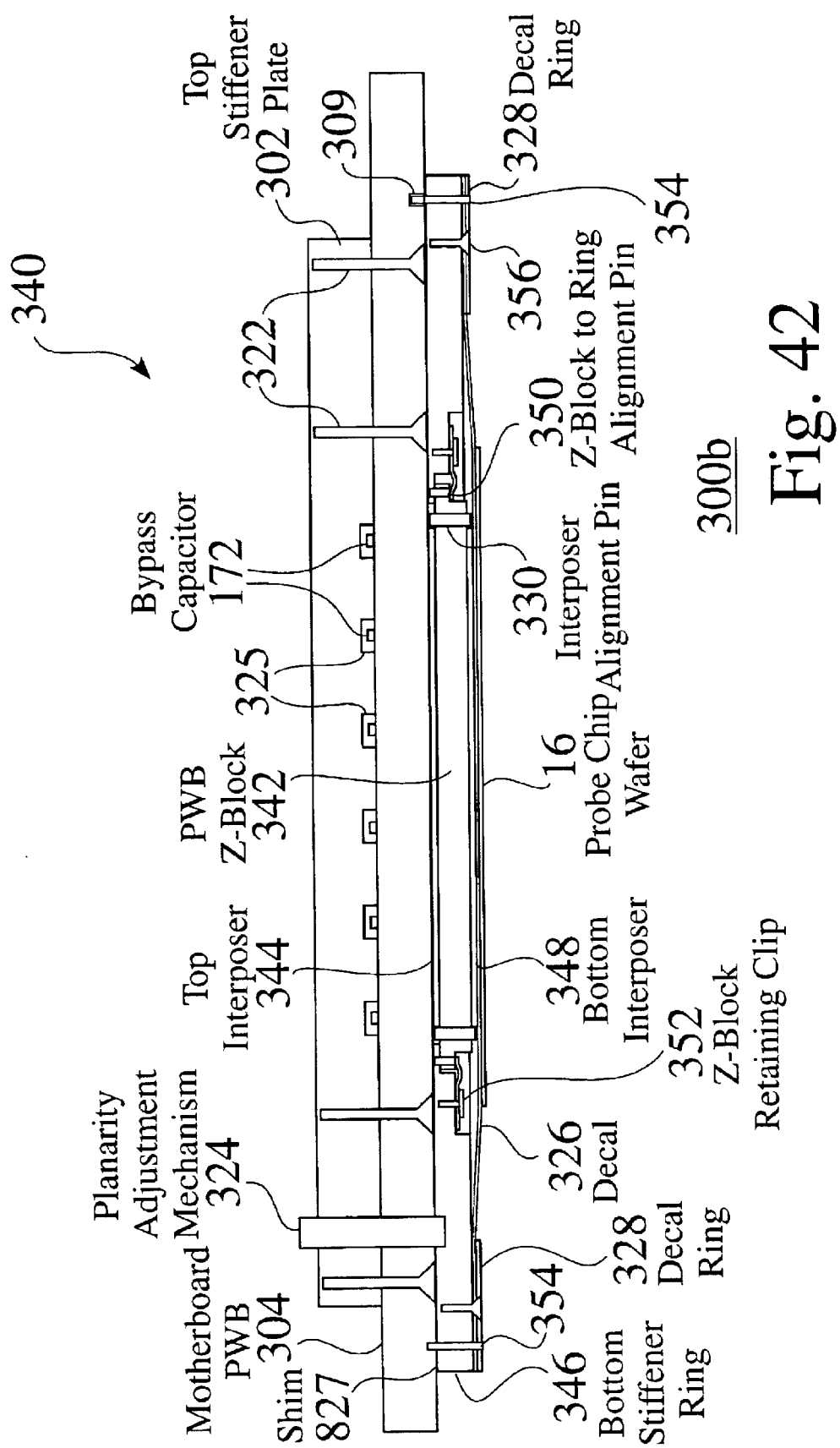
FIG. 42 is a partial cross sectional view of a Z-block decal interposer assembly.

FIG. 40 is a basic schematic diagram of a staged interface probe card assembly 300, which integrally provides vertical translation of electrical trace paths 307, such as through a Z-Block printed wiring board (PWB) 342 (FIG. 42). The staged interface probe card assembly 300 typically comprises probe springs 412 (FIG. 46, FIG. 47), e.g. such as having a 180 μm height, located on the probe surface 62a (FIG. 43) of the probe chip substrate 16, 310, which provide enhanced compliance for the assembly 300. Electrical connections 307 are provided between the motherboard PWB 304 and the probe chip substrate 16, 310, through an upper interface arrangement 308, an intermediate connector assembly 306, and a lower interface arrangement 312, respectively. A stiffener plate 302 is also preferably affixed to the motherboard PWB 304. The upper interface arrangement 308 and the lower interface arrangement 312 shown in FIG. 40 comprise electrical interfaces and/or hardware.

In some embodiments of the staged interface probe card assembly 300, enhanced compliance is provided entirely by probe springs 412, wherein the probe chip substrate 16, 310 is held stationary with respect to the motherboard PWB 304. Lower standoffs 114 are typically provided on the lower surface of the probe chip substrate 310, which limit the minimum vertical distance between the probe chip substrate and a wafer 92. The height of the lower standoffs 114 is typically less than the resting, i.e. non-contacting height of the probe springs 61, 412, such that the probe springs 61, 412 are allowed to flex and provide a compliant connection to one or more devices 44 on a wafer 92. As seen in FIG. 40, upper standoffs 116 (FIG. 19) are also used in some embodiments of the probe card assembly 300, such as to provide a vertical travel limit for the connector surface 311a of the probe chip substrate 310, such as in relation to the intermediate connector 306 or to the motherboard 304.

As seen in FIG. 39, the metal support ring, i.e. ring insert 284, provides mechanical support for the motherboard PWB 304 against the downward pressure exerted by the pogo tower connector 290 (FIG. 39).

The intermediate connector 306 shown in FIG. 40 may typically comprise a vertical translation block 342 (FIG. 43), a pin block 742 (FIGS. 64–69) or an expanded pin block (FIG. 70, FIG. 71). The intermediate connector 306 provides Z-translation for the assembly 300, which allows the assembly 300 to provide a probe offset, which is typically about 0.300", which is a requirement in most probe assemblies, to clear the metal support ring insert 284.

The upper interface 308 may comprise a variety of interfaces, such as an upper interposer 344 (FIG. 43) having two sided springs 521 (FIG. 52), a solder ball array 756 or Z-Laminate (FIG. 65), a pin grid array 745 (FIG. 64), or any other interposer assembly 344, such as an ISOCON™ Connector, available through Circuit Components, Inc., of Tempe Ariz.

The lower interface 312 may also comprise a variety of interfaces, such as an interposer 348 (FIG. 42, FIG. 43) having springs located on both lower and upper surfaces 349a, 349b. The lower interface 312 may alternately comprise a solder ball array 756, springs 64a–64n (FIG. 13, FIG. 14) located on the upper surface 311b of the probe chip substrate 310, or other direct connections to the probe chip substrate 16, 310.

The lower interface 312 can be a fixed or permanent connection in some embodiments, such as a solderball interface, if the vertical translation block VTB 342 (FIG. 43) is made to provide lateral compliance between the lower surface 343 of the vertical translation block 342 and the rest of the system. One example of lateral compliance is shown in FIG. 67 using metal pin block 742 where the compliant pin template 748 and 752 allows the pin to move slightly.

Alternate embodiments of the vertical translation block VTB 342 comprise a plurality of non-fixed connections, such as an interposer or springs 64a–64n (FIG. 67), 412 which are fabricated onto the upper surface 62b of the probe chip 310. The use of non-fixed connections allow the probe chip 310 to move and/or expand in relation to the vertical translation block VTB 342.

The staged interface probe card assembly 300 shown in FIG. 40 further comprises a top stiffener plate 302, which helps to keep the motherboard PWB 302 flat.

Figure 41:
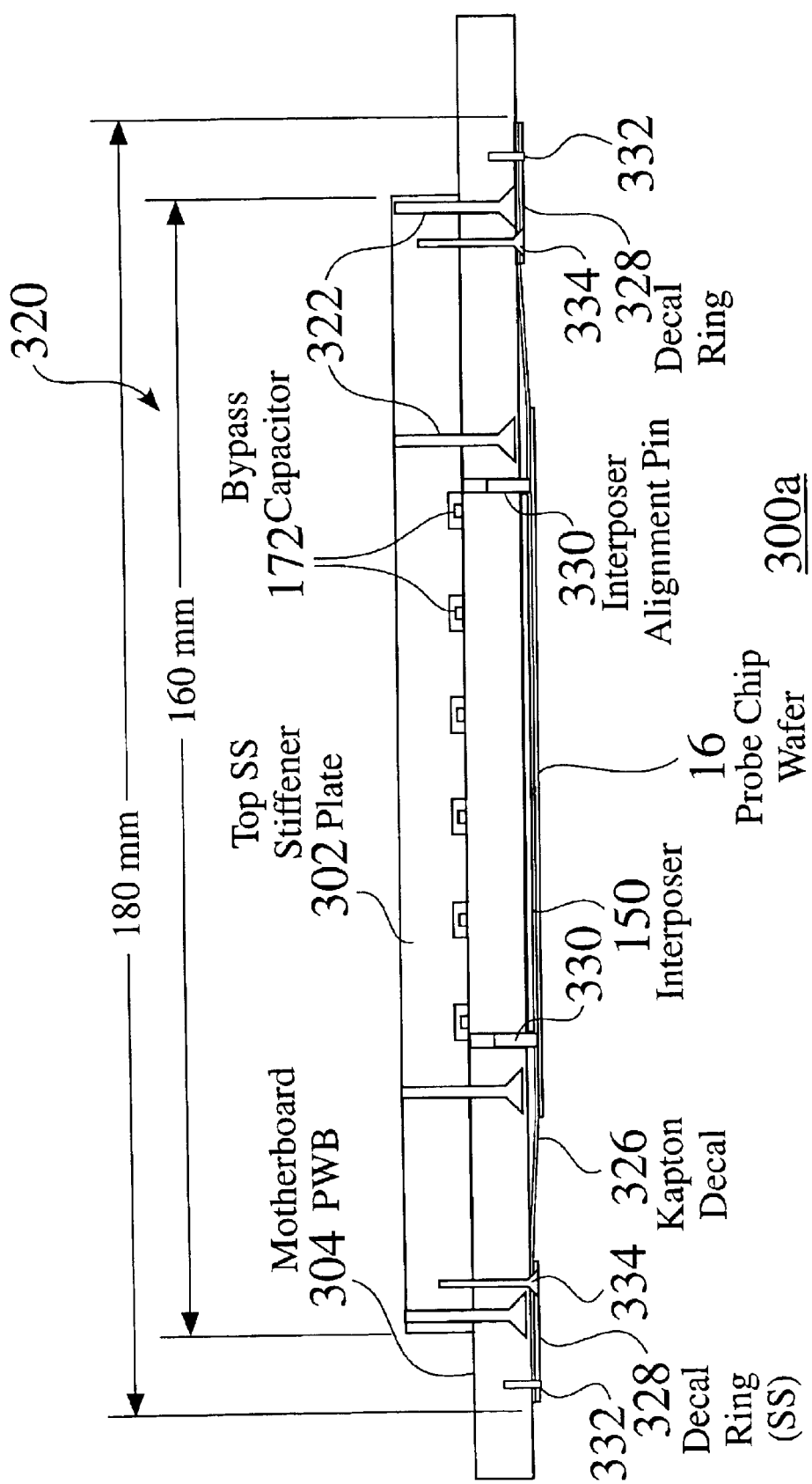
FIG. 41 is a partial cross sectional view of a decal interposer assembly.

FIG. 41 is a partial cross sectional view of a decal interposer assembly 300a. A motherboard PWB 304 is fixedly attached to a top stiffener plate 302 such as by a plurality of fasteners 322. The stiffener plate 302 is preferably comprised of a rigid material, such as stainless steel. The stiffener plate 302 shown in FIG. 41 further comprises a plurality of component recesses 325, such that componentry, e.g. capacitors 172, can be mounted to or extend from the upper surface 305b (FIG. 43) of the motherboard PWB 304.

Some embodiments of the stiffener plate incorporate handles 837, 839 (FIG. 73, FIG. 74, FIG. 75), such as to aid handling of the assembly. Furthermore, windows 840 (FIG. 73) are defined through some embodiments of the stiffener plate 302, which allow post-assembly modification of the motherboard 304, e.g. such as for electrical jumpers for customer customization.

As seen in FIG. 41, the motherboard 304 is electrically connected to a probe chip wafer 16, through an intermediate interposer 150, which is located between the upper surface 62b (FIG. 43) of the probe chip 16, 310 and the lower surface 305a (FIG. 43) of the motherboard 304. The interposer 150 is preferably aligned to the motherboard 304, typically through interposer alignment pins 330, which are mounted to and extend from the motherboard 304, and correspond to alignment holes 347 (FIG. 43) and/or the edge 351 (FIG. 43) of the interposer substrate 348.

Figure 79:
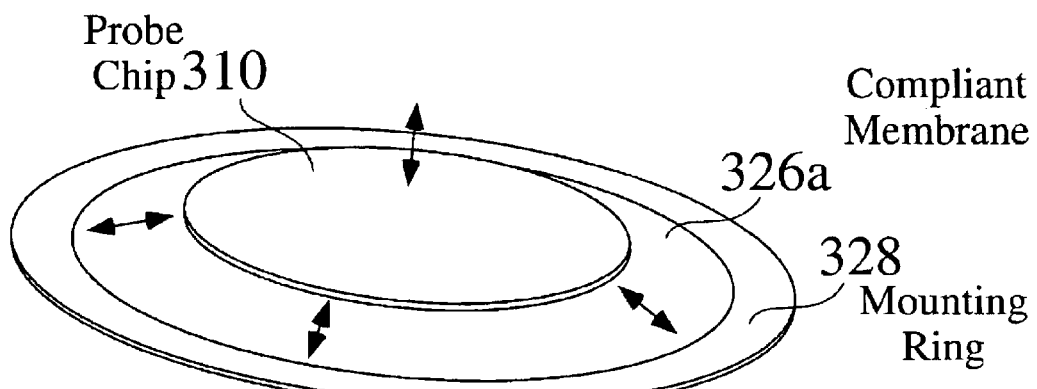
FIG. 79 is a perspective view of a probe chip mounted to a compliant flexible membrane.
Figure 80:
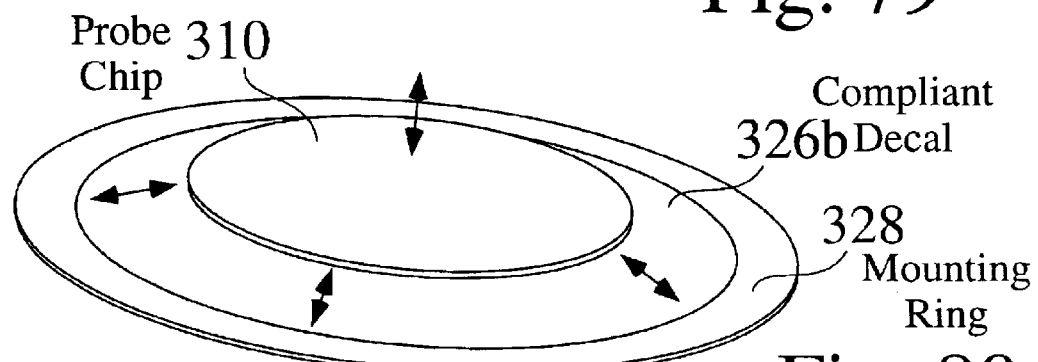
FIG. 80 is a perspective view of a probe chip mounted to a compliant decal.
Figure 81:
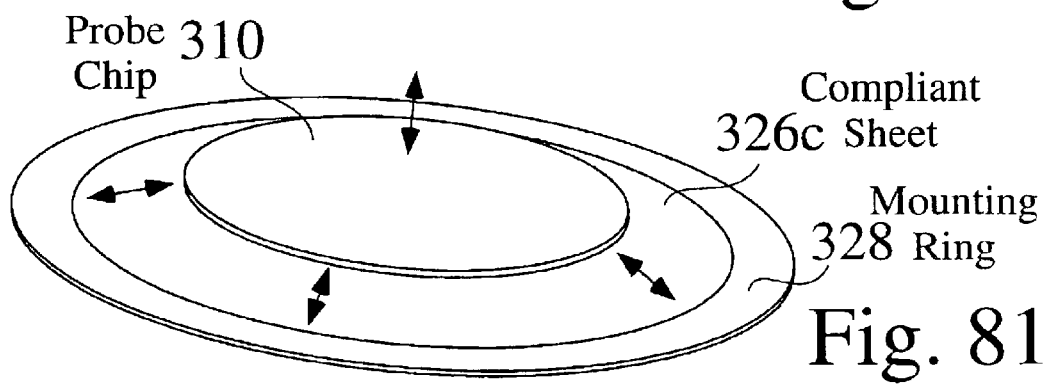
FIG. 81 is a perspective view of a probe chip mounted to a compliant sheet.
Figure 82:
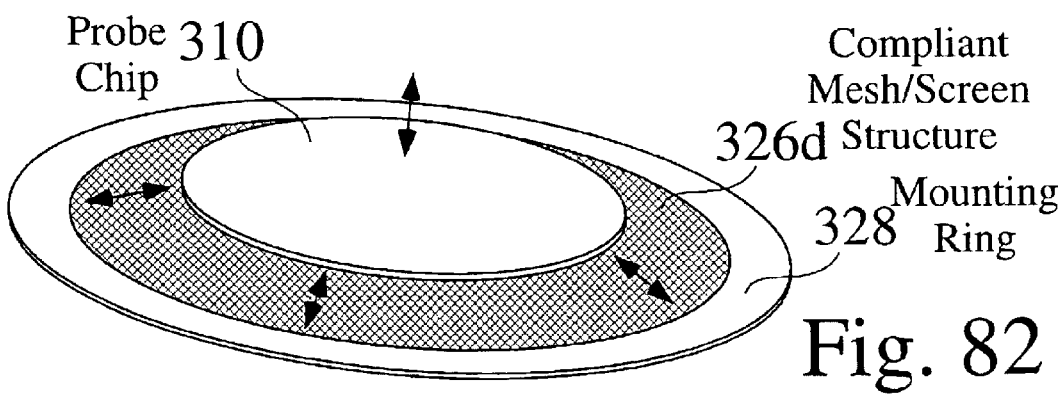
FIG. 82 is a perspective view of a probe chip mounted to a compliant screen.

FIG. 79 is a perspective view of a probe chip 310 mounted to a compliant membrane 326a. FIG. 80 is a perspective view of a probe chip 310 mounted to a compliant decal 326b. FIG. 81 is a perspective view of a probe chip 310 mounted to a compliant sheet 326c. FIG. 82 is a perspective view of a probe chip 310 mounted to a compliant screen 326d. The probe chip 310 is held in place by a compliant member 326, which typically comprises a flexible membrane 326a (FIG. 79), decal 326b (FIG. 80), sheet 326c (FIG. 81), or mesh structure 326d (FIG. 82). As seen in FIG. 41, the compliant member 326 is fixedly attached or mounted to an outer surrounding ring 328, which is attached to the motherboard 304, by fasteners 334. The outer ring 328 and the affixed compliant member are preferably aligned to the assembly 300a, such as by ring alignment pins 332. The compliant member is stretched during attachment to the surrounding ring 328 and thus held under tension.

The compliant member 326 holds the probe chip 310 in position on the X-Y axis 80,82 while allowing it to move or ride in the Z-Direction 84. The compliant member 326 retains the interposer 150 in a compressed position, through a controlled flexion in the compliant member or decal 326, which is caused by any Z plane 84 delta between the bottom surface 305a of the interposer 150 and the mounted position of the compliant member 326.

The compliant member 326 also provides compliance for differences in thermal coefficients of expansion (TCE) between the probe chip 16, 310 and the decal ring 328. For example, for decal probe assembly 300 in which a decal ring 328 which has a higher coefficient of expansion than a probe chip 16, 310, the compliant member 326 readily flexes, i.e. stretches, at elevated temperatures, between the probe chip 12, 300 and the decal ring 328.

Figure 43:
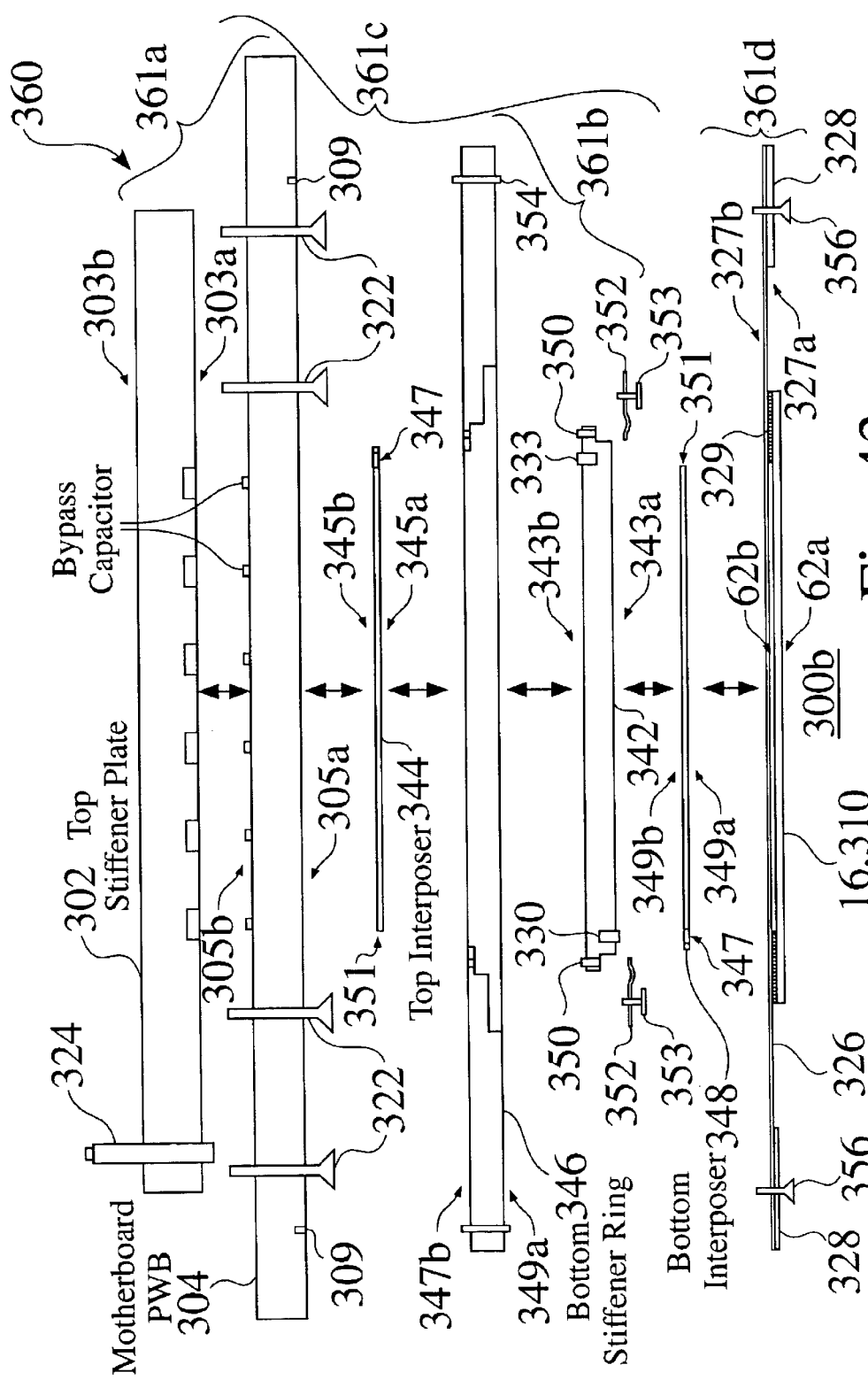
FIG. 43 is an expanded assembly view of a Z-block decal interposer assembly.

FIG. 42 is a partial cross sectional view 340 of a Z-Block decal interposer assembly 300b. FIG. 43 is an expanded assembly view 360 of a Z-block decal interposer assembly 300b. The motherboard 304 is electrically connected to the probe chip wafer 16, 310 through an upper interposer 344, a PWB Z-block 342, and a bottom interposer 348, respectively, which are located between the upper surface 311b of the probe chip 16, 310 and the lower surface 305a of the motherboard 304. The bottom stiffener plate 346 is aligned to corresponding holes or slots 309 in the motherboard PWB 304 via pins 354. The Z-Block vertical translation block (VTB) 342 provides Z translation of signals and power from the motherboard PWB 304 to the probe chip 16, 310, so that the probe tips of the probe springs 61a–61n will clear the probe ring 284 (FIG. 38). The Z-Block 342 shown in FIG. 43 has three sets of alignment pins 330, 333, 350, extending from the top surface 343b and/or bottom surface 343a. The bottom interposer 348 and top interposer 344 are aligned to the pins 330, 333 respectively, such as by an edge 351 or one or more alignment holes 347. The Z-Block 342 itself is aligned to the bottom stiffener 346 via pins 350.

The compliant member 326 holds the probe chip 310 in position on the X-Y axis 80,82 while allowing it to move or ride in the Z-Direction 84, as the Z-Block 342 expands due to thermal variation. The compliant member 326 retains the bottom interposer 348 in a compressed position, through a controlled flexion in the compliant member or decal 326, which is caused by any Z plane 84 delta between the bottom surface 349a of the bottom interposer 348 and the mounted position of the compliant member 326. The compliant member 326 also provides compliance for differences in thermal coefficients of expansion (TCE) between the probe chip 16,310 and the decal ring 328.

As seen in FIG. 42, the Z-block 342 is mounted to a bottom stiffener ring 346, which is preferably comprised of a rigid material, such as stainless steel. The bottom stiffener ring 346 retains the Z-block 342 in a flat, i.e. planar, position, while the thickness of the stiffener ring 346 limits, i.e. controls, the deflection amount of the compliant membrane or decal 326.

Z-Block retaining clip assemblies 352 hold the Z-block 342 to the bottom stiffener ring 346, and allow the Z-block to expand in the Z-direction at elevated temperatures. The bottom stiffener ring 346 holds and supports the Z-block 342 toward the motherboard 304, typically with an intermediate upper interposer 344.

Figure 73:
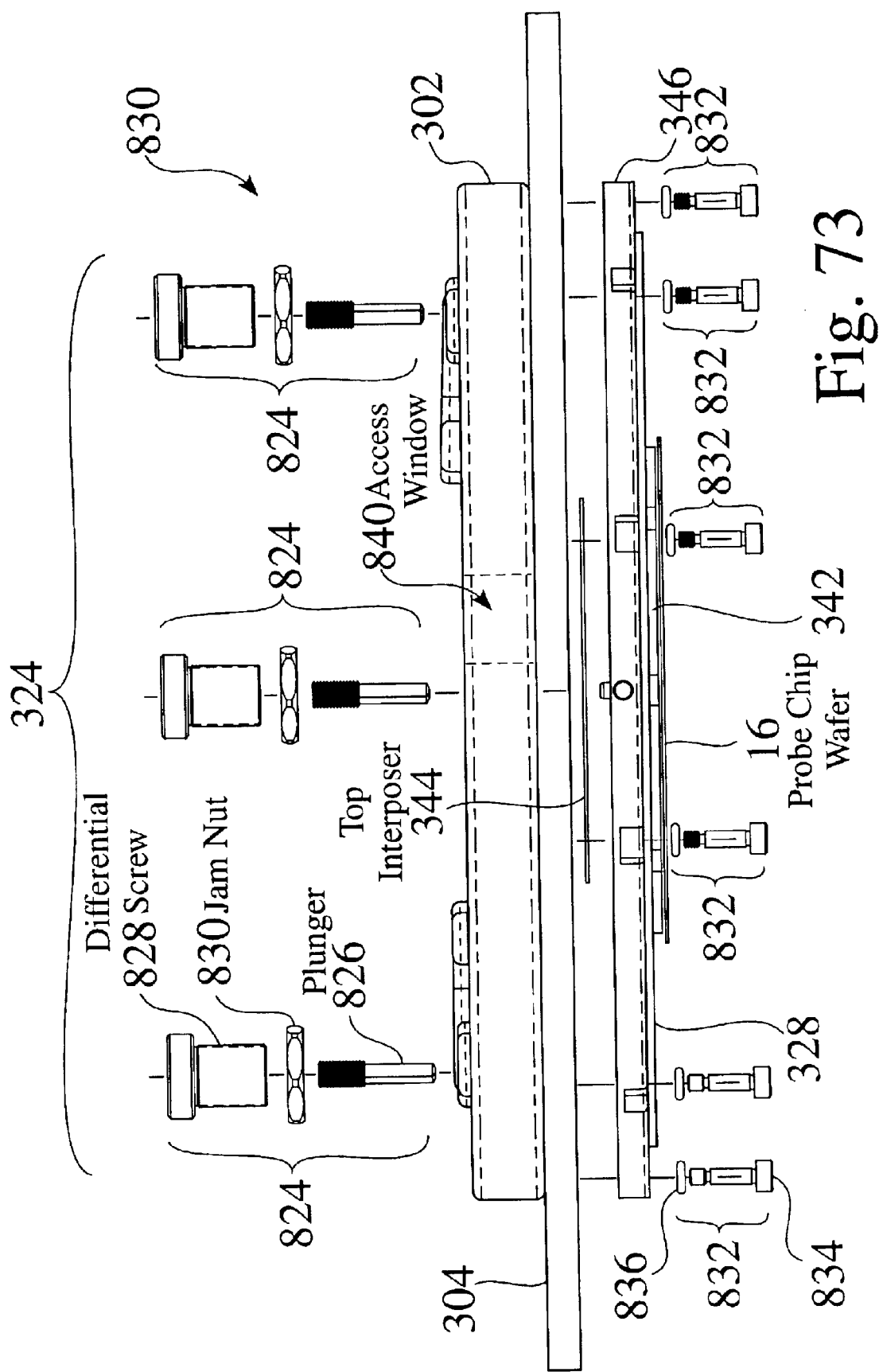
FIG. 73 is an expanded side assembly view of a Z-block decal interposer assembly having planarity adjustment.
Figure 74:
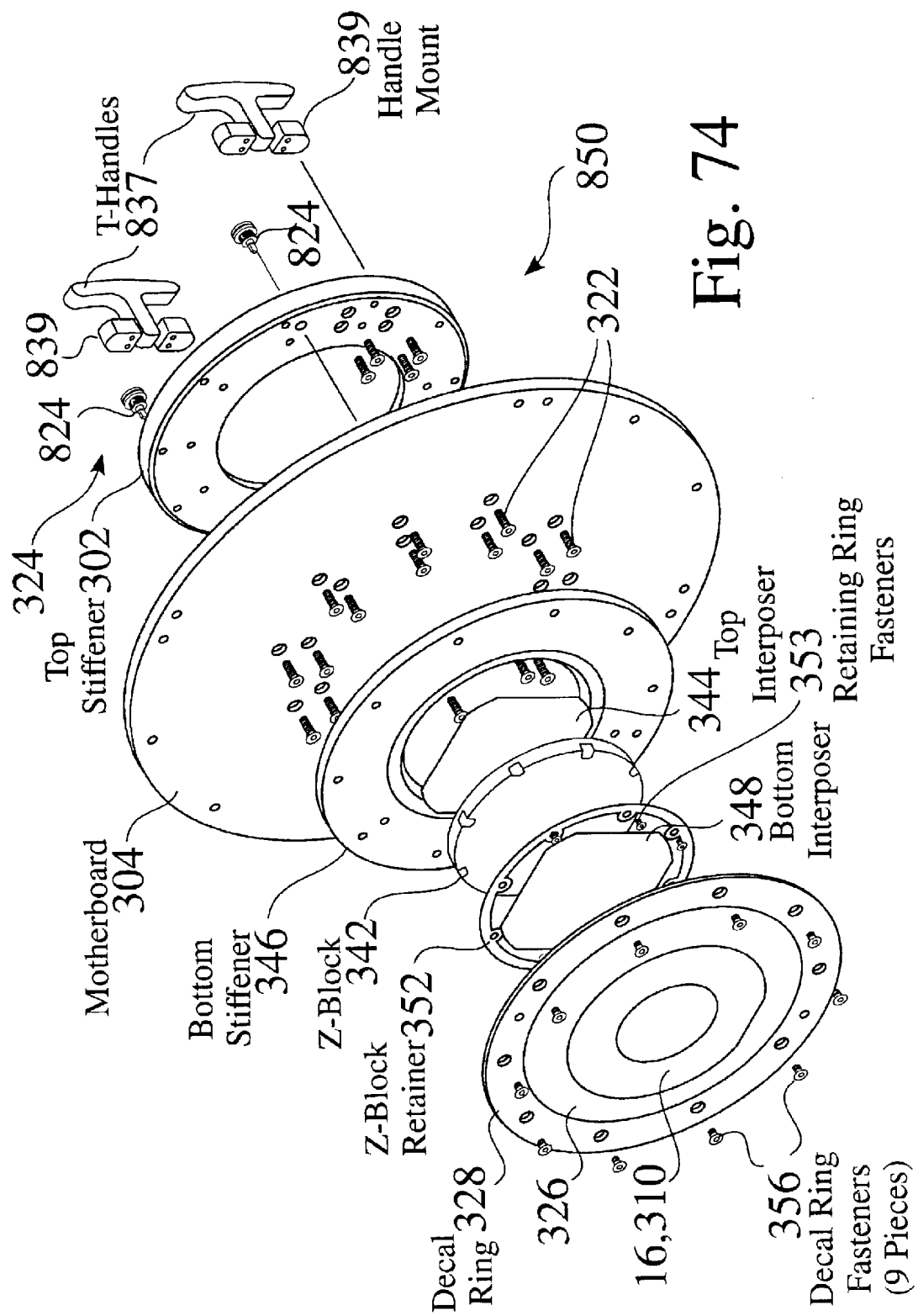
FIG. 74 is an expanded perspective assembly view of a Z-block decal interposer assembly having planarity adjustment.
Figure 75:
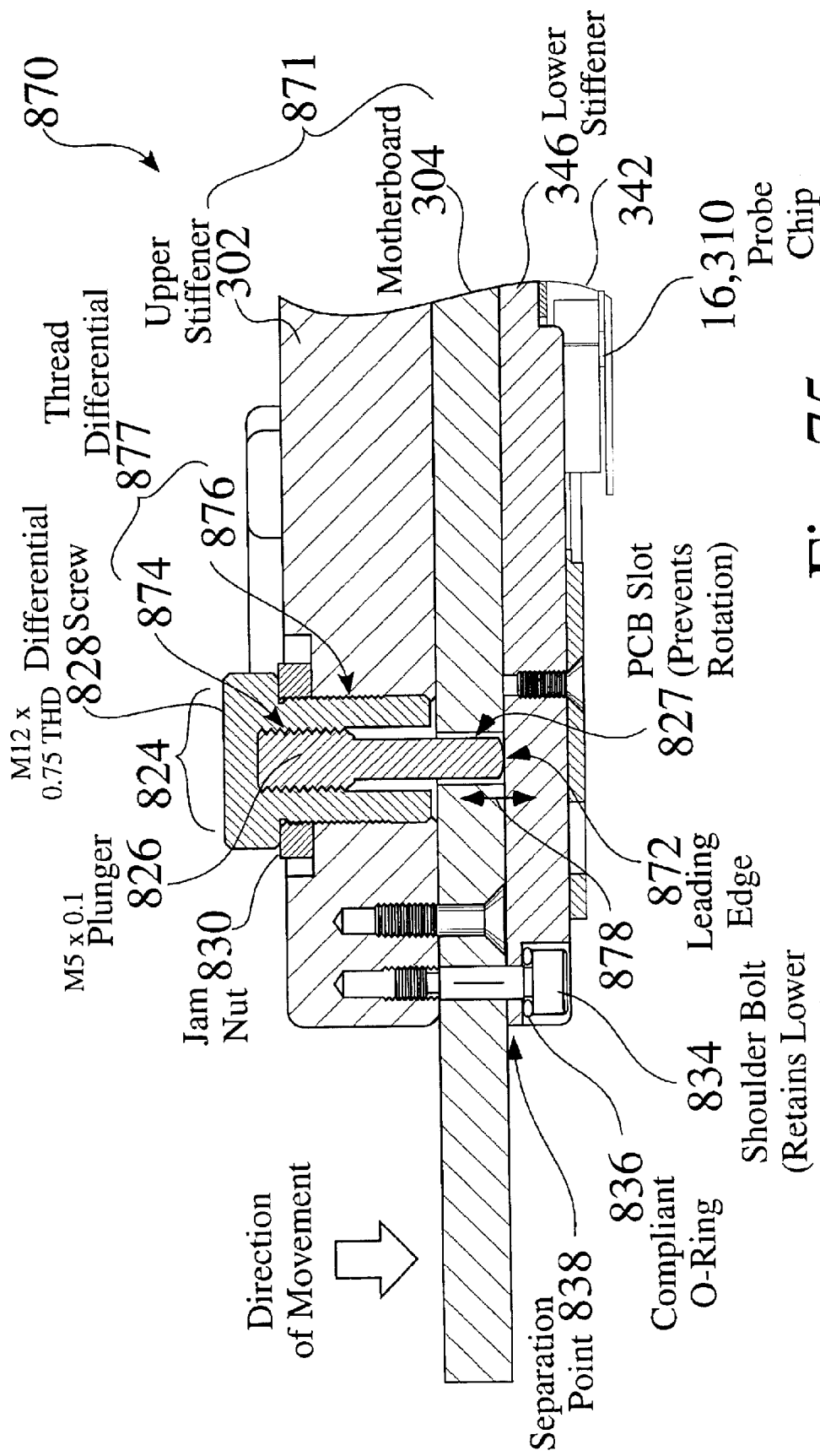
FIG. 75 is a partial cross sectional view of a Z-block decal interposer assembly having a differential screw planarity.

Planarity adjustment 326 is preferably provided between the motherboard 304 and the probe chip wafer 16, such as by one or more planarity adjustment screws and/or shims. In some embodiments of the decal interposer assembly 300, means for providing planarity 324 comprises a plurality of differential screw assemblies 824 (FIG. 73, FIG. 74, FIG. 75).

In some embodiments of the Z-Block decal interposer assembly 300b, the bottom stiffener ring 346 further comprises means for planarity adjustment, such as by one or more planarity adjustment screws 324, 824 (FIG. 73, FIG. 74, FIG. 75), whereby the planarity between contact tips are adjustable relative to the lower surface 305a of the motherboard 304. The bottom stiffener ring 346 is held under spring force against the planarity adjustment screws 324, 806, whereby the bottom stiffener ring stays in contact with the screw as it is moved vertically in the assembly. The planarity adjustment system 326 may comprise a wide variety of structures, such as fasteners, differential screws, guides, shoulder bolts, as well as biasing hardware, such as compression washers and/or compliant o-rings.

As seen in FIG. 43, the bottom interposer 348 provides electrical connections between the probe chip 310 and the Z-block 342, and allows the probe chip 310 to be a removable sub-component. The bottom interposer 348 also provides a sliding interface between the probe chip 310 and the Z-block 342, to accommodate TCE differences.

The compliant membrane or mesh 326 retains the probe chip 310, 16 in position on the X axis 80 and Y-axis 82, while allowing the probe chip 310, 16 to ride in the Z-Direction 84 as the Z-Block 342 expands due to thermal variation. The compliant membrane or mesh 326 keeps the bottom interposer 348 fully compressed at all times, by a controlled flex in the decal 326 caused by a Z plane delta between the bottom of the bottom interposer 348 and the mounted position of the decal ring 328, which provides compliance for TCE differences between the probe chip 310 and the decal ring 328.

Figure 44:
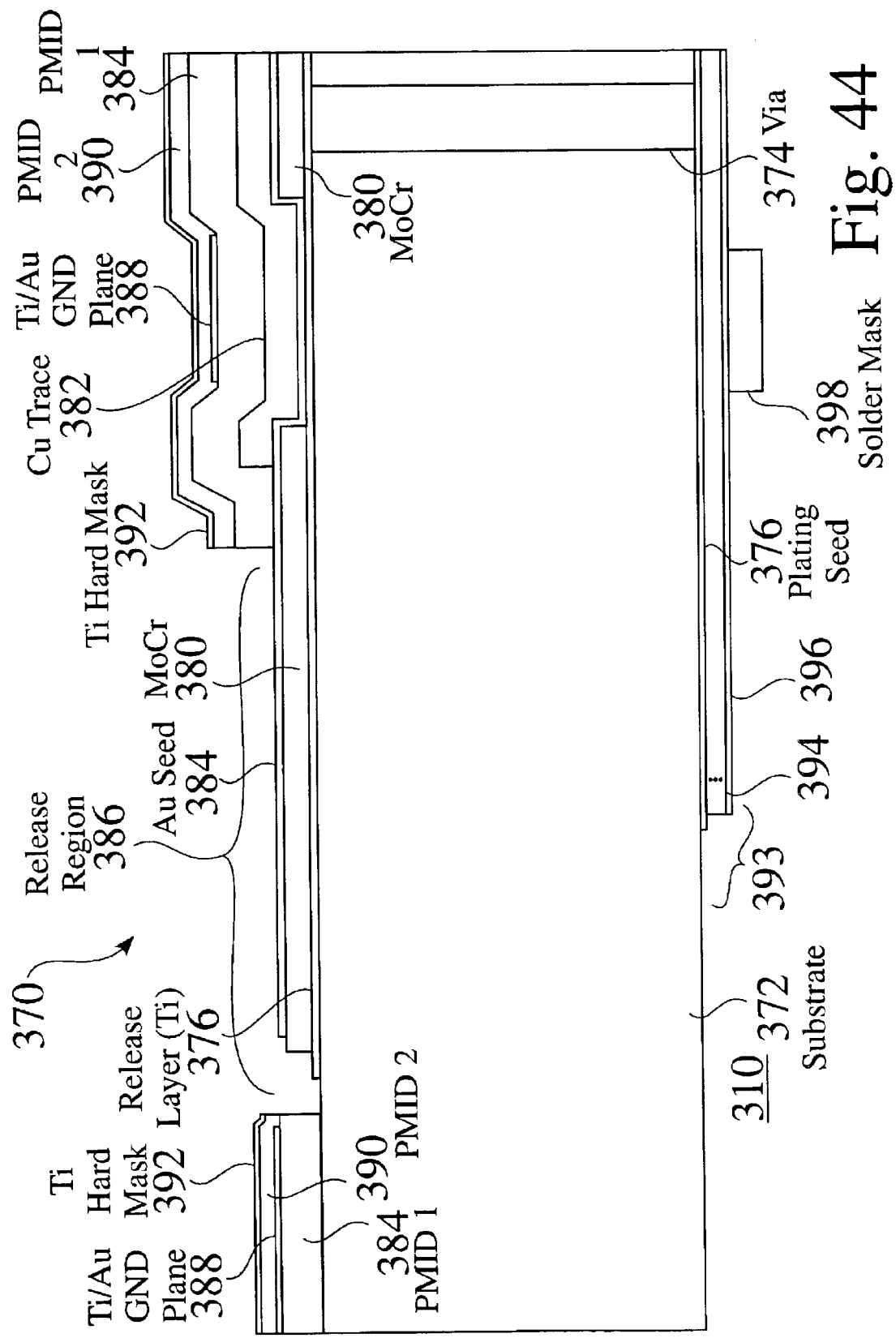
FIG. 44 is a cross sectional view of a probe chip prior to finger lift.
Figure 45:
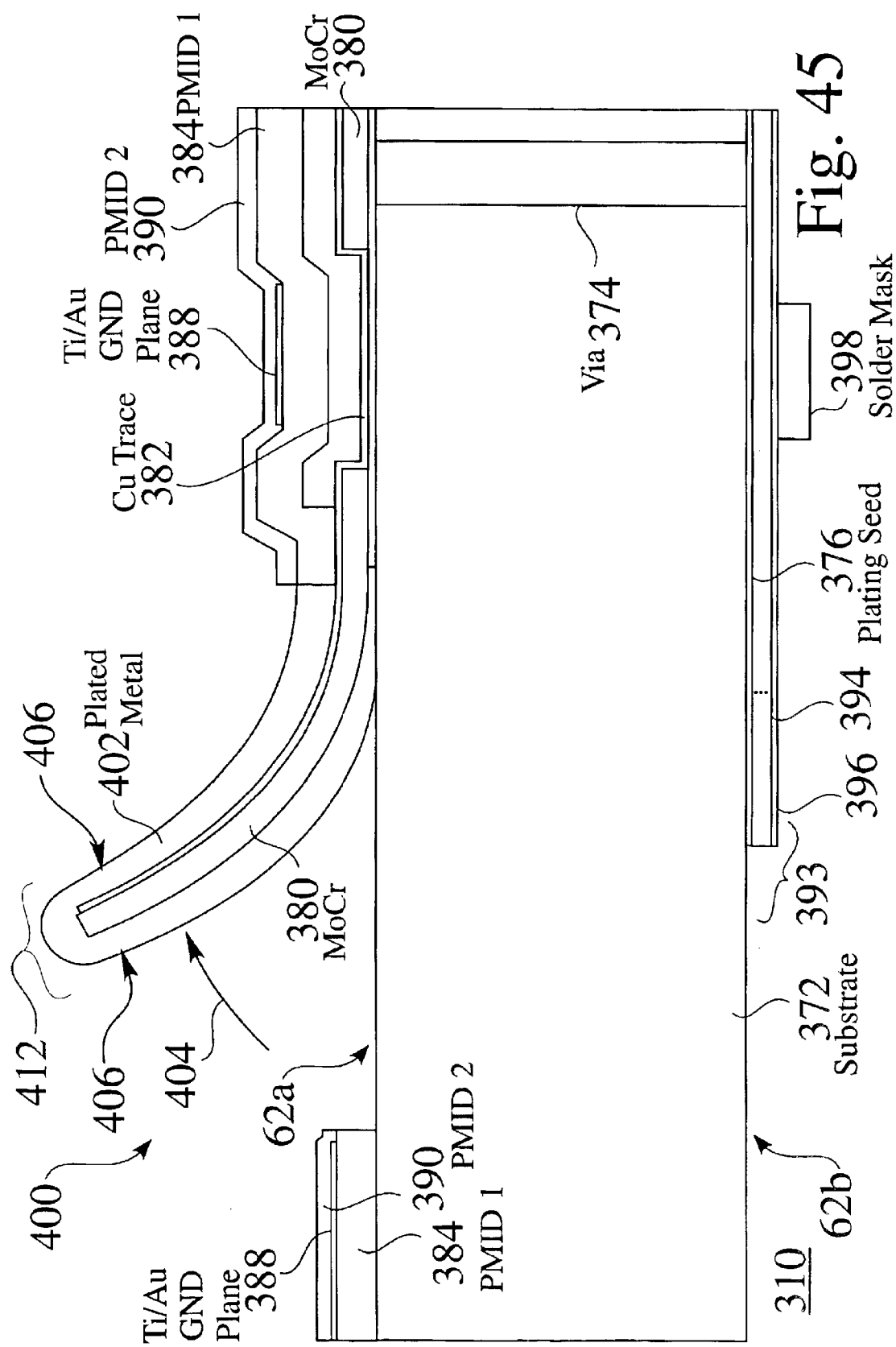
FIG. 45 is a cross sectional view of a probe chip after finger lift and plate.

Enhanced Probe Chip. FIG. 44 is a cross sectional view 370 of a probe chip 310 prior to finger lift. FIG. 45 is a cross sectional view 400 of a probe chip 310 after finger lift 404 and plate 406. Prior to finger lift, a portion of the probe surface 62a typically comprises a release layer 376, preferably comprising titanium, which is formed on the ceramic substrate 372. A composite layer 380 is then formed on the release layer 376, wherein the composite layer 380 typically comprises a plurality, preferably but not restricted to 5 layers, of metallic film layers 17a–17n (FIG. 37), in which at least two adjoining layers have different inherent levels of stress before spring lift 404 (FIG. 45). Such composite layers are formed preferably by techniques such as sputter deposition. In some embodiments, such composite layers are formed by electrodeposition technique also. In the probe chip structure 310 shown in FIG. 44, a conductive seed layer 384, preferably comprising gold, is preferably formed on the composite layer 380. Conductive traces 382 are then controllably formed over portions of the composite layer 380, typically through photolithographic patterning.

In some embodiments, upper layers, typically comprising a first polyimide (PMID) layer 384, a ground plane 388, a second PMID layer 390, and a hard mask layer 392, are then applied over the trace regions, typically providing shielding for signal traces.

FIG. 44 and FIG. 45 also show an exemplary formed connection structure 393 on the connector side of the substrate 372. The connection structure 393 provides contact pads 396, for connection to an interposer 348, e.g. such as seen in FIG. 43, and also to a connection trace between a pad 445 (FIG. 49) and vias 374, as seen in FIG. 44 and FIG. 45.

The connection structure 393 is comprised of a stack of one or more metal layers 376, 394, 396, which typically includes an outer layer 396 comprising gold, for reliable contact to interposer contacts or springs. In some embodiments of the probe chip 310, the connection structure 393 comprises a first titanium metal layer 376, a second nickel layer 394, and a third gold metal layer 396. In other embodiments of the probe chip 310, the connection structure 393 comprises a first Cr layer and Cu metal layer 376, a second nickel layer 394, and a third gold metal layer 396. The thickness of the layers 376, 394, 396 is typically controlled to reduce electrical sheet resistance. In some embodiments of the connection structure, the first Cr/Cu layer 374 comprises a thickness 1–4 um, and/or the outer gold layer comprises a thickness of 1–4 um.

In some embodiments, a dielectric layer such as polyimide, photoresist, epoxy, or kapton, can be added on top of the stacked structure 393, such as to serve as a solder mask 398 for soldering components, e.g. bypass capacitors to the supper surface 396, or to serve as insulation against shorting to undesired locations in the interposer 348.

As seen in FIG. 45, after finger lift 404, the probe spring 61 extends away from the probe surface 62a of the substrate 372 within the release region 386 (FIG. 44) as a result of inherent stress gradient in the plurality of film layers. In general, the free non-planar portion of the probe spring assumes substantially an arc shape upon release with the top deposited layer of the Mo—Cr film 380 and the gold seed layer 384 taking a concave shape. This results in the formation of a three-dimensional spring structure that is desirable for fabricating arrays of probe springs en masse with very small pitch using integrated circuit fabrication techniques including photolithography. A probe spring plating layer 402 is then preferably formed 406 on the extended, i.e. nonplanar, probe spring 61. In some embodiments of the probe springs, the plating layer 402 provides enhanced spring force, increased abrasion resistance, increased strength, and/or increased electrical conductivity. In some of the embodiments, a plurality of films comprising different materials, such as nickel, palladium alloy such as palladium colbalt, Rh, Au, is plated sequentially onto the lifted fingers.

In alternate embodiments of the probe spring 61, 412, the spring tip may further comprise a secondary contact tip detail, i.e. a spring tip button contact, typically comprising rhodium, palladium or cobalt, as disclosed in Provisional Application Ser. No. 60/365,625, Filed 18 Mar. 2002, Nanospring with Increased Resistance to Failure, the disclosure of which is incorporated herein by reference.

Probe Chip Component Functions. On the probe side 62a of the probe chip substrate 372, the probe chip 16, 310 supports the probe springs, such as photolithographically defined springs 61, for contact to a wafer under test 92. The probe chip 16, 310 provides signal and power fan-out to a grid achievable by the thick motherboard PWB 304, such as seen in FIG. 40. As seen in FIG. 44 and FIG. 45, the probe chip 16, 310 provides signal connections through the substrate 372, to a matrix of pads or solder balls 398 on the connection surface 62b, typically at a pitch matrix that matches the PTH matrix pitch on the motherboard 304.

The probe chip 16, 310 also preferably provides controlled impedance to the fanout traces 307 (FIG. 40), and preferably provides regions to mount bypass capacitors, such as on the connector surface 311b of the probe chip 16, 310.

Some preferred embodiments of the probe chip 16,310 comprise two or more electrically conducting vias 374 per electrical path, so as to increase manufacturing yield through redundancy. Similarly, some preferred embodiments of the probe chip comprise two or more probe springs 61 per electrical path (FIG. 9).

Probe Card Assembly Sequence. As seen in FIG. 43, the enhanced probe card assembly 310 is readily assembled to provide enhanced connections to one or more devices under test on a wafer 92.

In an exemplary assembly process, as seen in FIG. 43, the motherboard PWB 304 is attached to the top stiffener plate 302, typically using fasteners, such as screws 324, forming a first sub-assembly 361a. In some embodiments, the hole 309 could be a through hole, and the top stiffner plate with a larger dimension is attached to the mother board using a pin inserted into the through hole (not shown).

A second sub-assembly 361b is typically formed by pushing alignment pins 330, 350 into the Z-block PWB 342, and by attaching the Z-block 342 into the bottom stiffener ring 346, such as by alignment pins 350, Z-block retaining clip rings 352, and screws 353.

The second sub-assembly 361b is then typically placed on a temporary support structure, such that the top interposer 344 is controllably placed onto the Z-block 342, and aligned with the interposer alignment pins 333. Small blind holes (not shown) are provided in the motherboard PWB 304, corresponding to the pins 333, to make room for the insertion of the exposed sections of the pins.

The first sub-assembly 361a is then placed over the second sub-assembly 361b, while aligning the stiffener ring alignment pins 354 on the top surface 347b (FIG. 43) of the stiffener ring 346 (FIG. 43) to alignment holes 309 (FIG. 43) defined on the lower surface 305a (FIG. 43) of the motherboard PWB 304 (FIG. 43), and while gently compressing the top interposer springs on the top interposer 344. The first sub-assembly 361a and the second sub-assembly 361b are then secured together, such as by screws 834 (FIG. 75), forming a third sub-assembly 361c.

The third sub-assembly 361c is then typically turned over and placed onto a second temporary support structure, such that the bottom interposer 348 is controllably placed onto the lower surface 343a of the Z-block 342, and aligned with the interposer alignment pins 330. The decal subassembly 361d is then positioned onto the bottom interposer 348, which in some embodiments is guided by the alignment pins 354. The use of a temporary assembly support fixture ensures alignment between the sub-assemblies 361c, 361d, and allows the decal assembly 361d to be lowered gently onto the interposer 348, such that the outer ring 328 is then further compressed, to contact the bottom stiffener 346, while stretching the membrane 326. The assembly fixture holds the ring 328 in place, while fasteners 356 are tightened.

It should be appreciated that the descriptions for the assembly given above is for a typical embodiment. Some variations in the assembly fixture and process, which are based on the basic conception outlined above are within the scope of this invention. For example, the interposers 348 or 344 may not be required to have any holes as shown in FIG. 43. Instead, a number of additional pins such as 333 or 330 may be provided to hold the interposers in place. Similarly, the outer ring 328 in FIG. 43 may preferably be placed above the membrane 326.

Figure 46:
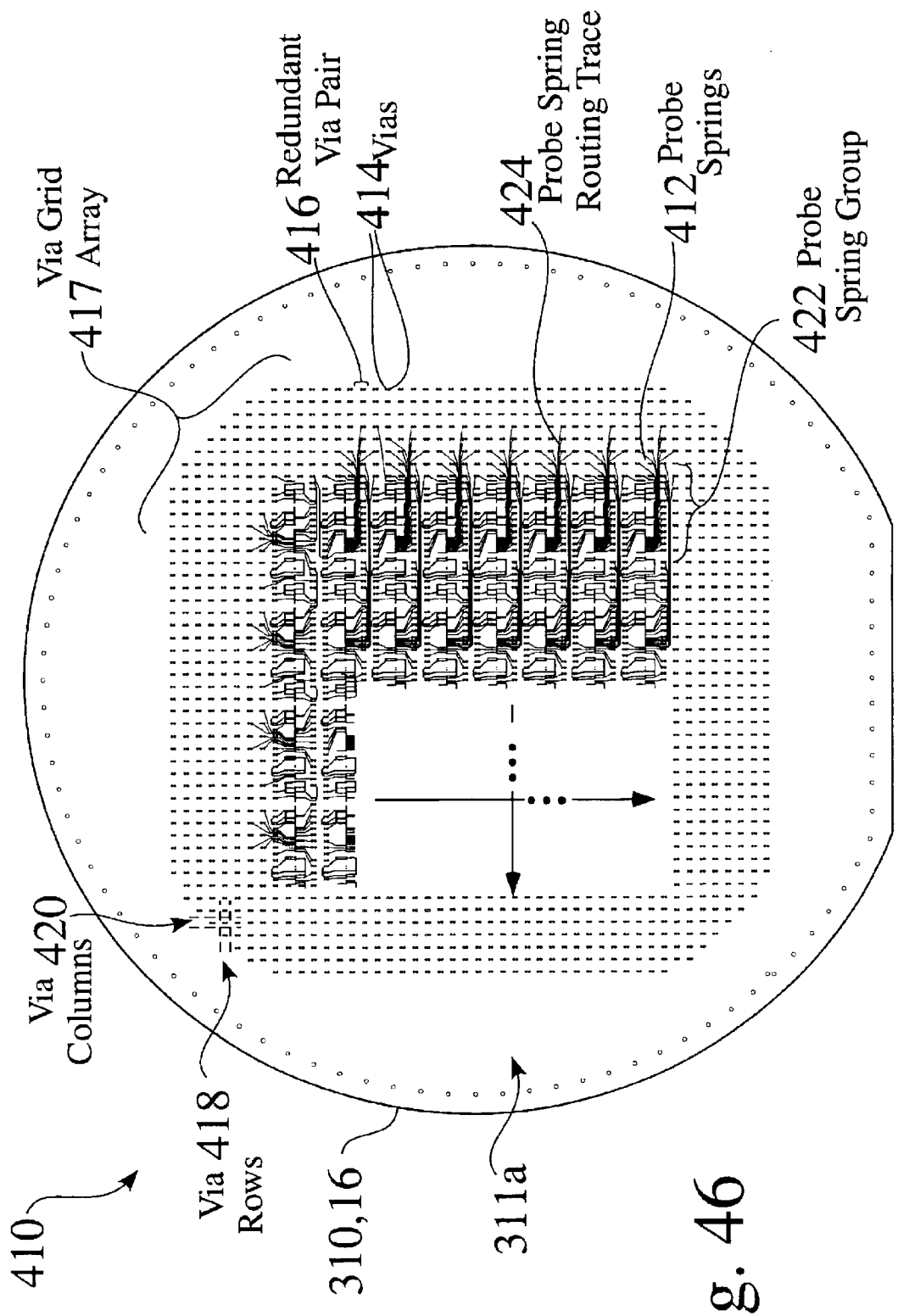
FIG. 46 is a plan view of a spring side surface of a probe chip.
Figure 47:
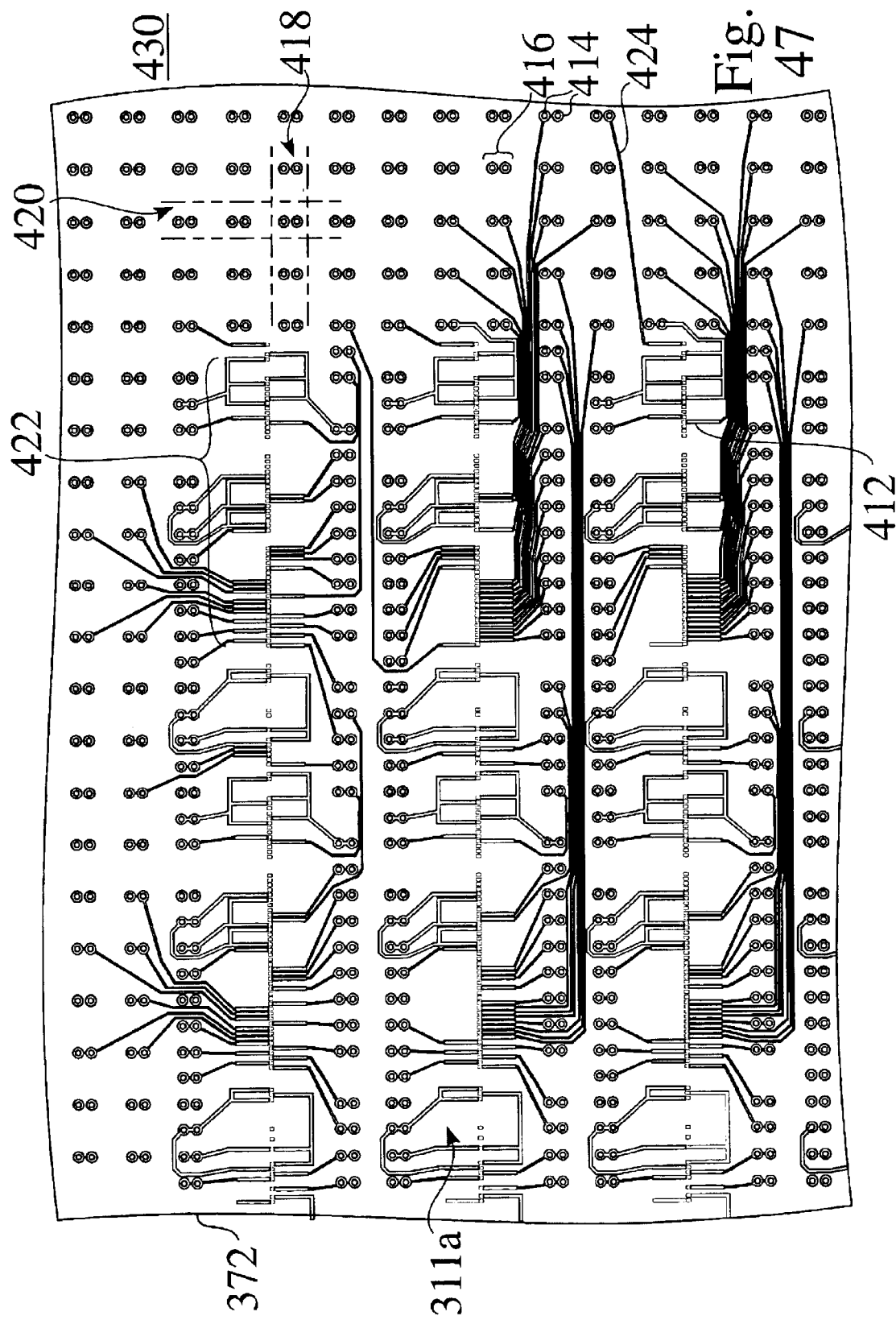
FIG. 47 is a detailed partial layout view of a spring side surface of a probe chip.

Probe Chip Structure Details. FIG. 46 is a plan view 410 of a spring side surface 311a of a probe chip 16, 310. FIG. 47 is a detailed partial layout view 430 of a spring side surface 311a of a probe chip 16, 310. Probe chip probe springs 412, such as photlithographically formed probe springs 61a–61n, are generally arranged within probe spring groups 422, to provide a plurality of connections to one or more devices 44 on a wafer under test 92. The probe springs 412, such as photlithographically formed probe springs 61a–61n match contact pads 47 on a target wafer 92. The exemplary arrangement of probe spring groups 422 shown in FIG. 46 is a 4×8 set of spring groups 422, for contacting thirty two die positions in parallel.

Vias 414 extend through the probe chip substrate 372, from the spring side surface 311a to the connector, i.e. interposer, side surface 311b. The vias are preferably arranged in redundant via pairs 416, such as to increase the manufacturing yield of the probe chip 16, 310, and/or to promote electrical conduction, particularly for power traces. The via pairs 416 shown in FIG. 46 and FIG. 47 are arranged in a via grid array 417, comprising via rows 418 and via columns 420. The via grid array 417 preferably matches the plated through hole (PTH) grid on the motherboard 304. Where springs 412 coincide with vias 414, 416, the vias 414, 416 are moved to an adjacent row 418, and the traces 424 are typically routed to where the original vias 414, 416 would have been located, on the opposite interposer side 311b of the probe chip 16, 310.

Figure 48:
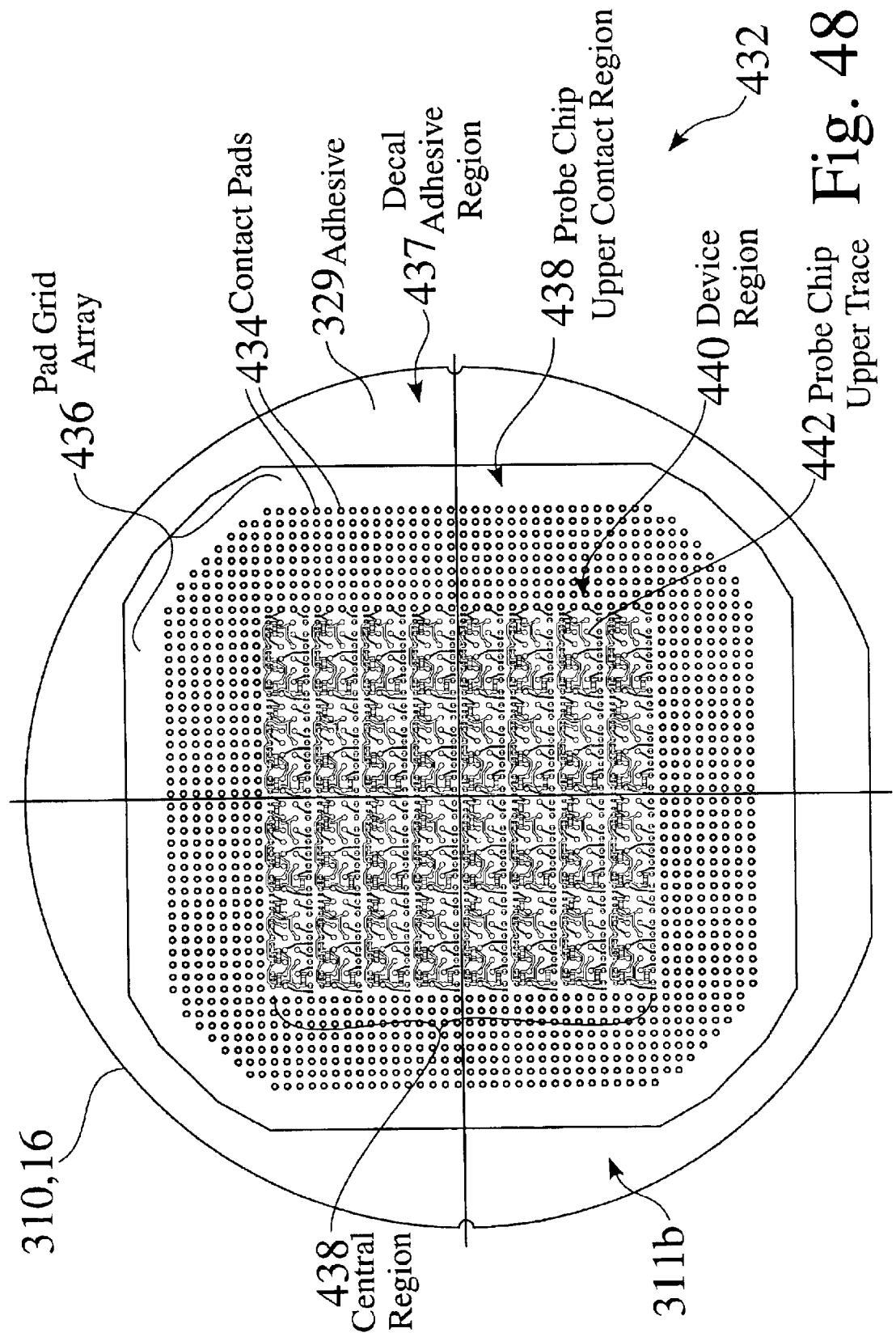
FIG. 48 is a plan view of an interposer side surface of a probe chip.
Figure 49:
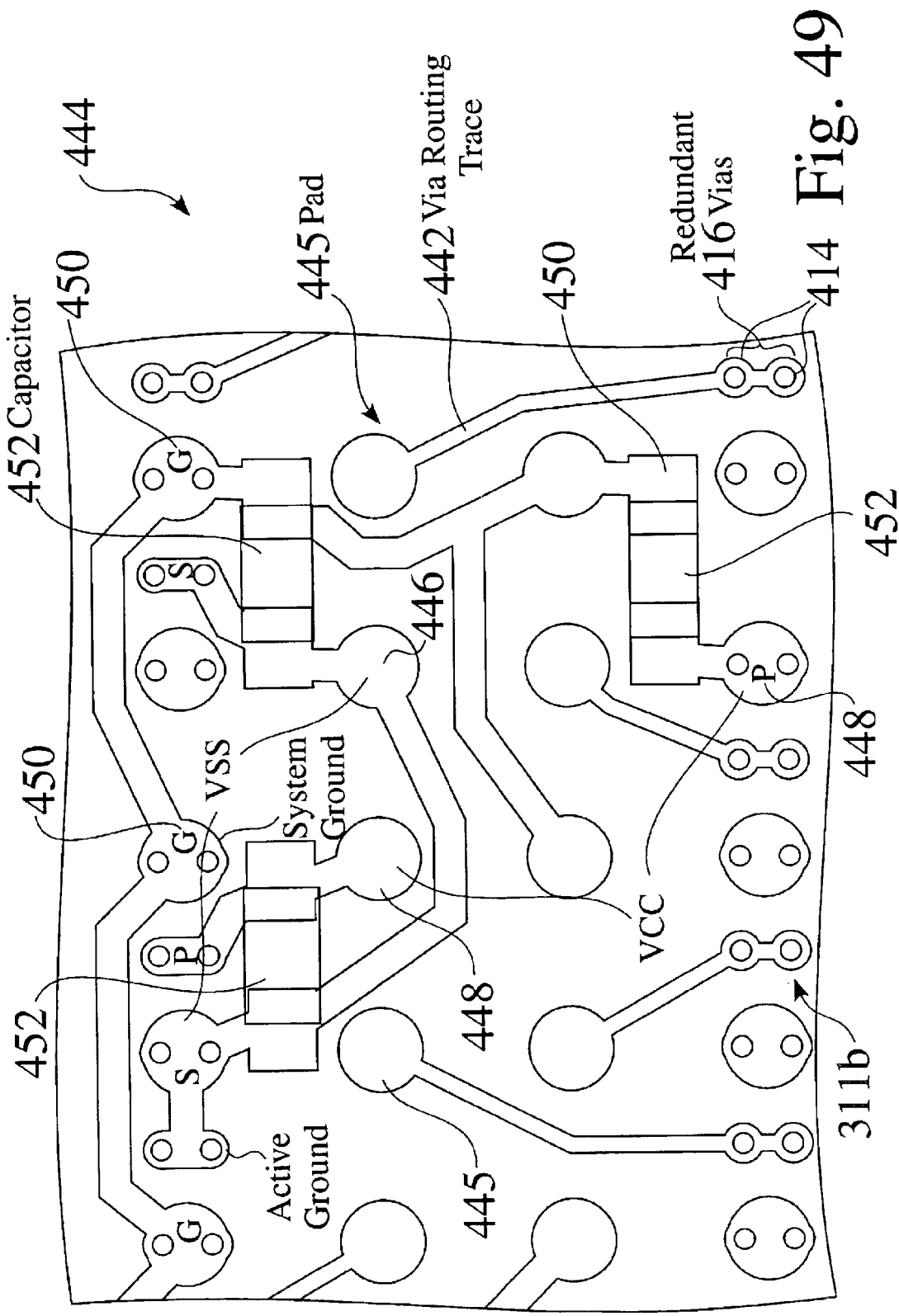
FIG. 49 is a detailed partial layout view of an interposer surface of a probe chip.

FIG. 48 is a plan view 432 of an interposer side surface 311b of a probe chip 16,310. FIG. 49 is a detailed partial layout view 444 of an interposer surface 311b of a probe chip 16, 310. Contact pads 434 are located on the interposer side surface 311b, and are typically arranged in a pad grid array 436, which generally coincide with the vias 214 (FIG. 49), preferably arranged in redundant via pairs 416, such as to provide electrical contacts to an interposer 348. In some embodiments of the probe chip 16, 310, the pad grid array 436 has a pitch of 0.056", to match a similar contact pitch on a connected interposer 348. As seen in FIG. 48, a central region 438 is generally defined within the interposer side surface 311b, wherein contact pads 434 and probe chip upper traces 442 are typically arranged in device regions 440.

An adhesive region 437 is located along the outer periphery of the interposer side surface 311b of the probe chip 16, 310, whereby an adhesive 329 is attached or applied between the probe chip 16, 310 and a compliant member or decal 326.

As seen in FIG. 49, the interposer side surface 62b, 311b of the probe chip 16,310 provides signal contacts 445, active ground contacts 446 (S) power contacts (P) 448, and ground contacts 450 (G). The traces 442 provide routing of the contacts 445, 446, 448, and/or 450, to allow relocation of vias 414, 416, such as due to any conflict of spring location with the vias 414, 416. The probe chip 16, 310 shown in FIG. 48 and FIG. 49 further comprises capacitors 452, such as between an active ground 446 and a power contact 448, between an active ground 446 and a ground contact 450, and/or between a power contact 448 and a ground contact 450.

Figure 50:
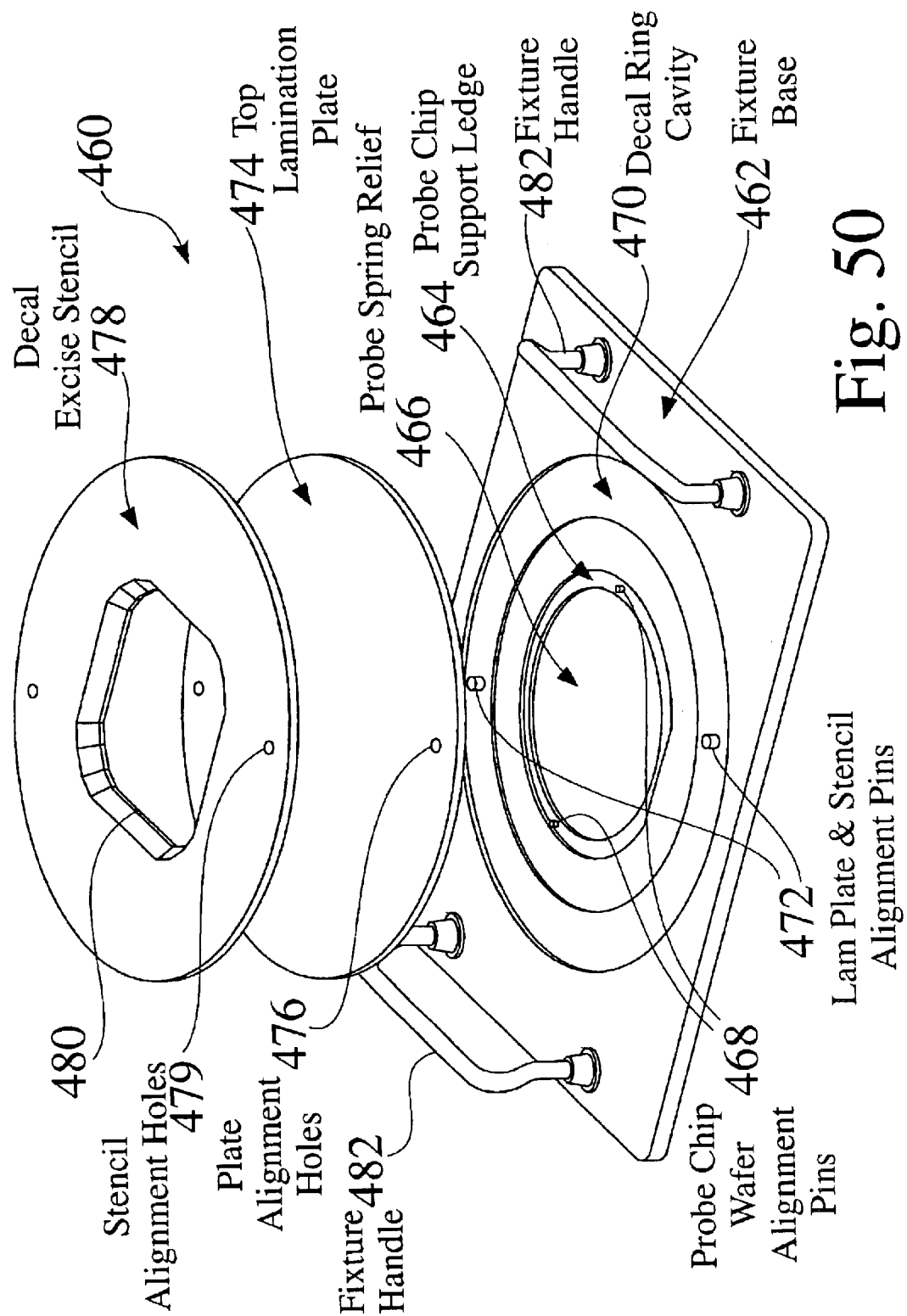
FIG. 50 is an expanded assembly view of a decal to probe chip assembly fixture.

Probe Chip Assembly Structure. FIG. 50 is an expanded assembly view of a decal to probe chip assembly fixture 460. A fixture base 462 comprises a probe chip ledge 464 surrounding an inner probe spring relief region 466. One or more probe chip wafer alignment pins 468 are typically located on the probe chip ledge 464, to accurately receive a probe chip 16, 310. The fixture base 462 similarly comprises a decal ring cavity 470 surrounding the probe chip ledge 464.

One or more lamination plate and stencil alignment pins 472 are typically located on the decal ring cavity 470, to accurately receive either a top lamination plate 474, having matching plate alignment holes 476, or a decal excise stencil 478, having stencil alignment holes 479. As described below, the top lamination plate 474 is used during lamination of the compliant member 326 to the probe chip 16, 310, such as with an adhesive 329.

The decal excise stencil 478 further comprises a stencil template opening 480. When the decal excise stencil 478 is positioned on the fixture base 462 over an assembly comprising a probe chip 310 adhesively mounted to a compliant member or decal 326, the stencil template opening 480 is generally aligned about the outer adhesive region of the probe chip 310, such that cutting and removal of the inner region of the decal 326 provides access to the surface of the probe chip 16, 310.

Figure 51:
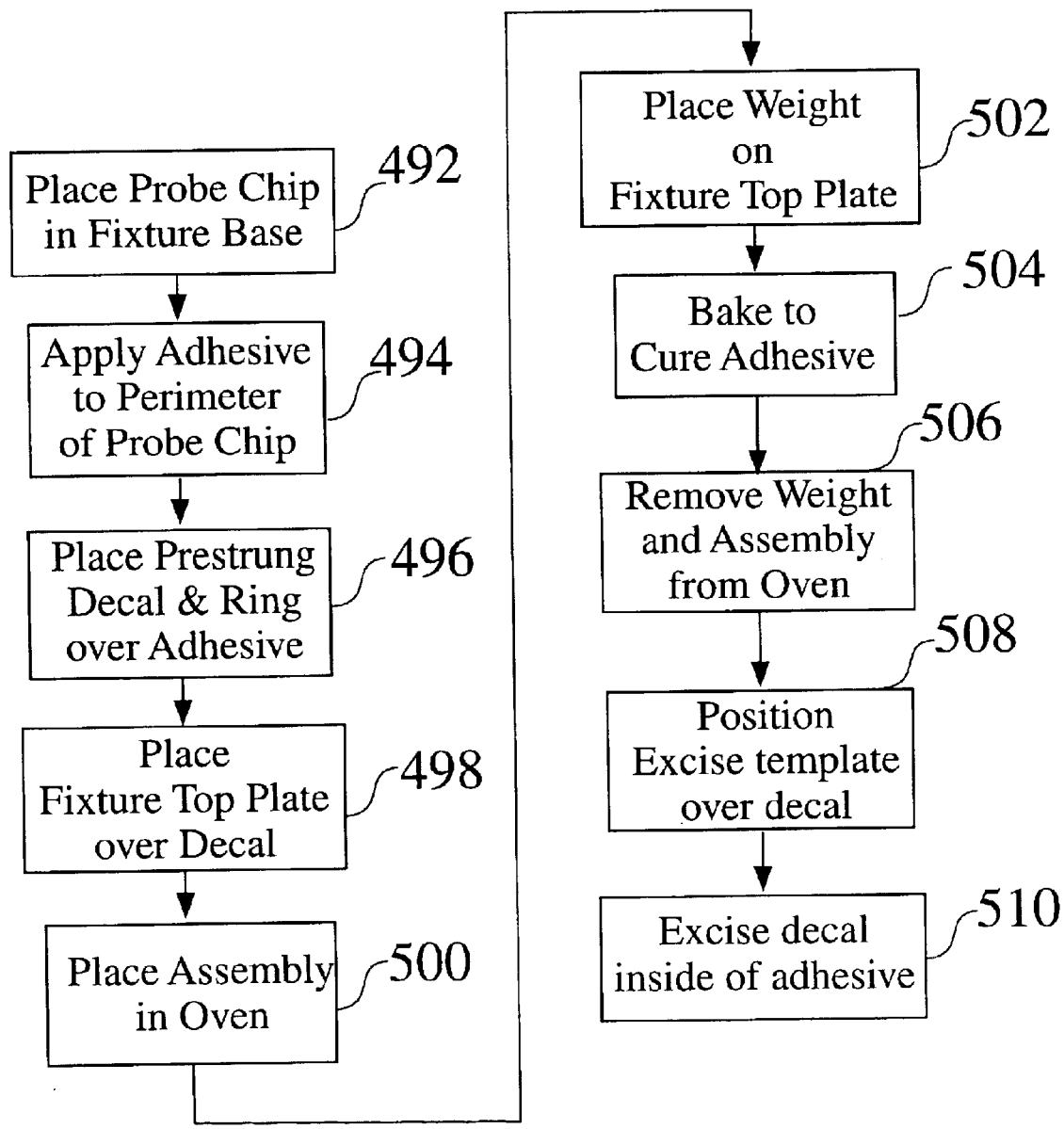
FIG. 51 is a flow chart of a decal probe chip assembly process.

Decal Assembly Sequence. FIG. 51 is a flowchart showing a decal probe chip assembly process 490. A completed probe chip 310 (lifted 402 and plated 404) is placed 492 face down onto the bottom plate 462 of the lamination fixture 460, which supports the probe chip 310 under the adhesive region only. A cavity 466 is provided to protect the springs 61. The probe chip 310 is aligned to alignment pins 468 on the fixture base 462.

An adhesive sheet 329 (FIG. 43) which is preferably pre-cut to the shape of the desired adhesive region on the probe chip 16, 310 is then applied 494 to the perimeter of the probe chip 16, 310. The adhesive sheet 329 is aligned to the features on the probe chip 16, 310, and is then typically tacked with a hot iron. In one embodiment of the assembly 300, the adhesive sheet 329 is a B-stage adhesive sheet 329.

A compliant member or decal 326, which has been pre-strung to a specified tension and attached on the decal ring 328, is then placed 496 on the fixture 462 over the adhesive 329. In some embodiments of the lamination fixture 460, the ring side of the decal 326 is placed side up within the fixture 460. In alternate embodiments of the lamination fixture 460, the ring side of the decal 326 is placed side down within the fixture 460. The decal ring 328 is aligned to the fixture 462 using the alignment pins 472.

The fixture top plate 474 is then placed 498 over the decal 326, which compresses the decal 326 against the adhesive sheet 329, while held in place via the alignment pins 472 to the fixture base 462.

The assembly fixture 460 is then used to cure the adhesive 329, which typically comprises the steps of placing 500 the assembly 460 into an oven, placing 502 a weight or other compressive force on the fixture top plate 474, baking 504 to cure the adhesive 329, and removing 506 the weight and assembly 460 from the oven.

Removal of the inner portion of the compliant decal 326 comprises the placement 508 of the decal excise template 478 over decal 326. The decal excise template 478 is aligned to alignment pins 472 on the fixture bottom plate. The inner portion of the decal 326, i.e. inside the adhesive area 319, is then separated or excised 510 with a knife.

Figure 52:
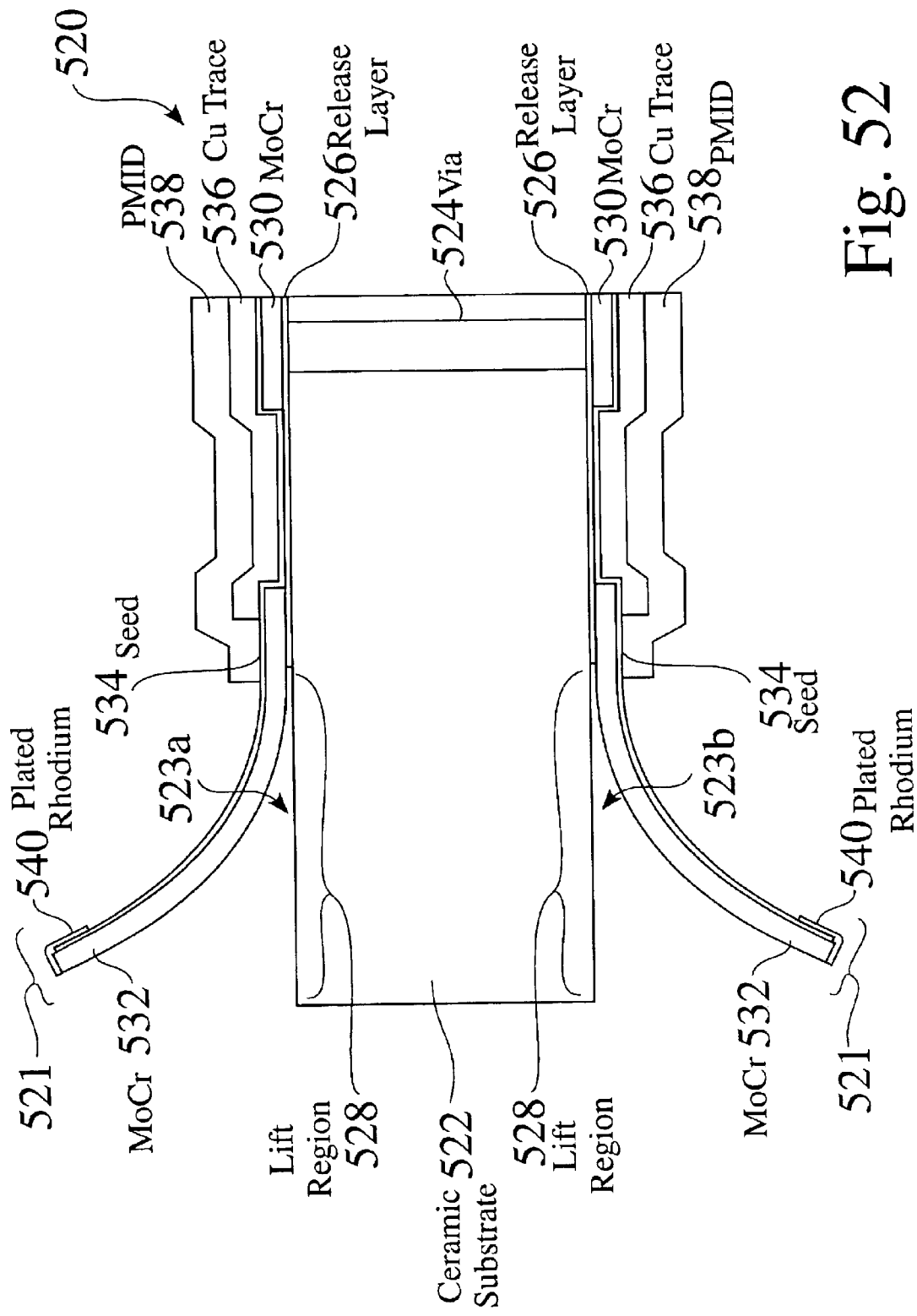
FIG. 52 is a partial cross sectional view of an interposer structure.

Interposer Structures. FIG. 52 is a partial cross sectional view of an interposer structure 520, such as for a top interposer 344 or a bottom interposer 348.

Interposer springs 521, such as photolithographically formed probe springs 521, are generally arranged within an interposer grid array, to provide a plurality of standardized connections. For example, in the top interposer 344 shown in FIG. 43, the interposer springs 521 provide connections between a motherboard 304 and a Z-block 342. Similarly, in the bottom interposer 348 shown in FIG. 43, the interposer springs 521 provide connections between the Z-block 342 and the probe chip 16,310.

Interposer vias 524 extend through the interposer substrate 522, from the first surface 523a to the second surface 523b. The interposer vias 524 are preferably arranged in redundant via pairs, such as to increase the manufacturing yield of the interposer 520, 344, 348, and/or to promote electrical conduction, particularly for power traces.

The opposing surfaces 523a, 523b are typically comprised of a release layer 526, such as comprising titanium, and a composite layer 530, 532, typically comprising a plurality of conductive layers having different inherent levels of stress. Interposer vias 524, e.g. such as CuW or gold filled, extend through the central substrate 522, typically ceramic, and provide an electrically conductive connection between the release layers 526. The composite layer 530, 532 typically comprises MoCr, in which the interposer probe springs 521 are patterned and subsequently to be later released within a release region 528.

A seed layer 534, such as a 0.5 to 1 um thick gold layer, is preferably formed over the composite layers 530, 532. A tip coating 540, such as rhodium or palladium alloy, is controllably formed at least over the tips of spring fingers 532, such as to provide wear durability and/or contact reliability. Traces 536, typically comprising copper, are selectably formed by plating over the structure 520, as shown, such as to provide reduced resistance. As well polyimide PMID layers 538 are typically formed over the structure 520, as shown, to define the spring finger lift regions. A thick gold layer 534 remains on the lifted fingers 521, so as to reduce sheet resistance of the fingers 521.

Figure 53:
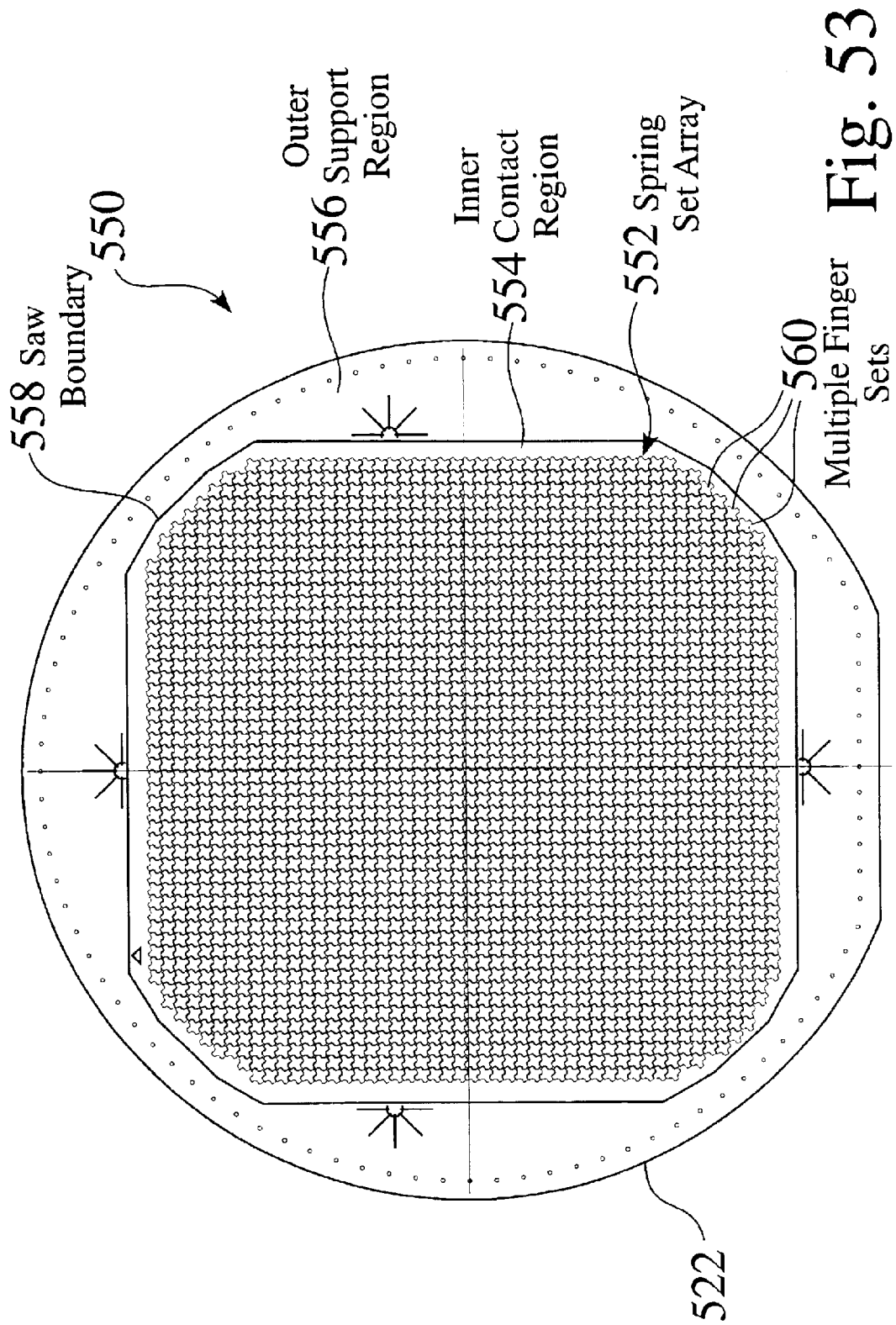
FIG. 53 is a plan layout view of an interposer.
Figure 54:
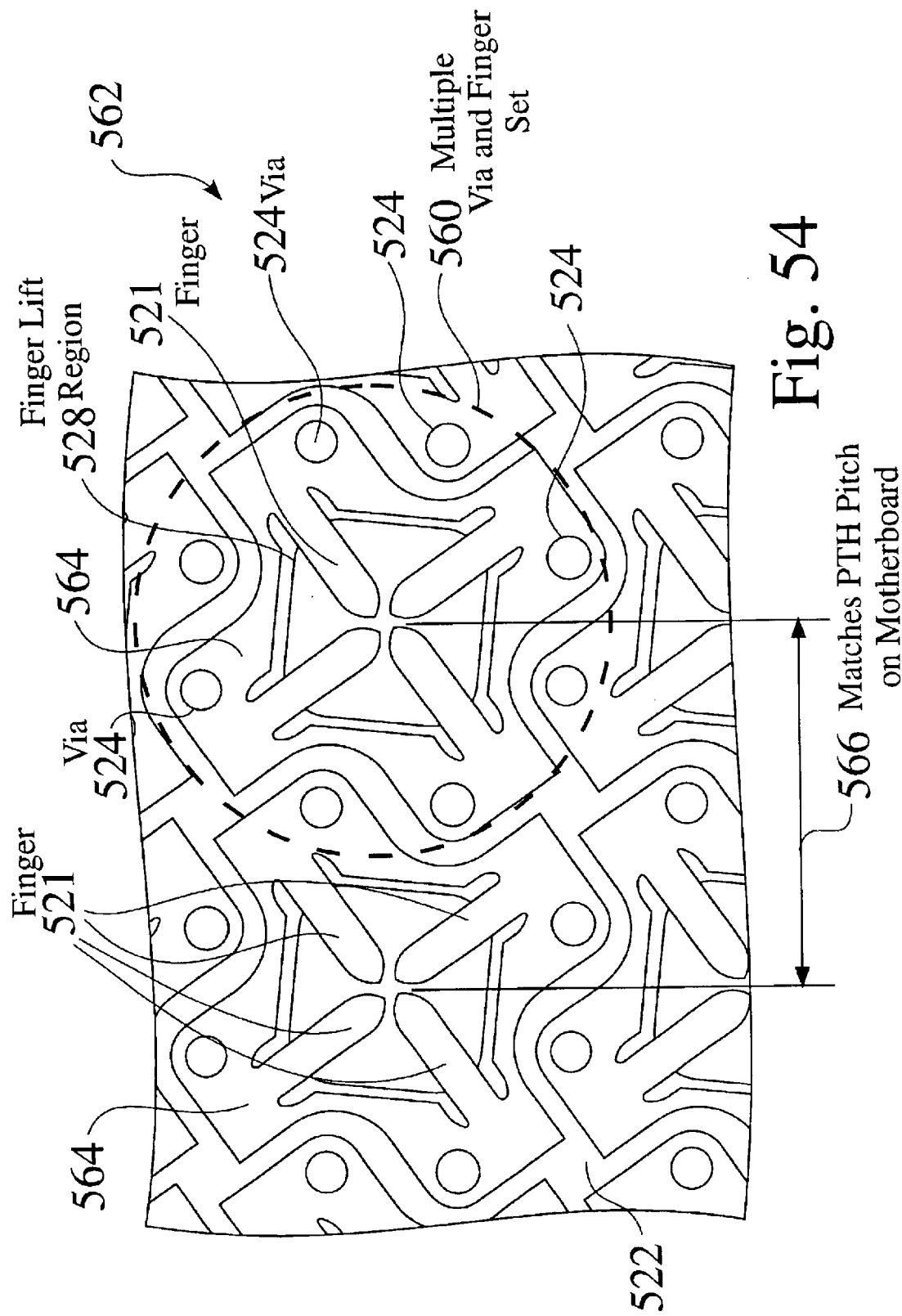
FIG. 54 is a partial detailed layout view of an interposer.

FIG. 53 is a plan layout view 550 of a interposer 520. A spring set array 552 is located within an inner contact region 554 of the interposer substrate 522, and comprises a plurality of multiple finger sets 560, which preferably provide redundancy of connections through a plurality of finger springs 521 (FIG. 52, FIG. 54), as well through a plurality of redundant interposer vias 524, as seen in FIG. 52 and FIG. 54. An outer support region 556 is located about the periphery of the interposer substrate 522. The inner contact region 554 of the interposer substrate 522 is located within the defined saw boundary 558.

FIG. 54 is a partial detailed layout view 562 of an interposer 520. The multiple finger sets 560 are preferably arranged on the interposer substrate on a pitch 566, which preferably matches the corresponding connection pitch on the motherboard 304. Each of the multiple finger sets comprise a common conductive region 564, from which a plurality of redundant spring fingers 521 are formed, which extend from the substrate 522 over a lift region 528. A plurality of redundant interposer vias 524 are electrically connected to the common conductive region 564, and extend through the interposer substrate 522, such as from a first surface 523a to an opposing surface 523b (FIG. 52). In the interposer 520 shown in FIG. 54, each multiple finger set 560 comprises four redundant fingers 521 and four redundant interposer vias 524. In alternate interposers 520, any number of redundant fingers 521 and/or interposer vias 524 may be provided, e.g. such as two or three fingers 521 and/or interposer vias 524. While the multiple finger sets 560 shown in FIG. 54 are generally arranged in a clover or cross configuration, a wide variety of geometries may be suitably used.

Figure 55:
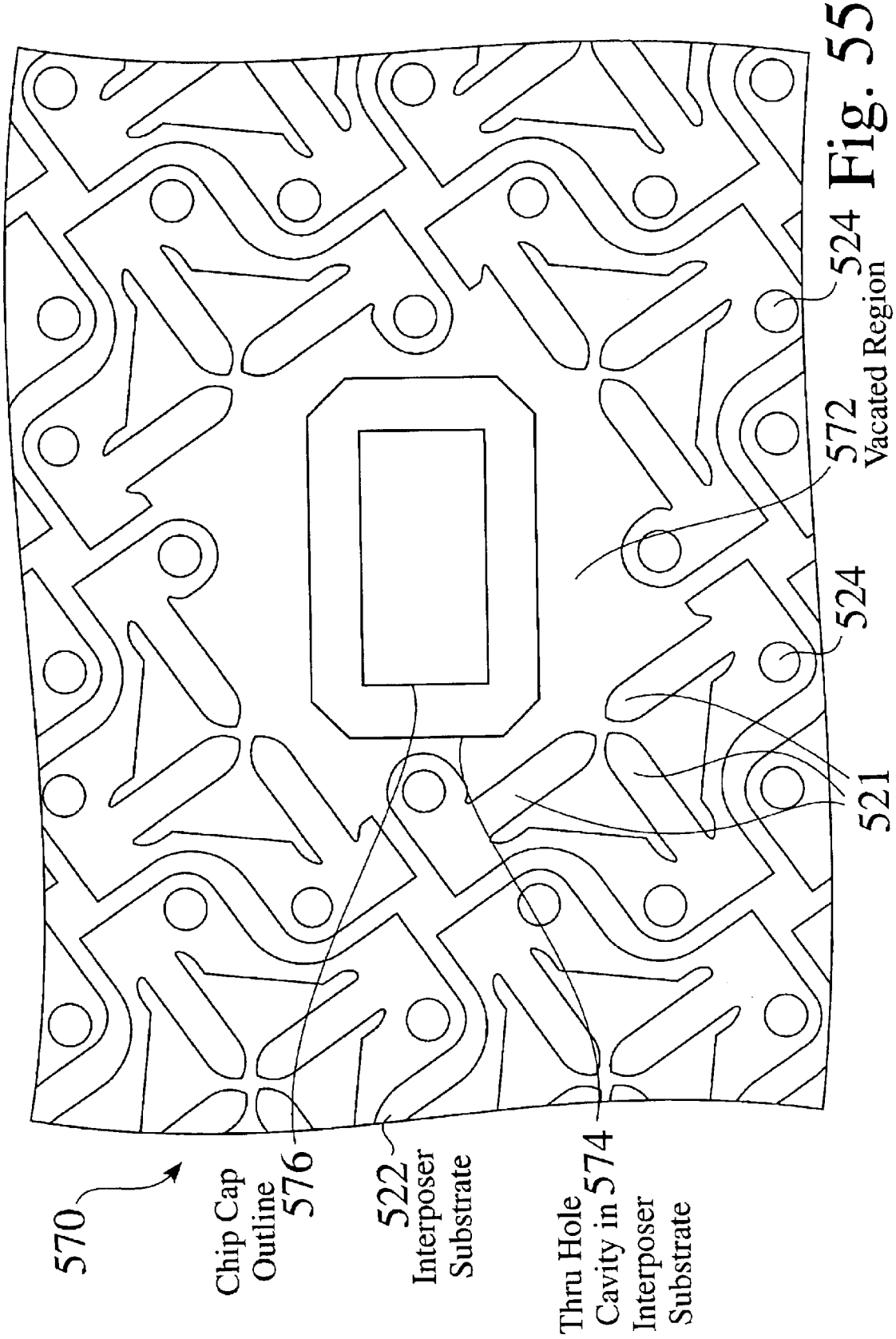
FIG. 55 is a partial plan view of an interposer having vacated springs within a capacitor cavity region.
Figure 56:
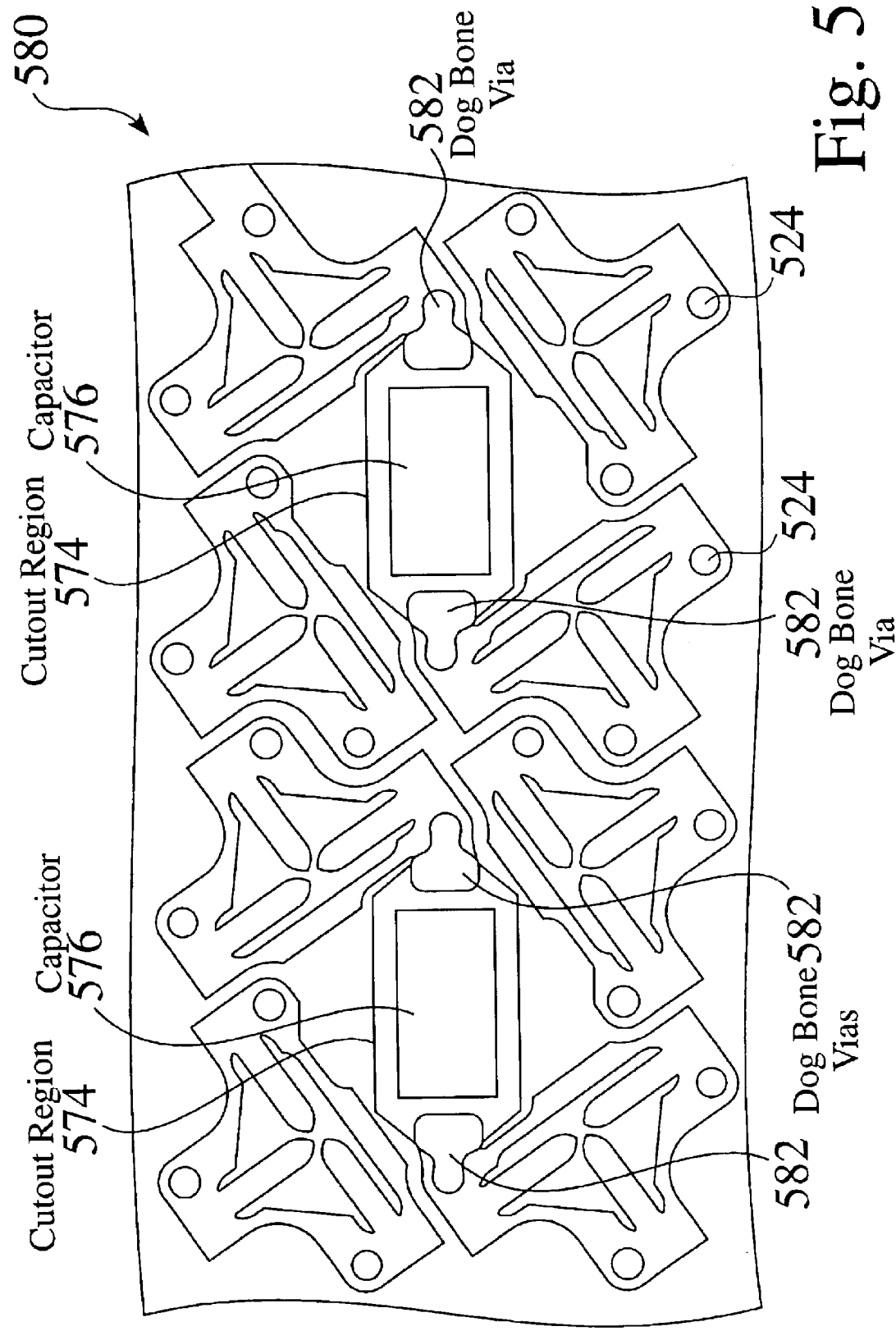
FIG. 56 is a partial plan view of an alternate interposer having embedded bypass capacitors and dog bone vias.

Some embodiments of the interposer 520 comprise integrated capacitors 576, which are typically smaller in thickness than the thickness of the interposer substrate 522. FIG. 55 is a partial plan view 570 of an interposer 520 having vacated springs within a capacitor cavity region 574. FIG. 56 is a partial plan view 580 of an interposer 520 having embedded bypass capacitors 576. The multiple finger sets 560 are readily arranged or modified to provide vacated regions 572, within which thru hole cavities or cut-out regions 574 are located. As seen in FIG. 56, vias 582, e.g. such as dog bone vias 582, provide electrical contacts between multiple finger sets 560 and the embedded capacitors 576. The material which comprises the dog bone vias 582 is not effected by laser during substrate cut. The exposed via surface is preferably treated by plating, to provide a suitable surface for a conductive epoxy or solder connection to the capacitor 576.

Before finger lift, an adhesive tape is applied to one side 523 of the interposer substrate 522. The capacitors 576 are picked and placed into the cavities 574 from the opposite side 523, e.g. 523b, of the substrate 522, and are temporarily held in place by the adhesive tape. Epoxy is then dispensed to either end, to complete contact between the capacitors 576 and the dog bone vias 582. The epoxy is then cured, after which the adhesive tape is removed. The fingers 521 are then lifted from the substrate 522.

Figure 57:
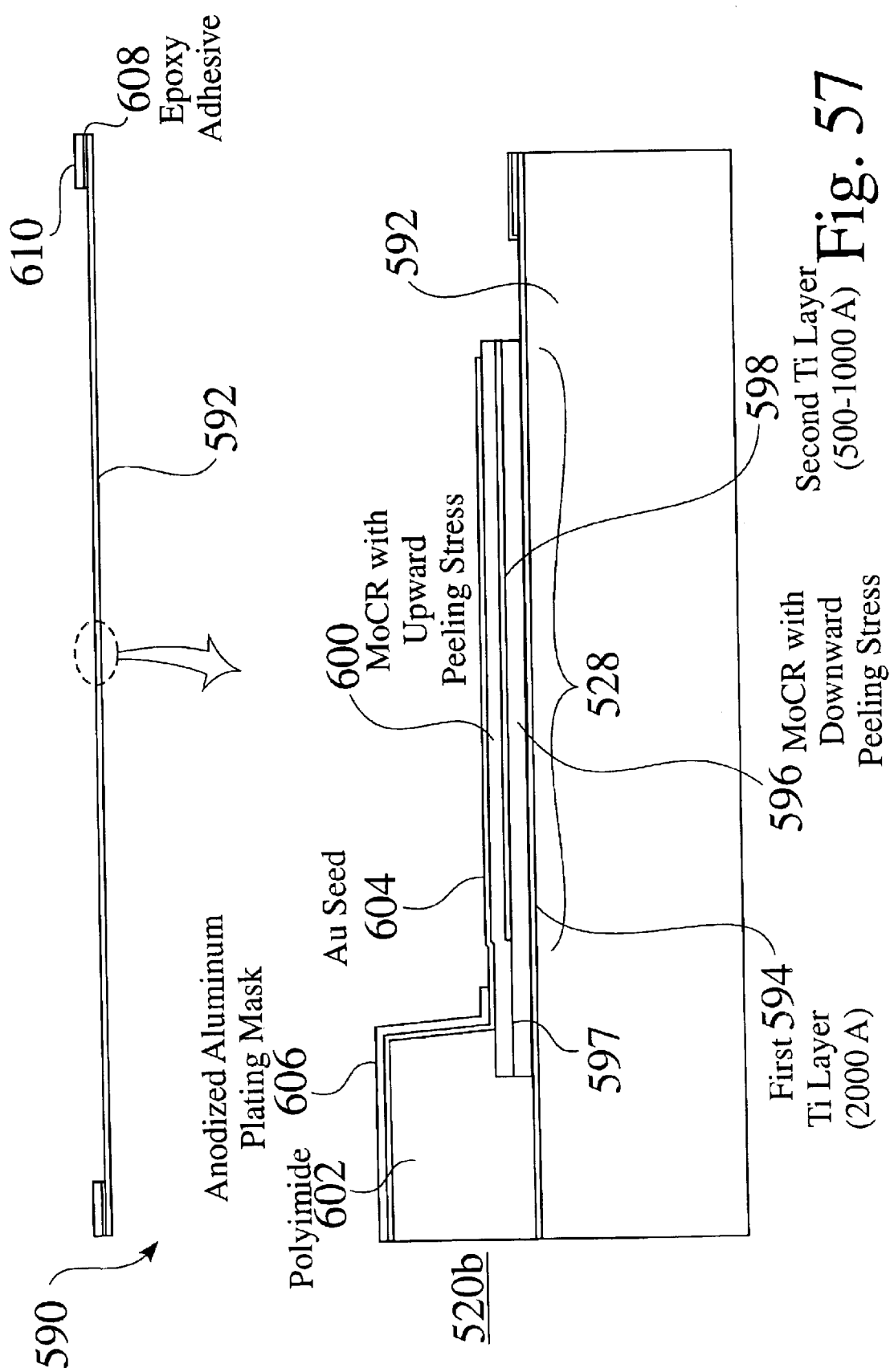
FIG. 57 is a partial cross sectional view of an alternate decal interposer structure before spring lift.
Figure 58:
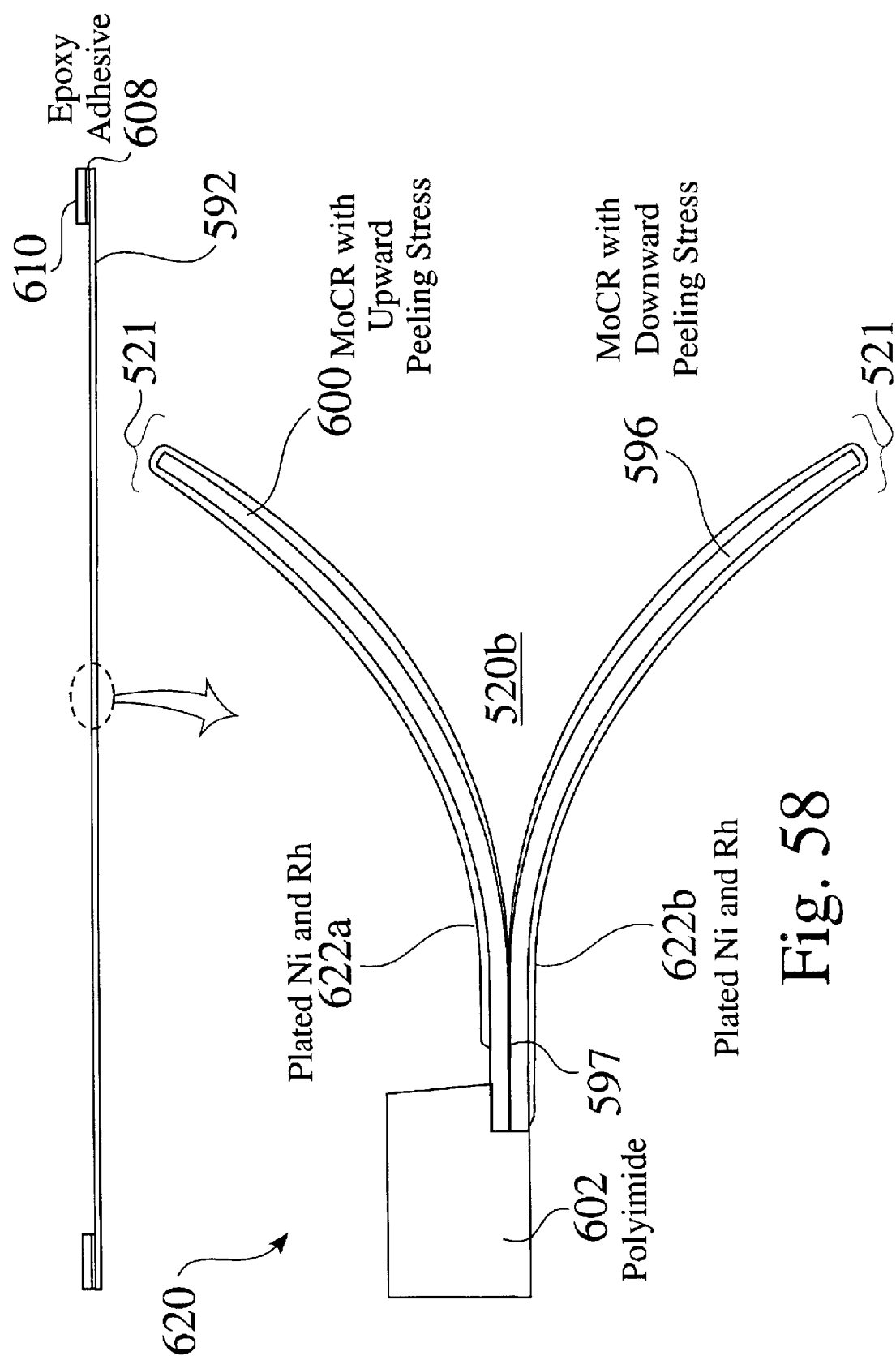
FIG. 58 is a partial cross sectional view of an alternate decal interposer structure after spring lift.

Alternate Interposer Structures & Processes. FIG. 57 is a partial cross sectional view 590 of an alternate decal interposer structure 520b before spring lift. FIG. 58 is a partial cross sectional view 620 of an alternate decal interposer structure 520b after spring lift.

The alternate decal interposer structure 520b comprises pairs of oppositely pointing springs 521 that are joined at the base, and are attached to the edge of an opening in a membrane 602 which in turn is supported like a drum inside a support frame 610. The spring pair 521 extends away from the plane of the membrane 602 protruding through the hole in the membrane 602. The membrane 602 is preferably held under tension inside the frame 610, such that the locations of the spring pairs 521 are held constant.

This interposer structure 520b has the advantage that it does not require a substrate with vias and also that fingers 520 from both sides can be patterned with a singe photolithographic step, thus greatly lowering the fabrication cost. In addition, in embodiments where the alternate interposer 520 is used to interface between the connector side 62b of a probe chip 310 and a PWB board 304 where there are passive components, such as bypass capacitors, mounted on the connector side 62b of the probe chip 310, openings for the components to protrude through the interposer 520 can be easily provided in the photolithographic steps to pattern the membrane 602 and not requiring an expensive laser step to drill holes in the interposer substrate 602.

Being suspended on a flexible membrane 602, the alternate interposer 520b can also be used in applications where the interfacing surfaces are not flat. Also, the thickness of an alternate interposer 520b as a connector can be as small as several microns. The alternate interposer 520b can also have a much smaller connector pitch, since the alternate interposer 520b is not confined by the via pitch of the probe chip substrate 310. The pitch can be as small as the photolithographic process can pattern the springs. Unreleased portions of the metal can also be patterned on the membrane 602 to form interconnect as well. The support frame 610 can also be bent if it is made of a ductile material such as metal. This allows the membrane interposer 520b to be shaped into infinite topological shapes.

Figure 59:
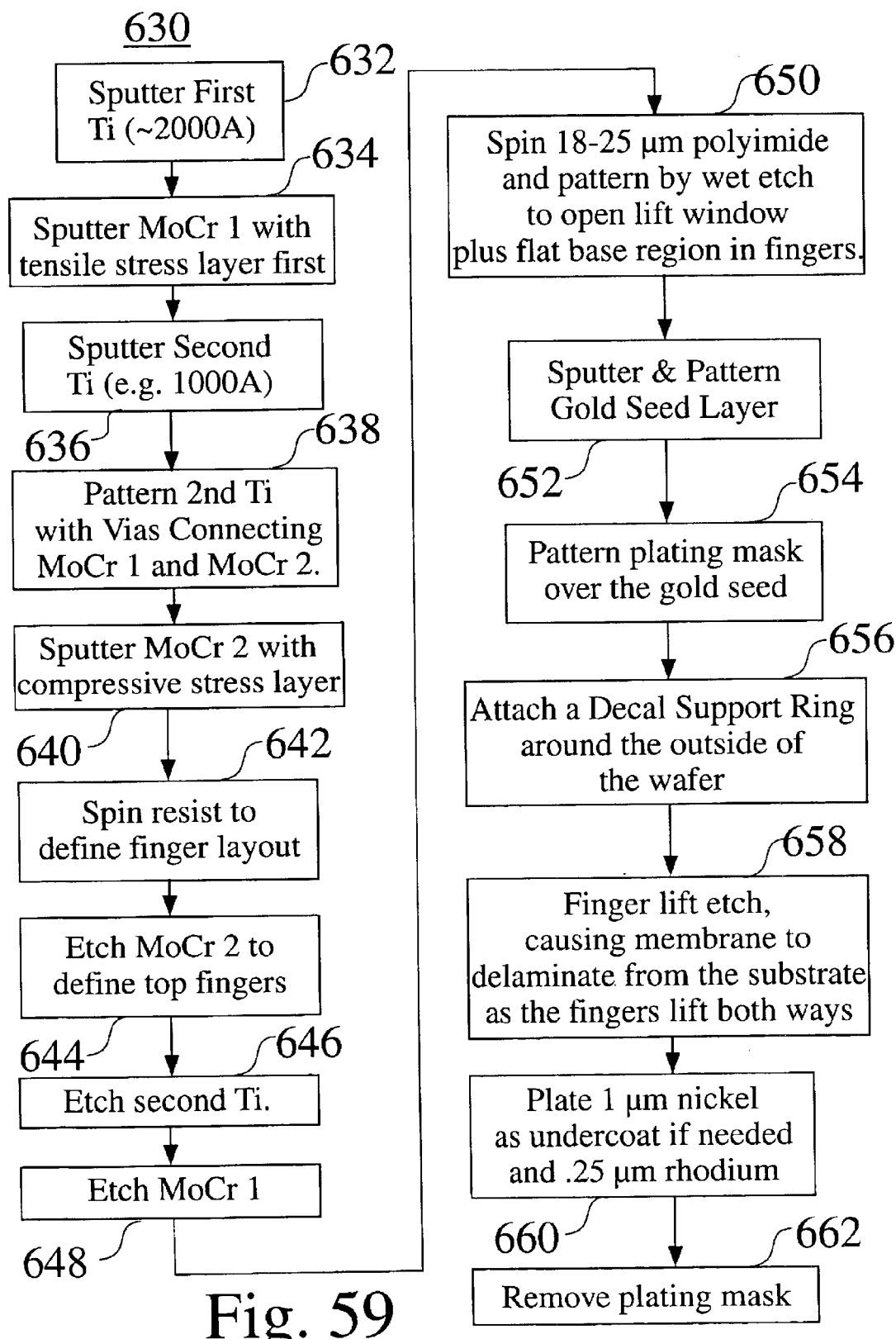
FIG. 59 is a flow chart showing an exemplary interposer construction process.

FIG. 59 is a flow chart showing an exemplary interposer construction process 550. A first release layer 594, typically comprising titanium, having an approximate thickness of 2,000 angstroms, is formed 622 by sputtering on a substrate 592, which typically comprises silicon, aluminum, ceramic, or glass. A MoCr stressed sandwich layer 596, comprising a plurality of stress layers 17a–17n, such as seen in FIG. 37 and/or FIG. 38, having a resultant downward peeling stress, is sputter formed 634 on the first release layer 594. The plurality of stress layers 17a–17n in the first stressed sandwich layer 596 typically comprises a first tensile layer 17a, and a final compressive layer 17n, to provide an inherent stress gradient comprising a downward peeling stress.

A second layer 598, typically comprising titanium, is formed on top of the first stress sandwich, comprising a pattern which defines the region of the fingers that will lift away from each other. Note that there is a region 597 of the finger where this release layer is removed. This region 597 forms the contact region between the top and bottom finger 521. The second release layer 598, typically having an approximate thickness of 1,000 angstroms, is sputter formed 636 and patterned 638, with connection regions 597 that generally define the end of the finger lift regions 528. A second MoCr layer 600 is sputter formed 640 on the second release layer 598, comprising a plurality of stress layers 17a–17n, such as seen in FIG. 37 and/or FIG. 38, having a resultant upward peeling stress. The plurality of stress layers 17a–17n in the second stressed sandwich layer 600 typically comprises a first compressive layer 17a, and a final tensile layer 17n, to provide an inherent stress gradient comprising an upward, i.e. opposing, peeling stress.

Photoresist is then spun 642 to define the finger layout for the springs 521, and the second MoCr layer 600 is etched 644, such as by either a wet or dry etch process, to open regions where the springs 521 will lift, as well as any other regions where a hole is desired in the membrane, such as for mating components to protrude through. The second release layer 598 is then etched 646, and the first MoCr tensile stress layer 596 is etched 648, such as to allow the fingers 521 in the first MoCr layer 596 to be more undercut, while the first release layer 594 is left to overhang.

A polyimide layer 602, of an exemplary thickness of 18 μm to 25 μm, is spun and patterned 650 by a wet etch process, to open the lift window and the flat base region in the fingers 521. A seed layer 604, typically comprising gold, is then sputtered and patterned 652, to provide shorts between all fingers 521, but not to impede lift.

A plating mask 606, such as anodized aluminum, is then patterned 654 over the seed layer 604, so that only the fingers 521 are plated. The plating mask 606 is comprised of a material that can withstand being flexed after the substrate 592 has been removed and also that is easily removed, without attacking the fingers 521.

A support ring 610, typically comprising stainless steel, is attached 656 to the outside of the wafer substrate 592, such as by an epoxy adhesive 608, to serve as a decal support ring. The attached region of the substrate does not include either the seed layer 604 or the plating mask 606. Stainless steel is a preferred material for the support ring, where the probe springs are to contact a printed wiring board. In some embodiments requiring the pins to contact silicon devices, the support ring is comprised of a material, such as molybdenum, with a relatively low thermal coefficient of expansion that is relatively close to that of silicon.

The assembly is then finger lift etched 658, causing the entire membrane to delaminate from the substrate 592, as the fingers 521a, 521b defined layers 596, 600 lift in opposing directions. The finger lift etching step 658 may require a longer time period in regions located under the support ring 610.

Alternately, the substrate 592 can be made of a material such as aluminum, which can be removed by mechanical or chemical means.

As seen in FIG. 58, one or more plating layers 622a, 622b are preferably formed on 660 the lifted fingers 521a, 521b as needed. In some interposer embodiments 520b, the plating layers 622a, 622b comprise a 1 μm to 10 um nickel layer, as undercoat, and a 0.2 to 5 um contact wear layer, such as rhodium, palladium palladium cobalt, or gold. The plating mask 606 is then removed 662, followed by the removal 664 of the exposed seed layer 604.

In alternate embodiments of the decal interposer assembly 300, such as an ISOCON™ Connector, available through Circuit Components, Inc., of Tempe Ariz., is used as the upper interposer 344. While a ISOCON™ Connector typically requires a higher force to establish electrical contacts, ISOCON™ Connectors often provide a suitable cost-effective interconnection for the upper interposer 344, since the required force can be achieved between the Z-Block and the motherboard PWB 304. Interposers which require relatively low contact forces are typically chosen for connection between the Z-Block 342 and the probe chip 16, 310.

Figure 60:
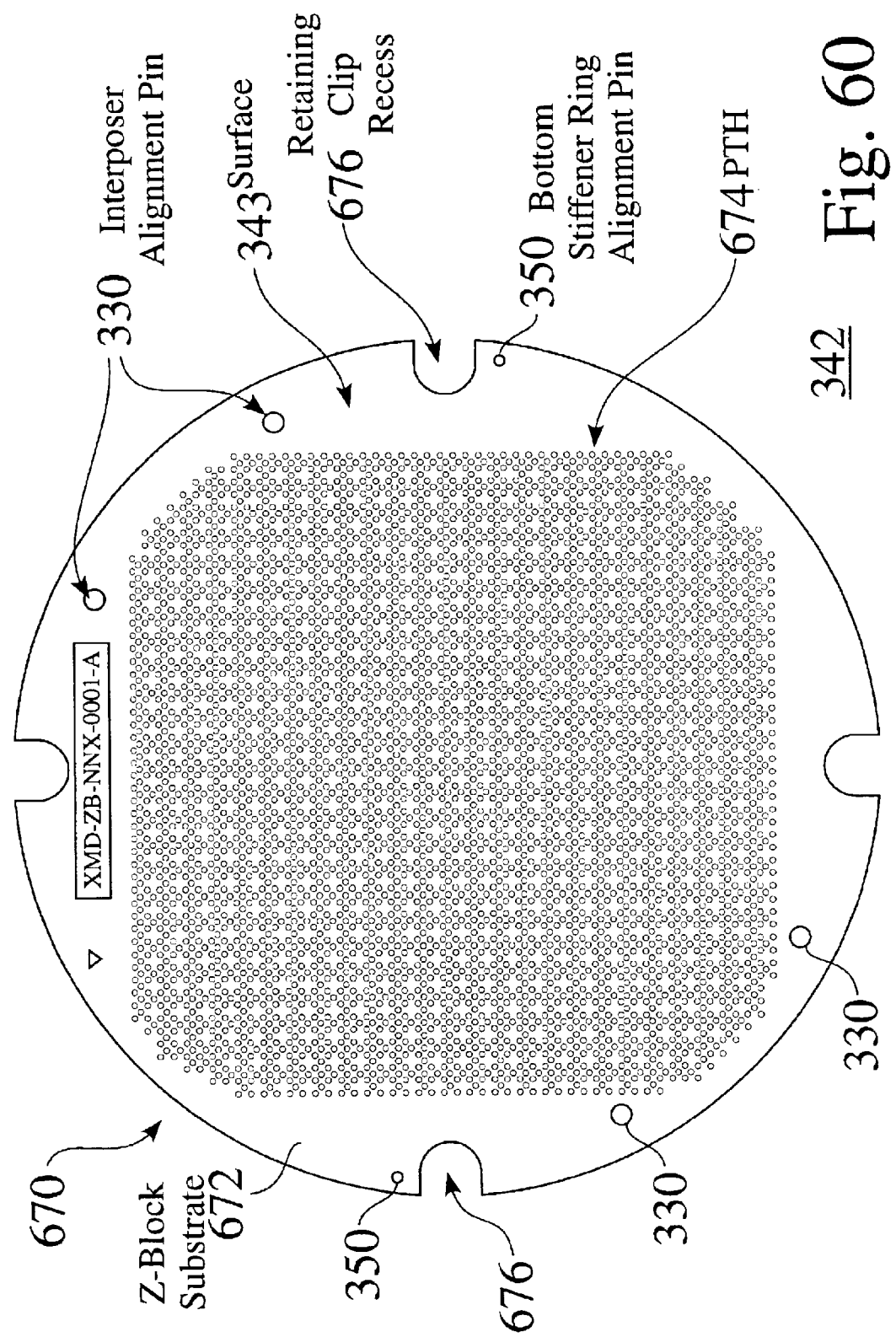
FIG. 60 is a plan layout view of a Z-block printed wiring board.
Figure 61:
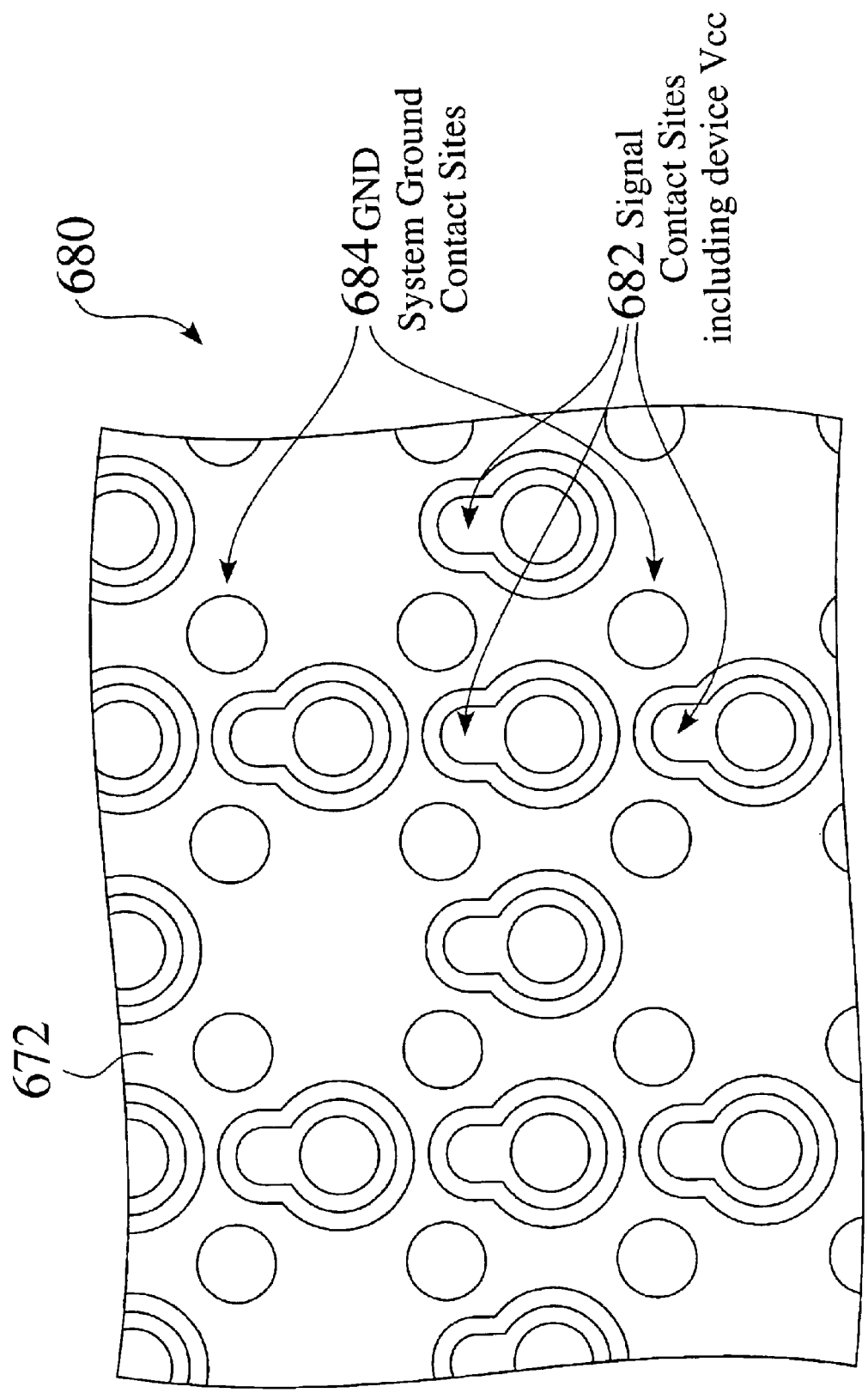
FIG. 61 is a partial detailed view of a Z-block printed wiring board.

Z-Block Architecture. FIG. 60 is a plan layout view 670 of a Z-block printed wiring board 342. FIG. 61 is a partial detailed view 680 of a Z-block printed wiring board 342. The Z-block 342 comprises a plurality of electrical connections, such as an array of plated through holes 674, which extend between opposing surfaces 343a, 343b of the Z-block substrate 672. As seen in FIG. 60, interposer alignment pins 330 and stiffener ring alignment pins 350 are located through the Z-block substrate 672, for alignment within the enhanced probe assemblies 300. The Z-block substrate 672 shown in FIG. 60 also comprises retaining clip recesses 676, by which the Z-block is aligned to the retaining clips 352 (FIG. 43). As seen in FIG. 61, the plurality of electrical connections typically comprise signal contact sites 682, including device Vcc and Vss connections, as well as system ground GND contact sites 684. In the exemplary Z-block 342 shown in FIG. 43, every signal 682 plated through hole 674 is surrounded by four ground 684 plated through holes 674, to improve impedance and crosstalk performance, such as to provide an impedance matching structure for high frequency system environments.

Figure 62:
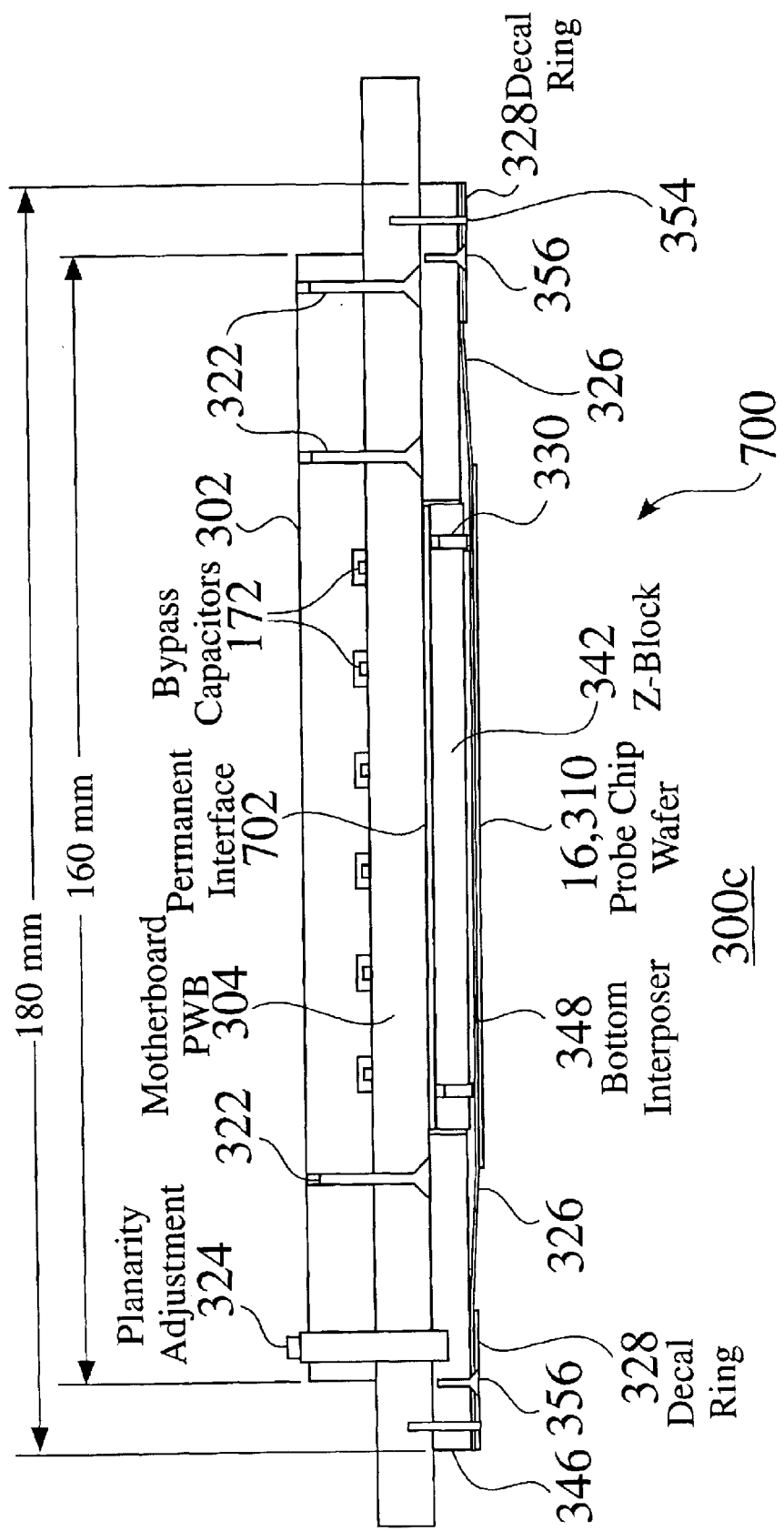
FIG. 62 is a partial cross sectional view of a decal interposer assembly having a permanent interface between a motherboard PWB and a Z-block.

Alternate Enhanced Probe Assemblies. FIG. 62 is a partial cross sectional view 700 of a Z-block decal interposer assembly 300c having permanent interface 702 between the motherboard PWB 304 and the Z-block.

In contrast to the Z-block decal interposer assembly 300b, as seen in FIG. 42 and FIG. 43, in which the upper interface 308 (FIG. 40) comprises an interposer 344, the upper interface 308 in the Z-block decal interposer assembly 300c comprises a permanent interface 702, such as a solder ball array 756, an anisotropic conducting film, or electrically conductive pins to stake the Z-block 342 to the motherboard 304.

In some embodiments of the Z-block decal interposer assembly 300c, planarity adjustment is provided by shims 827 (FIG. 72) located between the motherboard 304 and the bottom stiffener ring 346. The probe force is supported through the upper interface connections 702, located between the Z-Block 342 and the motherboard 304, and not through the bottom stiffener ring 346. The Z-block decal interposer assembly 300c provides both Z-axis translation and planarity compliance, while providing a relatively inexpensive permanent upper interface 702, and eliminating the cost of an upper interposer 344.

Figure 63:
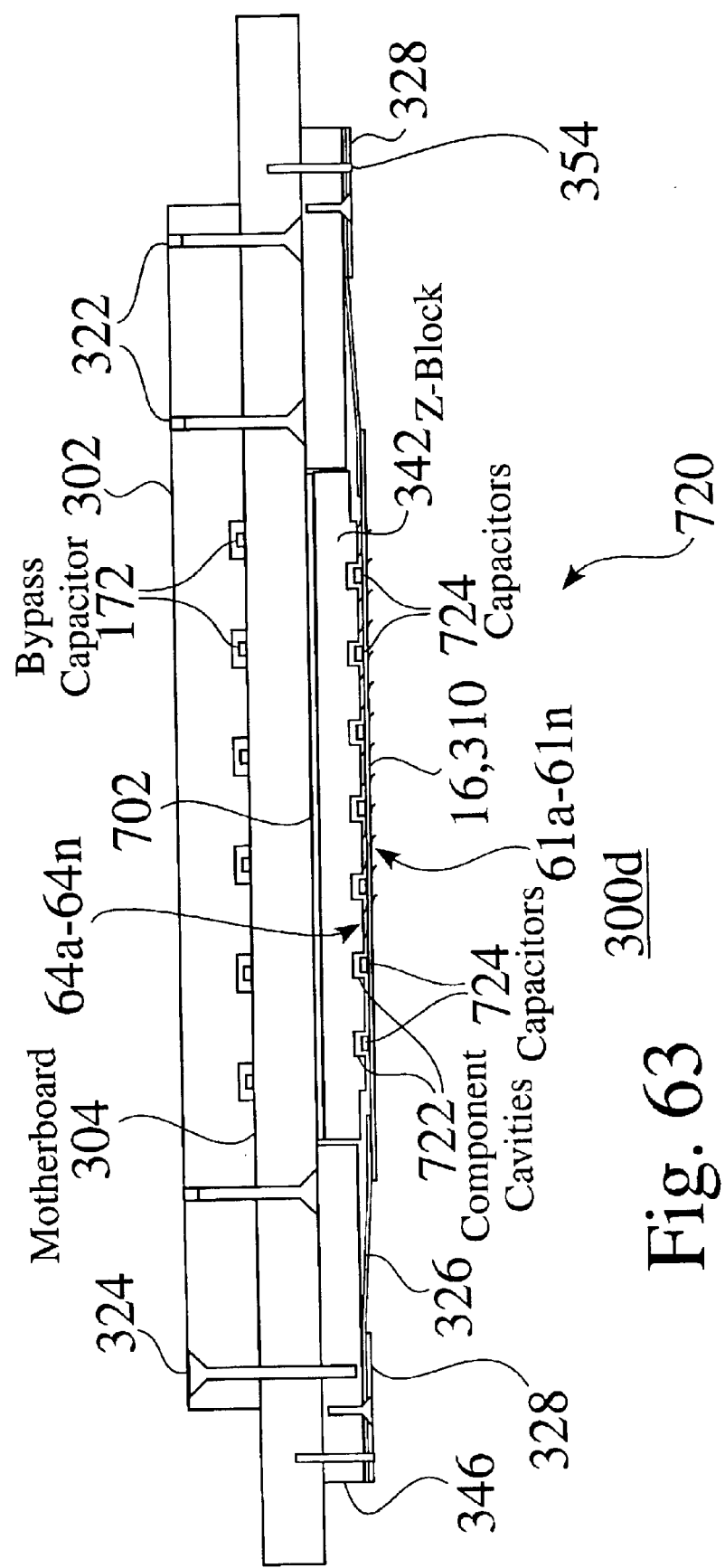
FIG. 63 is a partial cross sectional view of a decal interposer assembly having a permanent interface.

FIG. 63 is a partial cross sectional view of a Z-block decal interposer 300d having a probe chip 16, 310 which comprises tester side springs 64a–64n. In contrast to the Z-block decal interposer assembly 300c, in which the lower interface 312 (FIG. 40) comprises an interposer 348, the lower interface 308 in the Z-block decal interposer assembly 300d comprises spring connections 64a–64n on the upper surface 311b of the probe chip 16,310, which directly contact the Z-block 342.

In some embodiments of the Z-block decal interposer assembly 300d, the spring connections 64a–64n on the upper surface 311b of the probe chip 16, 310 are redundant springs 64a–64n. The Z-block 342 shown in FIG. 63 preferably comprises a cavities 722, typically formed by milling, which provide room for bypass capacitors 724 mounted on the probe chip 16, 310.

In a similar manner to the Z-block decal interposer assembly 300c, the Z-block decal interposer assembly 300d provides planarity adjustment 324, either by shims 827 located between the motherboard 304 and the probe ring 346, or by other planarity adjustment mechanisms, such as differential screw assemblies 824 (FIG. 73). The Z-block decal interposer assembly 300d provides both Z-axis translation and planarity compliance, while eliminating the cost of a lower interposer 348. The Z-block decal interposer assembly 300d also comprises bypass capacitors 724 located within the Z-block cavities 722, which are typically lower in cost than interposer cutout regions 574 (FIG. 55, FIG. 56), which are commonly formed by laser cutting.

FIG. 64 is a partial cross sectional view 740 of a probe card assembly 300e having a pin block 742 with a solder ball array 756 (FIG. 65). FIG. 65 is a detailed schematic view 750 of a pin block having a solder ball array 756. In the probe card assembly 300e, the upper interface 308 (FIG. 40) comprises a pin grid array 745, the lower interface 312 (FIG. 40) comprises a solder ball array 756, and the probe chip 310 comprises one-sided springs 61a–61n located on the lower surface 311a. A ZIF actuation template 743 is located between the metal pin block 742 and the motherboard 304. System planarity is preferably provided, such as by three differential screw assemblies 745.

The pin block 742 comprises a plurality of dielectric holes 746, through which the array 745 of pin connectors 744 extend. Pin templates 748, 752, typically comprised of KAPTON™, are located on opposing surfaces of the pin block 742. Ground contacts 758 within holes 746 provide ground connections between one or more pins 744 and the pin block 742. The pin grid array 745 electrically contacts a pin socket array 755 in the motherboard 304.

FIG. 66 is a partial cross sectional view 760 of a probe card assembly 300f having a pin block 742, in which the probe chip card 16, 310 comprises backside springs 64a–64n. FIG. 67 is a detailed schematic view 770 of a pin block 742, in which the probe chip card 16, 310 comprises backside springs 64a–64n. The pin block 742 comprises a plurality of dielectric holes 746, through which the array 745 of pin connectors 744 extend. The pin grid array 745 extends through the motherboard 304, wherein solder joints 762 provide both mechanical and electrical connections between the motherboard 304 and the pin block 742. The probe chip 16, 310 is flexibly suspended from the assembly by the compliant member or decal 326, while upper springs 64a–64n provide a compliant electrical interface 312 (FIG. 40). The probe chip 16, 310 is therefore moveable with respect to the pin block 742, and provides compliance for the probe card assembly 300f.

As seen in FIG. 67, FIG. 69, and FIG. 71, one or more capacitors 724, such as bypass capacitors 724, may be located on the pin block 742, based upon the intended probing environment.

FIG. 68 is a partial cross sectional view 780 of a probe card assembly 300g having a pin block 742, in which the probe chip card 16, 310 comprises backside springs 64a–64n, and in which the assembly comprises press fit pin connections 782. FIG. 69 is a detailed schematic view 790 of a pin block 742, in which the probe chip card 16, 310 comprises backside springs 64a–64n, and in which the assembly comprises press fit pin connections 782. The pin grid array 745 extends through the motherboard 304, wherein press fit pin connections 782 provide both mechanical and electrical connections between the motherboard 304 and the pin block 742. The probe chip 16, 310 is flexibly suspended from the assembly by the compliant member or decal 326, while upper springs 64a–64n provide a compliant electrical interface 312 (FIG. 40). The probe chip 16, 310 is therefore moveable with respect to the pin block 742, and provides compliance for the probe card assembly 300g.

FIG. 70 is a partial cross sectional view of a probe card assembly 300h having a pin block 742 with SMT solder and top interposer 344. FIG. 71 is a detailed schematic view of a pin block 742 with SMT solder and top interposer.

Figure 72:
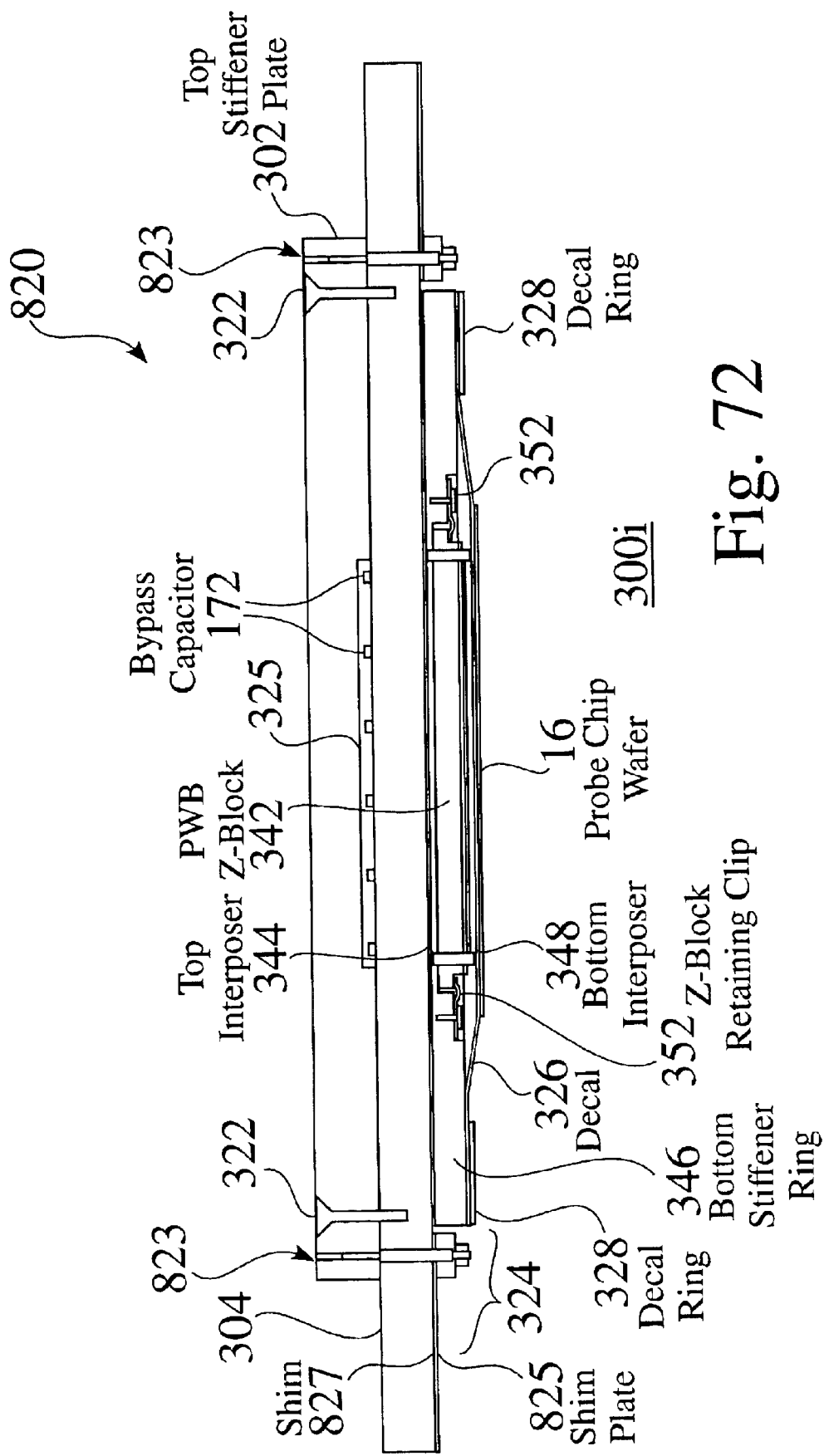
FIG. 72 is a partial cross sectional view of a Z-block decal interposer assembly having a planarity adjustment mechanism.

Planarity Adjustment Mechanisms for Compliant Carrier Probe Card Assemblies. As described above, many embodiments of the decal interposer assemblies 300 comprise planarity adjustment mechanisms 324. FIG. 72 is a partial cross sectional view of a Z-block decal interposer assembly 300i having a planarity adjustment mechanism 324, comprising one or more shims 827 affixed to the lower surface 305a of the motherboard PWB 304 by a shim plate 825 and attachment screws 823. The use of one or more shims 827 at a plurality of locations about the periphery of the motherboard PWB 304 allows the planarity entire interposer assembly 300i to be adjustable relative to the probe ring 284 (FIG. 39).

FIG. 73 is an expanded side assembly view 830 of a Z-block decal interposer assembly 300 having planarity adjustment 324, comprising a plurality of differential screw assemblies 824 and a plurality of shoulder bolt assemblies 832. FIG. 74 is an expanded perspective assembly view 850 of a Z-block decal interposer assembly 300 having planarity adjustment. FIG. 75 is a partial cross sectional view of a Z-block decal interposer assembly 300 having a planarity adjustment 324, comprising a plurality of differential screw assemblies 824. The plurality of differential screw assemblies 824 typically comprises three assemblies 824, such that a plane is readily defined by the leading tips of the assembly, e.g. such as the plungers 826, as seen in FIG. 75. As seen in FIG. 74, the motherboard PWB 304 is fixedly attached to the upper stiffener plate 302 by a plurality of fasteners 322. The differential screw assemblies 824 extend from the bottom stiffener ring 346 to the top stiffener 302, such that adjustment of the differential screw assemblies 824 provides planarity to be adjusted between the lower stiffener ring 346 and the upper portion 871 (FIG. 75) of the assembly 300i.

As seen in FIG. 73, each of the differential screw assemblies 824 comprise a plunger 826, a differential screw 828, and a jam nut 830. As seen in FIG. 75, the leading edge 872 of the plunger 826 is rotationally fixed within a matching slot 827 defined within the motherboard PWB 304. The differential screw 828 is threadably engaged 874 to the plunger 826, and is also threadably engaged 876 to the upper stiffener 302. The threaded interfaces 874, 876 shown in FIG. 75 have different rotational pitches, i.e. thread gages, such that a rotation of differential screw 828 causes axial movement 878 of the plunger 826, thereby adjusting the separation 838 (FIG. 75) between the lower stiffener 346 and the motherboard PWB 304. The pitch differential 877 allows fine adjustment 878 of the plunger, such that the planarity of the probe chip relative to the motherboard PWB 304 can be finely adjusted.

As seen in FIG. 73 and FIG. 75, each of the shoulder bolt assemblies 832 comprise a shoulder bolt screw 834 and a compliant O-ring or spring washer 836. As described above, adjustment of the differential screw assemblies 824 moves the bottom stiffener 346 in relation to the motherboard 304. The planarity, i.e. separation 838, of the bottom stiffener 346 is adjustable in relation to the motherboard 304, since the bottom stiffener 346 is relatively affixed in relation to the leading edge 872 of the plungers 826, while the shoulder bolt screws 834 and compliant O-rings or spring washers 836 keep the stiffener 346 in contact with the plungers 826.

Figure 78:
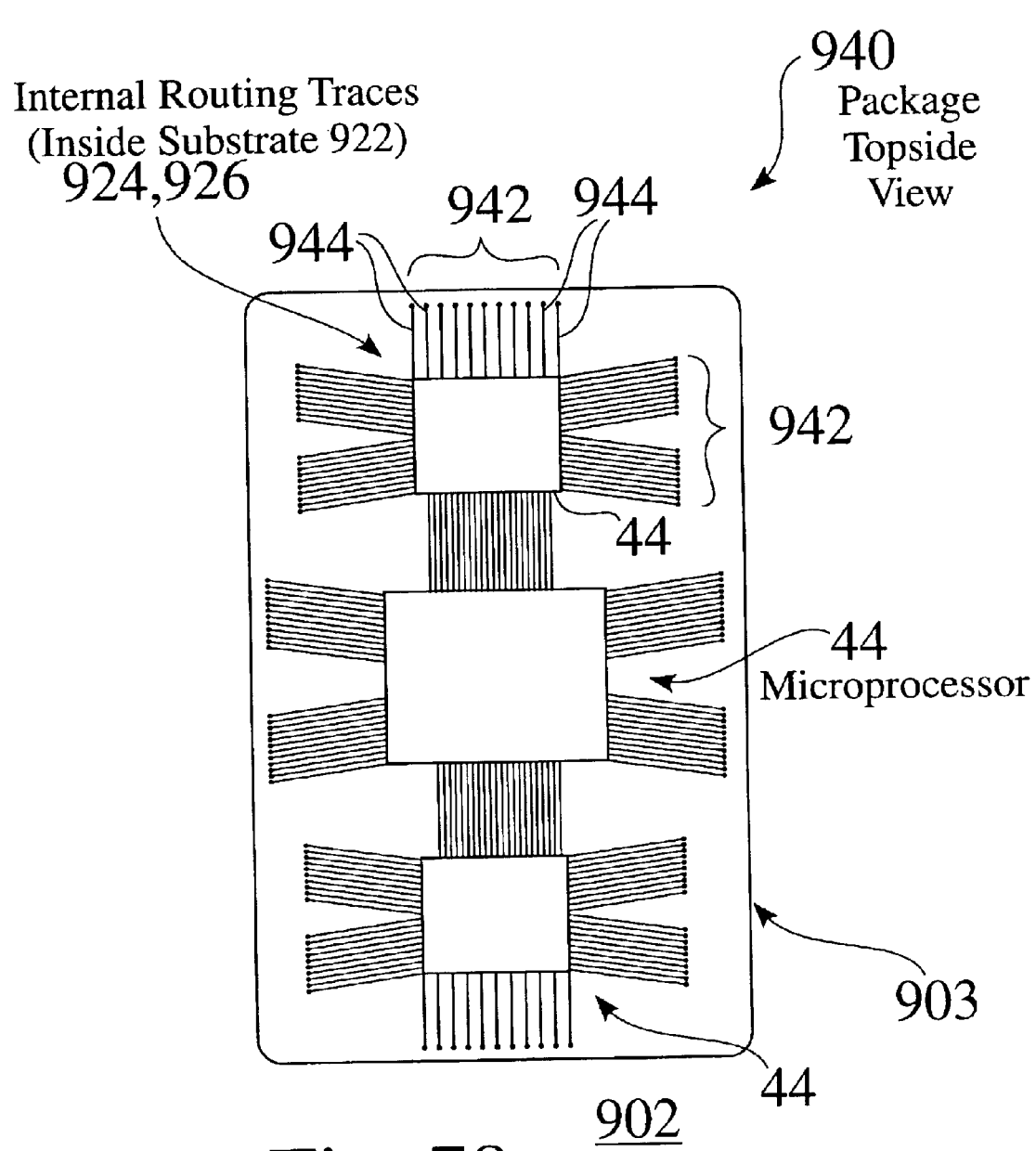
FIG. 78 is a topside view of a high performance spring package for integrated circuits.

High Performance Spring Contact Packages. FIG. 76 is a partial cross sectional view 900 of a high performance spring package 902a for integrated circuits 44. FIG. 77 is a partial cross sectional view 920 of an alternate high performance spring package 902b for integrated circuits 44, further comprising multilayer routings 924. FIG. 78 is a topside view 940 of a high performance spring package 902 for integrated circuits 44.

As seen in FIG. 76, the package substrate 903 comprises a first substrate 904, having a first surface 906a and a second surface 906b, in which probe springs 61 are located on the first surface 906a, and extend to electrical connections 908, e.g. such as plated through holes, which extend from the first surface 906a to the second surface 906b. As seen in FIG. 77, the package substrate 903 may further comprise additional routing layers 922 located on the first surface 906a of the first substrate 904, such that the probe springs 61 are located on the outer surface 923a of the routing layers 922, and are connected to the electrical connections 908 by multilayer routing 924.

The high performance spring package 902 comprises a structure for building a package utilizing springs 61 on a substrate 903, such as for a single IC or MCM package. The probe tips 61 are fabricated on the substrate 903 using thin film or IC or MEMS based processing methods to achieve low manufacturing cost and well-controlled uniformity, as well as to fabricate arrays of highly miniaturized probe springs with ultra-small pitch, e.g. 10–50 micron.

The probe springs 61 are fabricated on either the first surface 906a of the first substrate 904 (FIG. 76), or on the outer surface 923a of the multi-layer routing layers 924, using either thin-film or IC or MEMS based processing methods, as described above. Signals from the probe springs 61 extend from connected integrated circuits 44, preferably using multilayer routings 924. The opposite side 906b of the package 902a, 902b comprises electrical contacts 910, such as either common micro-ball grid solder array pads 918 (FIG. 76), typically at an array pitch such as 1.0 mm or with braised on pins or package pins 928 which are typically solderable to holes 936 on the PCB 912a, 912b. The package 902a, 902b is therefore connectable to the printed circuit board 912a,912b, such as for an end product 934, through the electrical contacts 910.

A single substrate wafer, which may contain multiple high performance spring packages 902 can be built on the first substrate wafer 904, providing cost-effective fabrication. For spring probe substrates 904 having a small surface area, several spring probe contactor packages may typically be fabricated from a single wafer 92 (FIG. 13). For example, as many as twenty-four sites, may be established on a standard four inch round starting wafer.

As seen in FIG. 78, an array 942 of Micro BGA pads 944 located on the substrate assembly 902 are preferably arranged on a standard pitch, e.g. such as a pitch of 0.5 mm, 1 mm, or 1.27 mm. As seen in FIG. 76 and FIG. 77, the high performance spring package 902 may further comprise capacitors 932, typically to aid in high frequency power decoupling. The capacitors 932 are either mounted to either surface 906a, 906b of the substrate 904, or are formed, such as a parallel plate capacitor 932, within the substrate 904, typically between the reference plane and a plane formed on the unused trace areas of the substrate 904. For embodiments in which the first substrate 904 is comprised of silicon, an integral capacitor 932 may preferably be formed within the silicon substrate 904, typically comprising metal-dielectric-metal construction, metal-dielectric-heavily-doped semiconductor, or p-n junction using integrated circuit fabrication techniques. For embodiments in which the first substrate 904 is composed of a non-semiconductive material, metal-dielectric-metal capacitors may preferably be fabricated on or within the substrate 904, using integrated circuit fabrication techniques.

For embodiments in which the substrate 903 is composed of electrically conducting or semiconducting materials, such as doped silicon, the fabrication process is modified similar to the modification of the probe chip, as explained earlier with respect to FIG. 38. As in the probe chip substrate fabrication, such modifications include deposition or formation of an electrically insulative film, e.g. oxide, on the substrate surfaces, as well as on the walls of the vias running through the substrate.

As stated above, the structure of the probe card packages 902 provides very short electrical distances between the probe tips 61 and the controlled impedance environment. This allows the high performance spring packages 902 to be used for high frequency applications. As shown in FIG. 76, the high performance spring package 902 provides access for a shielded high frequency pin 916, by having grounds surrounding the pin 916. As seen in FIG. 77, a ground is provided through a routing trace 938 under the spring 61 in layer 924. As well, the spring probe substrate 903 may preferably be modified for ultra high frequency applications.

For embodiments wherein the traces on one or both surfaces of the substrate 903 are required to be impedance controlled, one of more conductive reference planes may be added within the substrate, either on top of the traces, below the traces, or both above and below the traces. The substrate 903 may also contain alternating ground reference traces, which are connected to the one or two reference planes, effectively providing a shielded coaxial transmission line environment. While the first substrate 904 typically comprises a ceramic material, the layered substrate 922 comprises conductive traces within a dielectric material, such as an organic or inorganic material. For some other embodiments controlled impedance environment in electrically conducting vias or through holes within the substrate 903 can be provided by constructing the via as shown in FIG. 37B and described earlier. Such vias provide a ground plane that is separated from the core electrical conductor by a dielectric film.

Advantages of High Performance Spring Packages. As described above, MEMS or IC processing methods can be used to fabricate the springs 61,412. The high performance spring package 902 has all of the benefits of "chips-first" and/or BBUL packages, while also allowing the replacement of any defective IC 44. The high performance spring package 902 can be tested prior to attaching the ICs 44, which significantly lowers the cost and risk of placing single or multiple ICs 44 in one package 902.

The substrate structure, with through holes 908, preferably comprises a plurality of electrical routing layers built on top of it to provide the functions of the HDI. These functions include: 1) much higher density of I/O connections than attainable in flip-chip or wire bonded packages, 2) higher interconnect performance can be achieved on an IC and 3) thinner packages.

This spring-based package 902 maintains low power and signal inductance by pushing the spring nearly flat to the multi-layer routing traces. The routing, directly under the spring, can be constructed to maintain controlled impedance as described in W0/09623. The distances through the substrate can be kept very short and a ceramic substrate 904 supports RF frequency operations.

The high performance spring package 902 can be used as a "test package", such as to test expensive ICs 44 before committing them to the package 902. Some embodiments of the high performance spring package 902 comprise similar decoupling and impedance control features, as describe above for probe card embodiments. If permanent connection is desired between the probe springs 61 and the electrical contact pads on the IC 44, following the testing and identification of good chips, it can be done using conventional joining techniques used in packaging, such as by reflowing the solder at the contact or by adhesive.

As seen in FIG. 76, the high performance spring package 902 may further comprise means for holding integrated circuit devices in contact with the package, such as vacuum pull-down ports 905 defined through the substrate 903, and/or a temporary lid or pushdown plungers 909.

High performance spring packages 902 are an effective debugging tool for testing individual ICs 44 at RF frequencies, where the load of the package 902 affects the final packaged IC performance. The use of high performance spring packages 902 therefore helps to reduce the time-to-market characterization for new high-performance devices used in MCM packages, since integrated circuit devices 44 are not required to be committed to the final package 902 until the testing under load is verified. The test package also provides means to mix one or more RF signals with hundreds or thousands of digital signals. At high testing and/or manufacturing volumes, high performance spring packaging 902 significantly lowers package cost, as compared to a BBUL approach comprising similar frequency capabilities.

Figure 83:
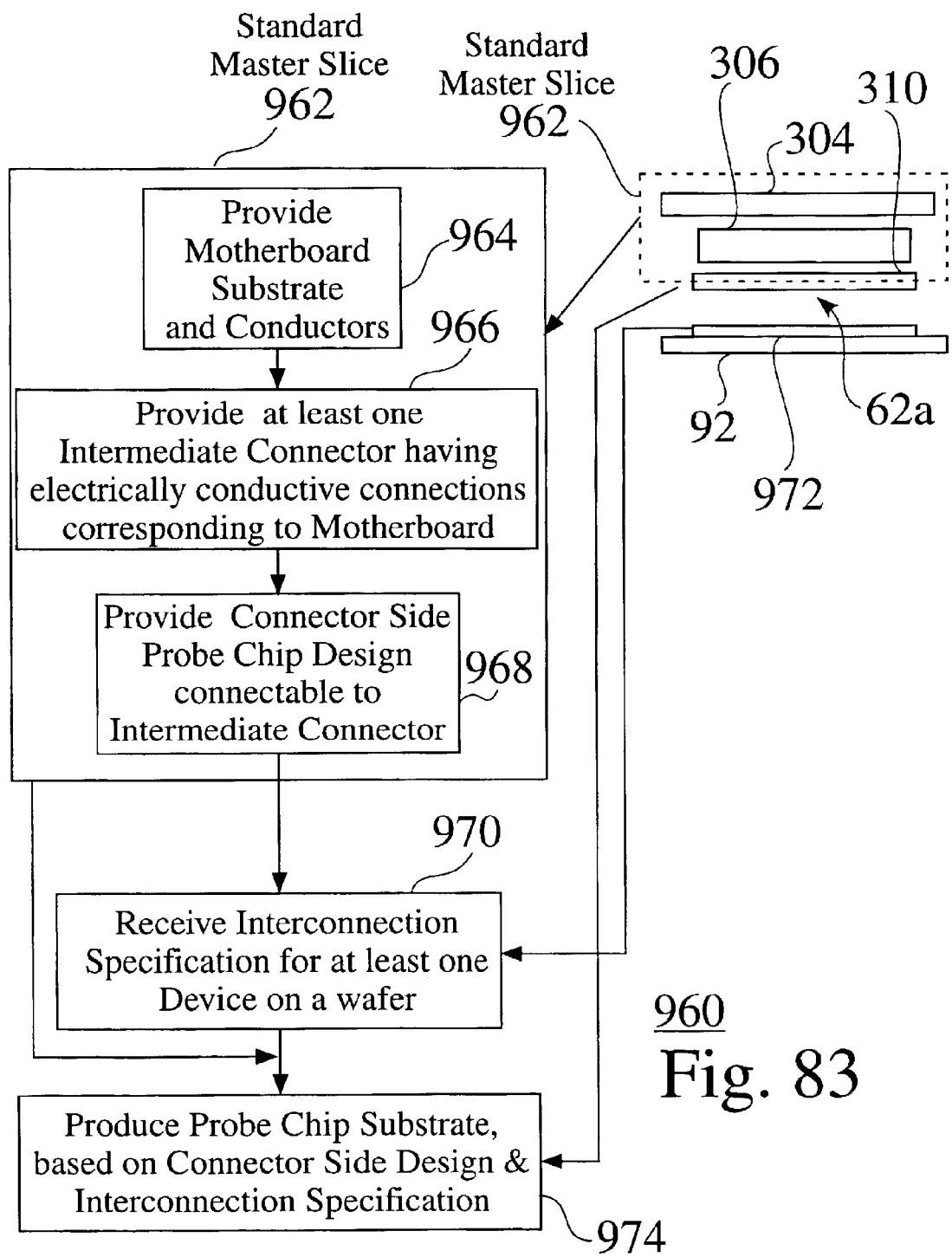
FIG. 83 is a flowchart for a quick-turn probe assembly fabrication process.

Quick-Turn Probe Assemblies. FIG. 83 is a flowchart for a quick-turn probe assembly fabrication process 960. As describe above, many embodiments of probe card assemblies 60, enhanced probe card assemblies 300, and high performance spring packages 902 typically substantially comprise standardized componentry, which is readily reusable for connection to one or more devices 44 on a wafer 92.

The probe assembly 60,300 shown in FIG. 83 comprises a master slice structure 962 comprising standardized portions, such as a motherboard substrate 304 (FIG. 40), at least one intermediate connector 306, and standardized portions of a probe chip 310, which typically includes the probe chip substrate and connector surface electrical connections, and may also typically include standardized electrical connections which extend from the connector surface 62b to the probe surface 62a of the probe chip substrate 310. It is to be understood that that the intermediate connector may include one or more components, such as an interposer and/or Z-block.

As seen in FIG. 83, the quick-turn process 960, i.e. the method for developing a probe assembly for connection to at least one device on a wafer, typically comprises the establishment of the master slice 962, which comprises the steps of:

providing a motherboard substrate 304, at step 964, having a bottom surface and a top surface, and a plurality of electrical conductors extending from the top surface to the bottom surface;

providing at least one intermediate connector 306, and step 966, having an upper interface and a lower interface, the upper surface locatable proximate to the bottom surface of the motherboard substrate 304, the intermediate connector 306 comprising at least one electrically conductive connection between the upper interface and the lower interface corresponding to each of the electrical conductors on the bottom surface of the motherboard substrate 304; and providing a probe chip substrate design, at step 968, comprising a connector surface 62b, a probe surface 62a opposite the connector surface 62b, and a plurality of contacts on the connector surface arranged in a fixed layout, the connector surface 62b locatable proximate to the lower surface of the intermediate connector 306.

The quick turn process 960 shown in FIG. 83 then includes the receiving of an interconnection specification 972 for the at least one device 44 on the wafer 92, in which the interconnection specification 972 comprises interconnection locations for the device 44.

The probe chip substrate 310 is then produced, at step 974, based on both the standardized information 968 and the received, i.e. customized, information 970, wherein the probe chip substrate comprises a plurality of spring probe contact tips 412, such as seen in FIG. 40 on the probe surface 62a, corresponding to the interconnection locations 972 on the wafer 92, and wherein each of the spring probe contact tips is electrically connected to at least one contact on the connector surface 62a.

System Advantages. As described above, the probe card assemblies 60, enhanced probe card assemblies 300, interposer structures 520, 520b, and high performance packages 902 provide several advantages over conventional probe and package technologies.

For example, many embodiments of the probe card assemblies 60, enhanced probe card assemblies 300, interposer structures 520,520b, and high performance packages 902 comprise photolithography-patterned springs 61, 412, 521, and are typically formed by stress metal film batch processing, which is inherently lower in cost then either mechanical or MEMS based processing. The springs are formed through the use of two dimensional processing methods, through which three dimensional structures are formed. In contrast, other conventional spring processes require additional processing steps to create three dimensional springs. In alternate processing embodiments, the springs are formed through the use of two dimensional plating processing methods to form a differential stress gradient between plating layers, through which three dimensional structures are formed.

The assembly techniques described in this document use components or substrates comprising stress metal probe elements, i.e. springs, which are all batch-fabricated on each of the substrates by IC processing techniques including photolithography. As a result the process allows fabrication of probe card assemblies and packages using arrays of very short, e.g. 100–200 micron long and 10–20 micron wide, probe elements with ultra-small pitch, e.g. 10–50 micron, that is not manufacturable by any currently used technology. It should also be understood that the application of the assembly and packaging techniques disclosed in this document are also applicable to substrates or components comprising arrays of probe elements with larger dimensions and greater pitch that can be fabricated using the technology presented in this document or by any other method available today.

Furthermore, the probe architecture typically comprises a substrate having through holes for direct connection to the other side, in which photolithographic methods define both the placement of the springs and the route connections from the holes to the springs, which enables the use of simpler starting material and shorter processing times.

As well, the disclosed probe and package architectures 60, 300, 902 preferably comprise reusable components, i.e. standards, through the use of standardized master slices 962, such that the majority of a probe card 60, 300 and/or or package assembly 902 can be implemented for a variety of connected devices 44 and wafers 92. The master slice 962 is readily matched to a particular interconnection specification 972, thereby reducing the "cost of ownership" needs for a particular customer.

As described above, the probe card assemblies 60, enhanced probe card assemblies 300, interposer structures 520, 520b, and high performance packages 902 comprise one or more substrates, which can be built using a variety of starting materials, such as ceramic, glass or quartz, silicon, organic board, and/or multilayer ceramic, depending on the requirements. The assembly substrate may further comprise multi-layer metal layers, such as to improve routing and performance.

Furthermore, the probe card assemblies 60, enhanced probe card assemblies 300, interposer structures 520, 520b, and high performance packages 902 may further comprise stand offs on any of the substrates, such as to protect the probes 61, 412, protect the devices 44 and/or wafer 92, or to control the amount of pad scrub in a clamped wafer level cartridge or cassette application. The stand offs can also be applied to connector side 62b of the Probe chip 16, 310, such as to protect springs that interface from an interposer 520, 520b.

Although the disclosed probe card assembly systems and improved non-planar spring probes and methods for production are described herein in connection with integrated circuit test probes, probe cards, and/or packages, the system and techniques can be implemented with other devices, such as interconnections between integrated circuits and substrates within electronic components or devices, burn-in devices and MEMS devices, or any combination thereof, as desired.

In addition, it is within the scope of this invention that assembly structures and methods disclosed in this document can be used to test, burn-in or package various miniaturized integrated solid state circuits, including both silicon and III-V semiconductor devices, as well as liquid crystal display panels, solid state sensor arrays, such as biosensors, environmental sensors and surface acoustic wave device sensors.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A test apparatus for an integrated circuit wafer, comprising:

a motherboard substrate having a bottom surface and a top surface, and a plurality of electrical conductors extending from the bottom surface to the top surface;

a probe chip substrate comprising a probe surface and a connector surface, a plurality of probe springs on the probe surface; a plurality of electrical contacts on the connector surface, and a plurality of probe chip electrical connections, wherein each of the probe springs is electrically connected to at least one contact through at least one probe chip electrical connection;

at least one intermediate connector located between the motherboard substrate and the probe chip substrate, the intermediate connector comprising at least one electrically conductive connection between each of the plurality of electrical contacts on the probe chip substrate and each of the electrical conductors on the bottom surface of the motherboard substrate; and a probe chip carrier attached in relation to the motherboard substrate, the probe chip carrier comprising a compliant member where in the compliant member is attached to the connector surface of the probe chip substrate;

wherein the probe chip substrate is supported by the compliant member relative to the motherboard.

2. The test apparatus of claim 1, wherein the plurality of probe springs comprise a fixed portion attached to the probe chip substrate and a free portion, initially attached to the probe chip substrate, which upon release, extend away from the probe chip substrate as a result of an inherent stress gradient.

3. The test apparatus of claim 2, wherein the plurality of probe springs each comprise a plurality of layers, and wherein the free portions of probe springs extend away upon release from the probe chip substrate as a result of the inherent stress gradient defined between the plurality of layers.

4. The test apparatus of claim 2, wherein the plurality of probe springs are sputter formed.

5. The test apparatus of claim 2, wherein the plurality of probe springs are plateably formed.

6. The test apparatus of claim 2, wherein said plurality of probe springs are photolithographically patterned springs, in which the free portions define a three-dimensional structure.

7. The test apparatus of claim 1, wherein at least one of the electrical connections comprises a plurality of electrically conductive vias.

8. The test apparatus of claim 1, wherein the compliant member is attached to the connector surface of the probe chip substrate.

9. The test apparatus of claim 1, further comprising:
a stiffener plate fixedly attached to the top surface of the motherboard substrate.

10. The test apparatus of claim 9, wherein the stiffener plate comprises a rigid material.

11. The test apparatus of claim 9, wherein the stiffener plate comprises stainless steel.

12. The test apparatus of claim 9, wherein at least one component recess is defined in the stiffener plate proximate the top surface of the motherboard substrate, and wherein the apparatus further comprises:
at least one component extending from the motherboard substrate within the component recess.

13. The test apparatus of claim 12, wherein the component is a capacitor.

14. The test apparatus of claim 1, wherein the probe chip substrate comprises an inner region and an outer peripheral region, and wherein the compliant member is attached to the peripheral region of the probe chip substrate.

15. The test apparatus of claim 1, wherein the probe chip substrate comprises an inner region and an outer peripheral region, and wherein the compliant member is adhesively attached to the peripheral region of the probe chip substrate.

16. The test apparatus of claim 1, wherein the compliant member is a film.

17. The test apparatus of claim 16, wherein the film comprises polyimide.

18. The test apparatus of claim 16, wherein the probe chip comprises an outer periphery, and wherein the film is attached about the outer periphery.

19. The test apparatus of claim 1, wherein the compliant member is a screen.

20. The test apparatus of claim 1, wherein the compliant member is a mesh.

21. The test apparatus of claim 1, wherein the compliant member comprises KAPTON™.

22. The test apparatus of claim 1, wherein the intermediate connector comprises an interposer having a first plurality of compliant electrical contacts on a first surface and a second plurality of compliant electrical contacts on a second surface opposite the first surface.

23. The test apparatus of claim 1, further comprising: a permanent electrical interface between the intermediate connector and the motherboard substrate.

24. The test apparatus of claim 23, wherein the permanent interface comprises a solder ball array.

25. The test apparatus of claim 23, wherein the permanent interface comprises an anisotropic conductive film.

26. The test apparatus of claim 23, wherein the permanent interface comprises a plurality of electrically conductive pins.

27. The test apparatus of claim 1, further comprising:
at least one standoff fixedly attached to the probe surface of the probe chip substrate.

28. The test apparatus of claim 1, further comprising:
at least one standoff fixedly attached to the connector surface of the probe chip substrate.

29. The test apparatus of claim 1, further comprising:
at least one passive component incorporated as an assembled component on the probe chip substrate.

30. The test apparatus of claim 29, wherein the passive component is mounted on the connector surface of the probe chip substrate.

31. The test apparatus of claim 29, wherein the passive component is a capacitor.

32. The test apparatus of claim 29, wherein the capacitor is a decoupling capacitor.

33. The test apparatus of claim 29, wherein the passive component is a resistor.

34. The test apparatus of claim 29, wherein the passive component is an inductor.

35. The test apparatus of claim 1, further comprising:
at least one capacitor fabricated on the probe chip substrate.

36. The apparatus of claim 1, wherein at least one of the substrates is comprised of silicon, and further comprising:
at least one capacitor fabricated within at least one of the substrates.

37. The test apparatus of claim 1, further comprising:
a planarity adjustment mechanism in which the planarity of the probe chip is adjustable relative to the motherboard substrate.

38. The test apparatus of claim 1, wherein the intermediate connector comprises a printed wiring board, and wherein the plurality of electrically conductive connections comprise vias having means for electrical connection to the probe chip and means for electrical connection to the motherboard.

39. The test apparatus of claim 38, wherein the means for electrical connection to the motherboard comprises an interposer.

40. The test apparatus of claim 38, wherein the means for electrical connection to the probe chip comprises an interposer.

41. The test apparatus of claim 1, wherein the intermediate connector comprises a Z-block, comprising a vertical translation substrate having a lower surface and an upper surface, and a plurality of electrically conductive connections which extend from the lower surface to the upper surface thereof, each of the electrically conductive connections comprising at least one electrically conductive via.

42. The test apparatus of claim 41, further comprising an interposer between the Z-block and the motherboard substrate.

43. The test apparatus of claim 41, further comprising an interposer between the Z-block and the probe chip substrate.

44. The test apparatus of claim 1, wherein the probe chip substrate comprises a plurality of holes defined therethrough between the probe surface and the connector surface, and wherein each of the plurality of probe chip electrical connections are electrically conductive vias located within each of the plurality, of holes in the probe chip substrate.

45. The test apparatus of claim 1, wherein the probe chip substrate comprises an electrically insulative material.

46. The test apparatus of claim 1, wherein the probe chip substrate comprises a dielectric material.

47. The test apparatus of claim 1, wherein the probe chip substrate comprises an electrically conductive material.

48. The test apparatus of claim 1, further comprising: at least one bypass capacitor electrically connected to at least one of the plurality of electrical connections on the probe chip substrate.

49. The test apparatus of claim 1, wherein the intermediate connector comprises an electrically conductive pin block having a plurality of holes defined between a lower surface and an upper surface thereof, and wherein the plurality of electrically conductive connections comprise pins extending through the plurality of holes, the pins comprising means for connection to the probe chip and means for connection to the motherboard.

50. The test apparatus of claim 49, further comprising:
dielectric within the plurality of holes.

51. The test apparatus of claim 49, further comprising:
an electrically conductive ground contact between at least one of the pins and the pin block.

52. The test apparatus of claim 49, further comprising:
a zero activation force (ZIF) actuation template located between the metal pin block and the motherboard.

53. The test apparatus of claim 49, further comprising:
a lower pin template located on the lower surface of the pin block, in which the pins extend through the lower pin template.

54. The test apparatus of claim 53, wherein the lower pin template comprises KAPTON™.

55. The test apparatus of claim 49, further comprising:
an upper pin template located on the upper surface of the pin block, in which the pins extend through the upper pin template.

56. The test apparatus of claim 55, wherein the upper pin template comprises KAPTON™.

57. The test apparatus of claim 49, wherein the means for electrical connection to the probe chip comprises a solder bell array.

58. The test apparatus of claim 49, wherein the means for electrical connection to the probe chip comprises solder joints.

59. The teat apparatus of claim 49, wherein the means for electrical connection to the motherboard comprises a pin grid array.

60. The test apparatus of claim 49, wherein the means for electrical connection to the probe chip comprises a plurality of springs.

61. The test apparatus of claim 49, wherein the means for electrical connection to the motherboard comprises a pin socket array in the motherboard.

62. The test apparatus of claim 49, wherein the means for electrical connection to the motherboard comprises solder joints.

63. The test apparatus of claim 49, wherein the means for electrical connection to the motherboard comprises press fit pin connections.

64. The test apparatus of claim 1, wherein the motherboard substrate further comprises at least one electrically conducting path with matched impedance.

65. The test apparatus of claim 1, wherein the intermediate connector further comprises at least one electrically conducting path with matched impedance.

66. The test apparatus of claim 1, wherein the probe chip substrate further comprises at least one electrically conducting path with matched impedance.

67. The test apparatus of claim 1, further comprising:
at least one electrically conducting path with matched impedance extending from the top surface of the motherboard substrate to the probe surface of the probe chip substrate.

* * * * *